United States Patent
Williams

(10) Patent No.: US 6,652,357 B1
(45) Date of Patent: Nov. 25, 2003

(54) METHODS FOR CONTROLLING RETAINING RING AND WAFER HEAD TILT FOR CHEMICAL MECHANICAL POLISHING

(75) Inventor: Damon Vincent Williams, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 329 days.

(21) Appl. No.: 09/668,667

(22) Filed: Sep. 22, 2000

(51) Int. Cl.[7] .................. B24B 49/00; B24B 51/00; B24B 1/00

(52) U.S. Cl. .................. 451/8; 451/41; 451/59; 451/63; 451/398

(58) Field of Search .................. 451/8, 9, 10, 41, 451/59, 63, 285, 286, 287, 288, 289, 290, 397, 398

(56) References Cited

U.S. PATENT DOCUMENTS

| | | |
|---|---|---|
| 3,254,454 A | 6/1966 | Cetrangolo |
| 3,564,776 A | 2/1971 | Aspden |
| 3,589,078 A | 6/1971 | Bala et al. |
| 3,874,123 A | 4/1975 | Hopkins et al. |
| 3,979,239 A | 9/1976 | Walsh |
| 4,128,968 A | 12/1978 | Jones |
| 4,144,099 A | 3/1979 | Edmonds et al. |
| 4,197,676 A | 4/1980 | Sauerland |
| 4,232,485 A | 11/1980 | Eadon-Allen |
| 4,244,775 A | 1/1981 | D'Asaro |
| 4,358,338 A | 11/1982 | Downey et al. |
| 4,403,453 A | 9/1983 | Cave et al. |
| 4,419,848 A | 12/1983 | Dischert |
| 4,462,860 A | 7/1984 | Szmanda |
| 4,600,469 A | 7/1986 | Fusco et al. |
| 4,671,851 A | 6/1987 | Beyer et al. |
| 4,693,036 A | 9/1987 | Mori |
| 4,789,648 A | 12/1988 | Chow et al. |
| 4,793,895 A | 12/1988 | Kaanta et al. |

(List continued on next page.)

FOREIGN PATENT DOCUMENTS

| | | | |
|---|---|---|---|
| EP | 0 150 074 A2 | 7/1985 | ........... B24B/27/00 |
| EP | 0 150 074 B1 | 7/1985 | ........... B34B/27/00 |
| EP | 0 180 175 A2 | 7/1986 | ............. B24B/7/16 |

(List continued on next page.)

Primary Examiner—Timothy V. Eley
(74) Attorney, Agent, or Firm—Martine & Penilla, LLP

(57) ABSTRACT

A CMP system and methods make repeatable measurements of eccentric forces applied to carriers for wafer or polishing pad conditioning pucks. Force applied to the carrier may be accurately measured even though such force is eccentrically applied to such carrier. The CMP system and method provide the repeatable measurement features while supplying fluids within the carrier to the wafer and to a wafer support without interfering with the polishing operations. Similarly, the CMP system and methods remove fluids from the wafer or puck carrier without interfering with the CMP operations. An initial coaxial relationship between an axis of rotation and a carrier axis is maintained during application of the eccentric force, such that a sensor is enabled to make repeatable measurements, as defined above, of the eccentric forces, and the carrier may be a wafer or a puck carrier. Such initial coaxial relationship is maintained by a linear bearing assembly mounted between the carrier and the sensor, and the carrier may be a wafer or a puck carrier. The linear bearing assembly is provided as an array of separate linear bearing assemblies, wherein each separate linear bearing assembly is dimensioned independently of the diameter, for example, of a wafer or puck carried by the carrier. The linear bearing assembly may be assembled with a retainer ring in conjunction with a motor for moving the ring relative to the wafer mounted on the carrier so that an exposed surface of the wafer and a surface of the retainer ring to be engaged by the polishing pad are coplanar during the polishing operation.

12 Claims, 45 Drawing Sheets

U.S. PATENT DOCUMENTS

| | | | |
|---|---|---|---|
| 4,879,258 A | | 11/1989 | Fisher |
| 4,956,944 A | | 9/1990 | Ando et al. |
| 5,104,421 A | | 4/1992 | Takizawa et al. |
| 5,287,663 A | | 2/1994 | Pierce et al. |
| 5,508,077 A | | 4/1996 | Chen et al. |
| 5,527,423 A | | 6/1996 | Neville et al. |
| 5,542,874 A | | 8/1996 | Chikaki |
| 5,547,417 A | | 8/1996 | Breivogel et al. |
| 5,599,423 A | | 2/1997 | Parker et al. |
| 5,665,201 A | | 9/1997 | Sahota |
| 5,672,095 A | | 9/1997 | Morimoto et al. |
| 5,738,568 A | * | 4/1998 | Jurjevic et al. ............... 451/41 |
| 5,803,799 A | | 9/1998 | Volodarsky et al. ......... 451/288 |
| 5,816,895 A | * | 10/1998 | Honda ......................... 451/41 |
| 5,888,120 A | | 3/1999 | Doran |
| 5,899,798 A | * | 5/1999 | Trojan et al. ............... 451/259 |
| 5,916,015 A | | 6/1999 | Natalicio .................... 451/288 |
| 5,919,082 A | | 7/1999 | Walker et al. |
| 5,957,763 A | | 9/1999 | Anderson, III et al. |
| 5,958,148 A | | 9/1999 | Holzapfel et al. |
| 5,961,369 A | | 10/1999 | Bartels et al. |
| 5,969,521 A | | 10/1999 | Kurita et al. |
| 5,972,162 A | | 10/1999 | Cesna |
| 5,974,681 A | | 11/1999 | Gonzalez-Martin et al. |
| 5,975,094 A | | 11/1999 | Shurtliff |
| 5,975,986 A | | 11/1999 | Allen et al. |
| 5,975,991 A | | 11/1999 | Karlsrud |
| 5,980,366 A | | 11/1999 | Waddle et al. |
| 5,980,769 A | | 11/1999 | Yanagisawa et al. |
| 5,985,094 A | | 11/1999 | Mosca |
| 5,989,104 A | | 11/1999 | Kim et al. .................... 451/41 |
| 5,993,289 A | | 11/1999 | Allen et al. ..................... 451/5 |
| 5,993,302 A | | 11/1999 | Chen et al. ................. 451/285 |
| 5,997,390 A | | 12/1999 | Hosé ......................... 451/262 |
| 6,001,005 A | | 12/1999 | Anderson, III et al. ..... 451/268 |
| 6,012,964 A | | 1/2000 | Arai et al. ...................... 451/5 |
| 6,019,868 A | * | 2/2000 | Kimura et al. .......... 156/345.14 |
| 6,022,807 A | | 2/2000 | Lindsey, Jr. et al. ........ 438/693 |
| 6,030,280 A | | 2/2000 | Fruitman .................... 451/291 |
| 6,030,488 A | | 2/2000 | Izumi et al. ................. 156/345 |
| 6,033,290 A | | 3/2000 | Gurusamy et al. |
| 6,033,521 A | | 3/2000 | Allen et al. ................. 156/345 |
| 6,038,082 A | | 3/2000 | Takatsuki ................... 359/688 |
| 6,039,638 A | | 3/2000 | Nagayama et al. ......... 451/288 |
| 6,040,244 A | | 3/2000 | Arai et al. ................... 438/691 |
| 6,041,465 A | | 3/2000 | Yashiki et al. ............... 15/88.3 |
| 6,045,431 A | | 4/2000 | Cheprasov et al. ............. 451/5 |
| 6,048,259 A | | 4/2000 | Asai ........................... 451/339 |
| 6,056,632 A | | 5/2000 | Mitchel et al. ............. 451/288 |
| 6,058,950 A | | 5/2000 | Fujii et al. .................. 134/182 |
| 6,062,949 A | | 5/2000 | Yashiki et al. ................ 451/10 |
| 6,062,954 A | | 5/2000 | Izumi .......................... 451/72 |
| 6,066,230 A | | 5/2000 | Arai ........................... 156/345 |
| 6,068,545 A | | 5/2000 | Arai ........................... 451/288 |
| 6,074,275 A | | 6/2000 | Yashiki et al. ................. 451/5 |
| 6,074,277 A | | 6/2000 | Arai ............................... 451/8 |
| 6,089,961 A | | 7/2000 | Cesna et al. ................ 451/285 |
| 6,093,087 A | | 7/2000 | Hakomori et al. ............ 451/57 |
| 6,093,091 A | | 7/2000 | Keller |
| 6,095,900 A | | 8/2000 | Fruitman et al. .............. 451/28 |
| 6,102,779 A | | 8/2000 | Cesna et al. .................. 451/41 |
| 6,102,784 A | | 8/2000 | Lichner ...................... 451/262 |
| 6,106,379 A | | 8/2000 | Mosca ........................ 451/288 |
| 6,106,662 A | | 8/2000 | Bibby, Jr. et al. ........... 156/345 |
| 6,110,026 A | | 8/2000 | Arai ............................ 451/289 |
| 6,113,465 A | | 9/2000 | Kim et al. .................... 451/41 |
| 6,113,468 A | | 9/2000 | Natalicio ..................... 451/41 |
| 6,113,478 A | | 9/2000 | Anderson, III et al. ..... 451/262 |
| 6,206,768 B1 | * | 3/2001 | Quek .......................... 451/287 |
| 6,354,907 B1 | * | 3/2002 | Satoh et al. ..................... 451/5 |

FOREIGN PATENT DOCUMENTS

| | | | |
|---|---|---|---|
| EP | 0223920 B1 | 7/1986 | ......... H01L/21/306 |
| EP | 0223920 A2 | 7/1986 | ......... H01L/21/306 |
| EP | 0 272 531 A1 | 6/1988 | ............ B24B/7/16 |
| EP | 0 272 531 B1 | 6/1988 | ............ B24B/7/16 |
| GB | 2324 750 A | 4/1998 | .......... B24B/37/04 |
| JP | 53-68493 | 6/1978 | .......... B24B/37/00 |
| JP | 56-140632 | 11/1981 | ......... H01L/21/322 |
| JP | WO 82/03038 | 9/1982 | .......... B24B/37/04 |
| JP | 57-170538 | 10/1982 | ......... H01L/21/304 |
| JP | 7-45565 | 2/1995 | ......... H01L/21/304 |
| JP | 7-111256 | 4/1995 | ......... H01L/21/304 |
| JP | 7-266220 | 10/1995 | ......... H01L/21/304 |
| JP | H11-156711 | 6/1999 | ......... H01L/21/304 |
| JP | 2000 015557 A | 1/2000 | |
| WO | WO 97/40525 | 10/1997 | ........... H01L/21/00 |

* cited by examiner

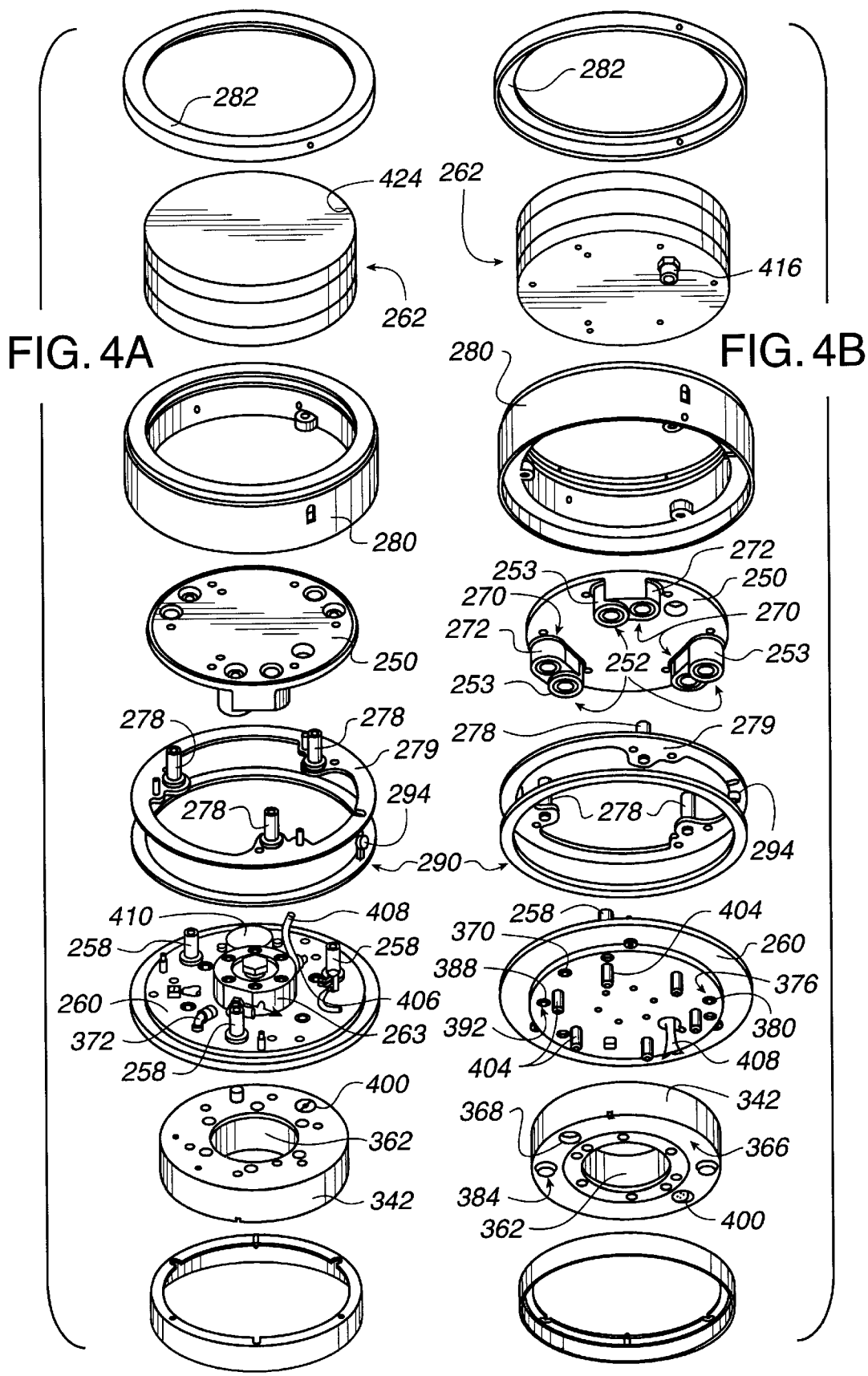

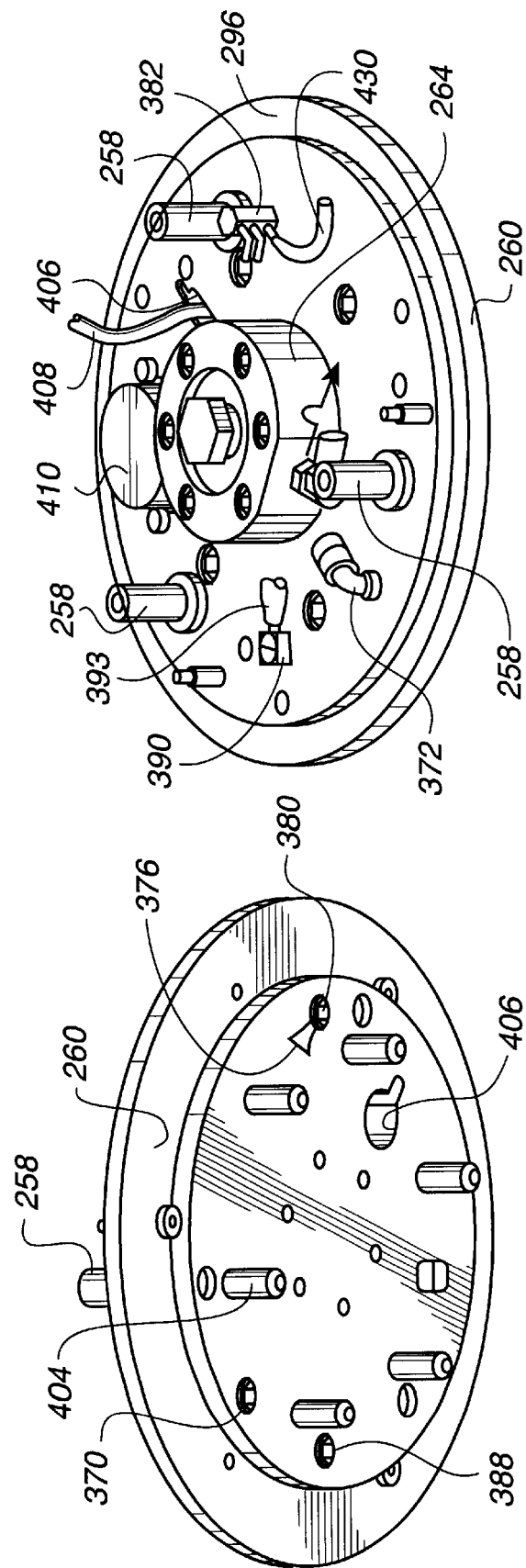

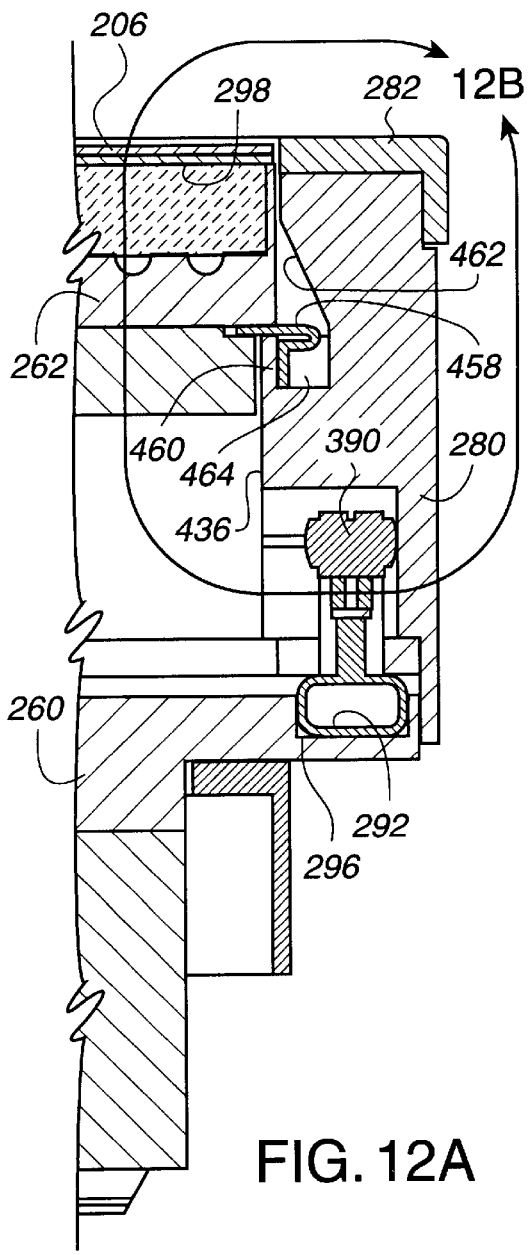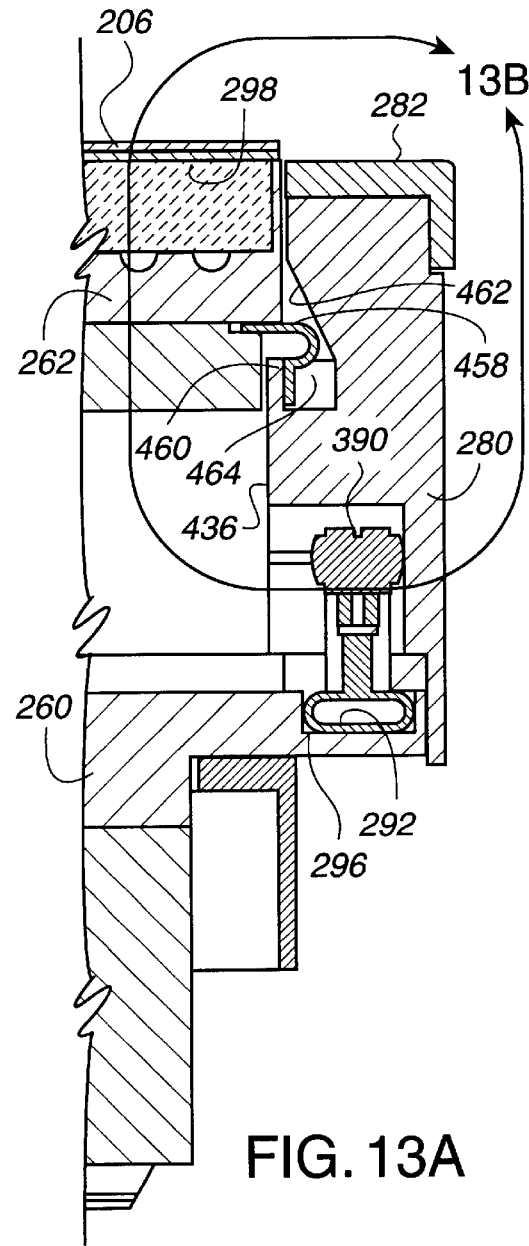
FIG. 12A
FIG. 13A

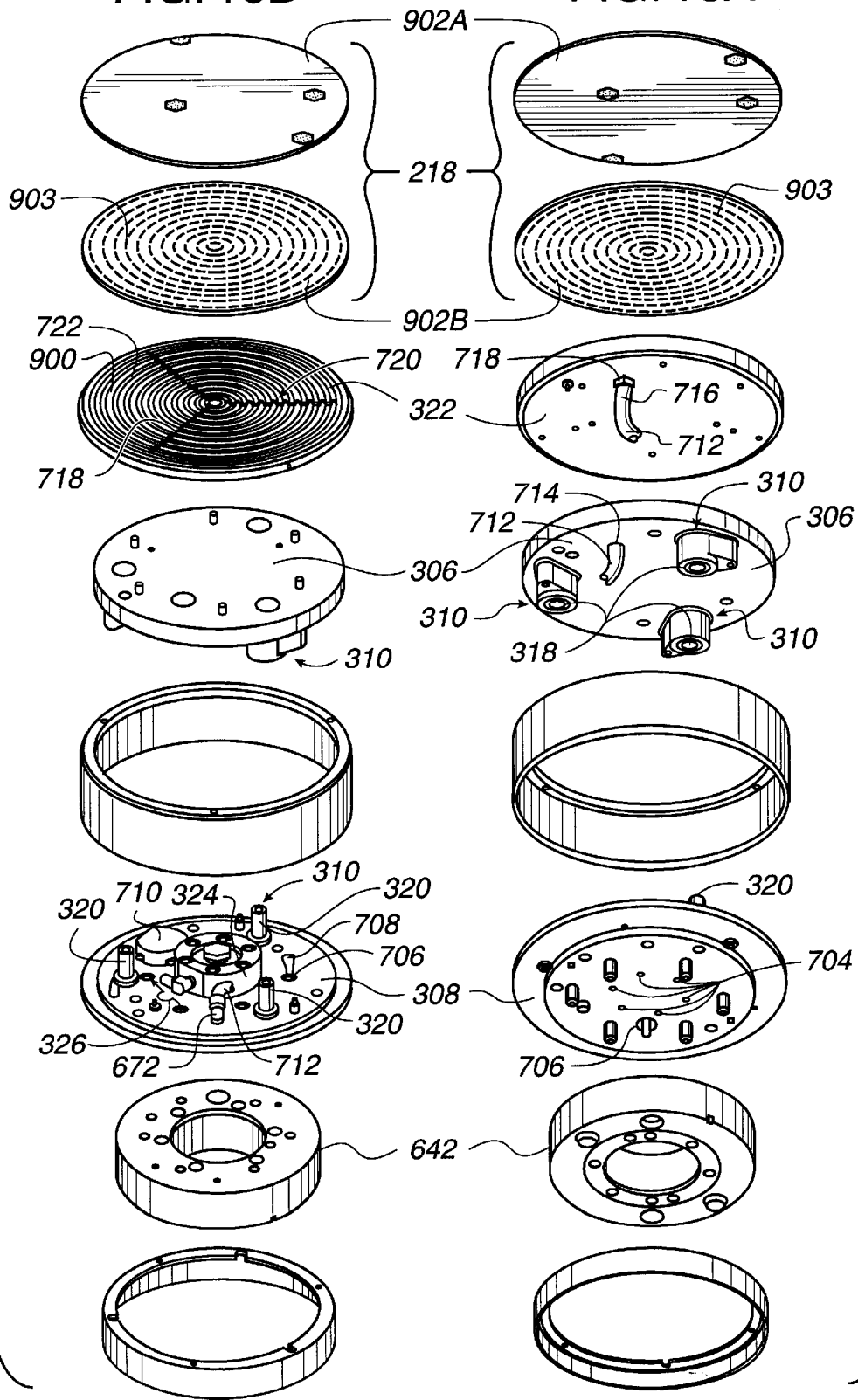

METHODS FOR CONTROLLING RETAINING RING AND WAFER HEAD TILT FOR CHEMICAL MECHANICAL POLISHING

FIELD OF THE INVENTION

The present invention relates generally to chemical mechanical polishing (CMP) systems and techniques for improving the performance and effectiveness of CMP operations. Specifically, the present invention relates to carrier heads for wafers and pad conditioning pucks, in which repeatability is provided in measuring forces applied to the heads eccentrically of a main axis of the head are resisted, wherein the heads, with the wafers and the pucks, do not tilt in response to the eccentric forces, but instead the heads are allowed to move parallel to a wafer axis; and relates to facilities for CMP operations, such as facilities for supplying fluids to, and removing fluids from, the carrier heads for the CMP operations without interfering with the CMP operations.

DESCRIPTION OF THE RELATED ART

In the fabrication of semiconductor devices, there is a need to perform CMP operations, including polishing, buffing and wafer cleaning. For example, a typical semiconductor wafer may be made from silicon and may be a disk that is 200 mm or 300 mm in diameter. For ease of description, the term "wafer" is used below to describe and include such semiconductor wafers and other planar structures, or substrates, that are used to support electrical or electronic circuits.

Typically, integrated circuit devices are in the form of multi-level structures fabricated on such wafers. At the wafer level, transistor devices having diffusion regions are formed. In subsequent levels, interconnect metallization lines are patterned and electrically connected to the transistor devices to define the desired functional device. Patterned conductive layers are insulated from other conductive layers by dielectric materials. As more metallization levels and associated dielectric layers are formed, the need to planarize the dielectric material increases. Without planarization, fabrication of additional metallization layers becomes substantially more difficult due to the higher variations in the surface topography. In other applications, metallization line patterns are formed in the dielectric material, and then metal CMP operations are performed to remove excess metallization.

In the prior art, CMP systems typically implement belt, orbital, or brush stations in which belts, pads, or brushes are used to scrub, buff, and polish one or both sides of a wafer. According to the type of CMP operation being performed, certain materials, such as slurry, are used to facilitate and enhance the CMP operation. For example, the slurry is most usually introduced onto a moving preparation surface, e.g., belt, pad, brush, and the like, and distributed over the preparation surface as well as the surface of the semiconductor wafer being buffed, polished, or otherwise prepared by the CMP process. The distribution is generally accomplished by a combination of the movement of the preparation surface, the movement of the semiconductor wafer and the friction created between the semiconductor wafer and the preparation surface.

In a typical CMP system, a wafer is mounted on a carrier with a surface of the wafer exposed. The carrier and the wafer rotate in a direction of rotation. The CMP process may be achieved, for example, when the exposed surface of the rotating wafer and a polishing pad are urged toward each other by a force, and when the exposed surface and the polishing pad move or rotate in a polishing pad direction. Some CMP processes require that a significant force be used at the time the rotating wafer is being polished by the polishing pad.

Normally, the polishing pads used in the CMP systems are composed of porous or fibrous materials. However, in some CMP systems, the polishing pads may contain fixed abrasive particles throughout their surfaces. Depending on the form of the polishing pad used, the slurry may be composed of an aqueous solution such as $NH_4OH$, or DI water containing dispersed abrasive particles may be applied to the polishing pad, thereby creating an abrasive chemical solution between the polishing pad and the exposed surface of the wafer.

Several problems may be encountered while using a typical CMP system. One recurring problem is called "edge-effect," which is caused when the CMP system polishes an edge of the wafer at a different rate than other regions of the wafer. The edge-effect is characterized by a non-uniform profile on the exposed surface of the wafer. The problems associated with edge-effect can be divided to two distinct categories. The first category relates to the so-called "pad rebound effect" resulting from the initial contact of the polishing pad with the edge of the wafer. When the polishing pad initially contacts the edge of the wafer, the pad rebounds (or bounces off) the edge, such that the pad may assume a wave-like shape. The wave-like shape may produce non-uniform profiles on the exposed surface of the wafer.

The second category is the "burn-off" effect. The burn-off effect occurs when a sharper edge of the wafer is excessively polished as it makes contact with the surface of the polishing pad. This happens because a considerable amount of pressure is exerted on the edge of the wafer as a result of the surface of the pad applying the force on a very small contact area of the exposed surface of the wafer (defined as the edge contact zone. As a consequence of the burn-off effect, the edges of the resulting polished wafers exhibit a burn ring that renders the edge region unusable for fabricating silicon devices.

Another shortcoming of conventional CMP systems is an inability to polish the surface of the wafer along a desired finishing layer profile. Ordinarily, the exposed surface of a wafer that has undergone some fabrication tends to be of a different thickness in the center region and varies in thickness out to the edge. In a typical conventional CMP system, the pad surface covers the entire exposed surface of the wafer. Such pad surface is designed to apply a force on a so-called "finishing layer" portion of the exposed surface of the wafer. As a result, all the regions of the finishing layer are polished until the finishing layer is substantially flat. Thus, the surface of the pad polishes the finishing layer irrespective of the wavy profile of the finishing layer, thereby causing the thickness of the finishing layer to be non-uniform. Some circuit fabrication applications require that a certain thickness of material be maintained in order to build a working device. For instance, if the finishing layer were a dielectric layer, a certain thickness would be needed in order to define metal lines and conductive vias therein.

These problems of prior CMP operations, and an unsolved need in the CMP art for a CMP system that enables precision and controlled polishing of specifically targeted wafer surface regions, while substantially eliminating damaging edge-effects, pad rebound effects, and edge burn-off effects, are discussed in related United States patent application Ser. No. 09/644,135 filed Aug. 22, 2000 for Subaperture Chemical Mechanical Polishing System and assigned to the assignee of the present application (the "related application"). The specification, claims and drawings of such related application are by this reference incorporated in the present application.

In such related application, a CMP system follows the topography of layer surfaces of the exposed surface of the wafer so as to create a CMP-processed layer surface which has a uniform thickness throughout. Such CMP system implements a rotating carrier in a subaperture polishing configuration, eliminating the above-mentioned drawbacks, edge-effects, pad rebound effects, and edge bum-off effects. For example, one embodiment of such CMP system includes a carrier having a top surface and a bottom region. The top surface of the carrier is designed to hold and rotate a wafer having one or more formed layers to be prepared. Further included is a preparation head, such as a polishing head, designed to be applied to at least a portion of the wafer, wherein the portion is less than an entire portion of the surface of the wafer. Although such CMP system avoids the above-described edge-effects, pad rebound effects, and edge bum-off effects, the application of such preparation head in this manner applies a force to the exposed surface of the wafer and to the carrier at a location that is eccentric with respect to an initial orientation of the wafer and the carrier. The initial orientation includes an initial orientation of central axes of the wafer and of the carrier (which are coaxial and positioned substantially vertically). The initial orientation also includes an initial orientation of the exposed surface of the wafer (which is positioned at an initial angle of ninety degrees with respect to the initial substantially vertical orientation of the central axes of the wafer and the carrier). The term "substantially vertical" means true vertical, and includes true vertical plus or minus normal mechanical tolerances from true vertical, such as those tolerances typical in bearings used in spindles and other supports for such carriers.

As may be understood from the above discussion of the edge-effects, pad rebound effects, and edge bum-off effects, it would be undesirable for such eccentric force to cause the central axes of the wafer and the carrier to depart from the initial orientation and to tilt, or assume a tilted orientation, under the action of the eccentric force. Such tilting or tilted orientation would occur when such central axes of the wafer and/or the carrier depart from true vertical more than the above-described normal mechanical tolerances from true vertical, e.g., by a number of degrees. In the prior art, gimbals are used as supports for carriers that present wafers to a preparation head, such as a head having a polishing pad, for example. The gimbals allow the wafer carrier (with the wafer mounted thereon) to tilt and assume such a tilted orientation relative to such initial orientation of the central axes of the wafer and the carrier. As described above- such tilting allows the exposed surface of the wafer to be at an angle other than substantially vertical, such as about eighty-five to eighty-eight degrees from horizontal, which is a significant departure from the initial orientation described above. Thus, due to the allowed tilting, the exposed surface of the wafer is not perpendicular to the initial orientation of such central axis of the wafer and the carrier. The tilting allowed by such gimbals may be appropriate when the polishing pad has an area about the same as that of the exposed surface of the wafer and the area of the pad totally overlaps the area of the exposed surface of the wafer. However, in the eccentric force situation described above (i.e., when the area of the polishing pad, for example, does not totally overlap the area of the exposed surface of the wafer) such gimbals, may not be used. In detail, such initial orientation of the central axes of the wafer and the wafer carrier is the orientation that must be maintained during polishing under the action of such eccentric force to achieve the desired planarization of the exposed surface of the wafer. In other words, the tilting allowed by such gimbals must be avoided if the desired planarization of the exposed surface of the wafer is to be achieved.

In U.S. Pat. No. 4,244,775, a polishing plate is provided with a diameter about twice that of a semiconductor body to be treated. The body is mounted in a supporting holder in a manner that presents an entire surface of the body to the polishing plate. As a result, movement of the body and of the support holder within a collar toward and away from the polishing plate always presents the entire surface of the body to the polishing plate. Because the support holder surrounds the body, the holder must have a relatively large diameter, e.g., more than eight inches if the semiconductor body is an eight inch diameter wafer. Thus, in the example of such wafer, the length of the collar (which would generally be twice the diameter) would be about sixteen inches. As a result of this configuration of the collar relative to the semiconductor body, the length of the collar is directly related to the diameter of the semiconductor body to be processed. Further, with such large collar, frictional losses would be relatively large between the collar and the support holder, and may be variable as well.

In addition, in the past wafer carriers have been provided with flat metal backings on which the wafer is directly placed. One such wafer carrier provides a number of holes through the metal backing by which a vacuum is applied to the wafer. In theory, a wafer present on the metal backing will block the flow of air into the holes, changing the pressure in a duct to the holes, providing a way to indicate the presence of the wafer. However, vacuum applied through such holes can deform the wafer and interfere with the accuracy of polishing operations on the wafer on the metal backing. Also, slurry used in the polishing operations can block one or more of the holes, and result in a false indication of wafer presence on the metal backing.

Another type of wafer carrier provides a ceramic layer on the carrier. Such layer has one-half micron to one micron pores. Investigation relating to the present invention indicates that such extremely small micron-size pores could easily clog and would be difficult to clear. Generally, such carriers are cleaned by fluid sprayed onto the top of the carrier on which a wafer is placed, for example. Thus, such sprays are applied externally of such ceramic layers even though the clogged, very small micron-size pores are inside the layer.

Also, in another type of polishing system, the exposed surface of a wafer to be polished, for example, faces downwardly, and may be horizontal. In this type of system, slurry used for polishing more easily flow off, or be removed from, the exposed surface and parts of the carrier. As a result, this type of system does not present the problem of removal of slurry from an exposed surface that faces upwardly.

Another problem faced in providing preparation heads, such as wafer polishing heads, is that one head may be used to carry a particular wafer during many different processing steps (e.g., wafer polishing and buffing) Here, the carrier with the wafer attached, is first mounted at one processing station, and processed. Upon completion of the first processing, the carrier is removed from the first station, transported to a second station, and mounted at the second processing station, etc. As a result, currently there are significant demands for very small carriers that may be universally used with many type of processing stations.

What is needed then, is a CMP system and method in which a force applied to a carrier, such as a wafer or puck carrier, may be accurately measured even though such force is eccentrically applied to such carrier. In particular, currently there is an unmet need for a way of providing an accurate indication of an amount of such eccentric force. Such an accurate indication is a repeatable measurement technique that may be described in terms of "equal eccentric forces". Such equal eccentric forces are eccentric forces having the same value as applied by a pad, such as a polishing pad, to a carrier for a wafer or pad conditioner puck. The repeatable measurement technique is one which, for all such equal eccentric forces, the loss of force within the measurement system and within the system for supporting the carrier, will be substantially the same, i.e., repeatable. Moreover, what is needed is a CMP system and method having the above-described needed repeatable measurement features, while providing facilities for other CMP operations, such as facilities for supplying fluids within a carrier to the wafer and a wafer support without interfering with the polishing operations. Similarly, what is needed is a CMP system and method for removing fluids from, the carrier for the CMP operations without interfering with the CMP operations.

SUMMARY OF THE INVENTION

Broadly speaking, the present invention fills these needs by providing CMP systems and methods which implement solutions to the above-described problems, wherein structure and operations are provided that facilitate making repeatable measurements of the eccentric forces. In such systems and methods, a force applied to a carrier, such as a wafer or puck carrier, may be accurately measured even though such force is eccentrically applied to such carrier. Another aspect of such systems and methods of the present invention is a CMP system and method having the above-described needed repeatable measurement features, while providing facilities supplying fluids within a carrier to the wafer and a wafer support without interfering with the polishing operations. Similarly, another aspect of such systems and methods of the present invention is a CMP system and method for removing fluids from the wafer or puck carrier without interfering with the CMP operations.

In one embodiment of the systems and methods of the present invention, an initial coaxial relationship between an axis of rotation and a carrier axis is maintained during application of the eccentric force, such that a sensor is enabled to make repeatable measurements, as defined above, of the eccentric forces, and the carrier may be a wafer or a puck carrier.

In another embodiment of the systems and methods of the present invention, such initial coaxial relationship is maintained by a linear bearing assembly mounted between the carrier and the sensor, and the carrier may be a wafer or a puck carrier.

In yet another embodiment of the systems and methods of the present invention, the linear bearing assembly is provided as an array of separate linear bearing assemblies, wherein each separate linear bearing assembly is dimensioned independently of the diameter, for example, of a wafer or puck carried by the carrier.

In still another embodiment of the systems and methods of the present invention, the linear bearing assembly is provided as an array of separate linear bearing assemblies in conjunction with a retainer ring movable relative to the carrier, wherein an eccentric force applied to the retainer ring is accurately measured even though such force is eccentrically applied to such ring.

In a related embodiment of the systems and methods of the present invention, the linear bearing assembly is assembled with the retainer ring in conjunction with a motor for moving the ring relative to the wafer mounted on the carrier so that an exposed surface of the wafer and a surface of the retainer ring to be engaged by the polishing pad are coplanar during the polishing operation.

A further embodiment of the systems and methods of the present invention provides a vacuum chuck supplied with both a vacuum and a wash fluid through the same conduit system, wherein the vacuum is applied to the wafer uniformly across the vacuum chuck and through large-micron-size pores that may easily be cleaned by wash fluid fed through the same conduit system.

Another beneficial embodiment of the systems and methods of the present invention provides a portion of the wafer overhanging the carrier, in conjunction with passageways in the carrier for directing wash fluid against the overhanging portion to clean slurry from the carrier.

An added embodiment of the systems and methods of the present invention provides a puck made from a perforated plate in which perforations extend across a surface for supporting the puck and a fluid is distributed substantially all across the puck to purge the puck.

A still additional embodiment of the systems and methods of the present invention provides a puck support having a lip defining a reservoir for receiving a puck having perforations, wherein the puck support is configured to distribute fluid to all of the perforations to fill the reservoir.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIGS. 4A and 4B are exploded perspective views of the first embodiment, illustrating in FIG. 4B the bottoms of the structural elements and in FIG. 4A the tops of the structural elements;

FIGS. 5A-1 through 5A-3 are enlarged perspective views of various ones of the structural elements shown on the right side of FIG. 4;

FIGS. 5B-1 through 5B-3 are enlarged perspective views of various ones of the structural elements shown in FIG. 4B;

FIG. 12A is a cross sectional view of an enlarged portion of FIG. 7 showing the retainer ring base in a full engage to position and locate the wafer on the vacuum chuck prior to the CMP operations; wherein

FIG. 13A is a cross sectional view of an enlarged portion of FIG. 7 showing the retainer ring in a disengaged position away from the wafer to facilitate removal of the wafer from the wafer carrier, wherein

FIG. 14A is a cross sectional view of an enlarged portion of FIG. 7 showing the retainer ring base in a polishing position to facilitate spraying DI water onto a base of the wafer while the exposed surface of the wafer is polished, wherein

FIGS. 16A and 16B are exploded perspective views of the first embodiment, illustrating in FIG. 16A the bottoms of the structural elements and in FIG. 16B the tops of the structural elements;

DETAILED DESCRIPTION OF THE PREFERRED EMBODIMENTS

An invention is described for a CMP system, and methods, which enable precision controlled polishing of an exposed surface, which may include layer surfaces, of a wafer. The CMP system and methods substantially eliminate the aforementioned edge-effects, pad rebound effects, and edge burn-off effects, while structure and operations are provided that facilitate making repeatable measurements of the eccentric forces. In such CMP systems and methods, a force applied to a carrier, such as a wafer or puck carrier, may be accurately measured, as defined above, even though such force is eccentrically applied to such carrier. The CMP system and methods have the above-described repeatable measurement features, while providing facilities supplying fluids within a carrier to the wafer and a wafer support without interfering with the polishing operations. Similarly, the CMP system and methods remove fluids from the wafer or puck carrier without interfering with the CMP operations.

In the following description, numerous specific details are set forth in order to provide a thorough understanding of the present invention. It will be understood, however, to one skilled in the art, that the present invention may be practiced without some or all of these details. In other instances, well known process operations have not been described in detail in order not to obscure the present invention.

Figure 1A:
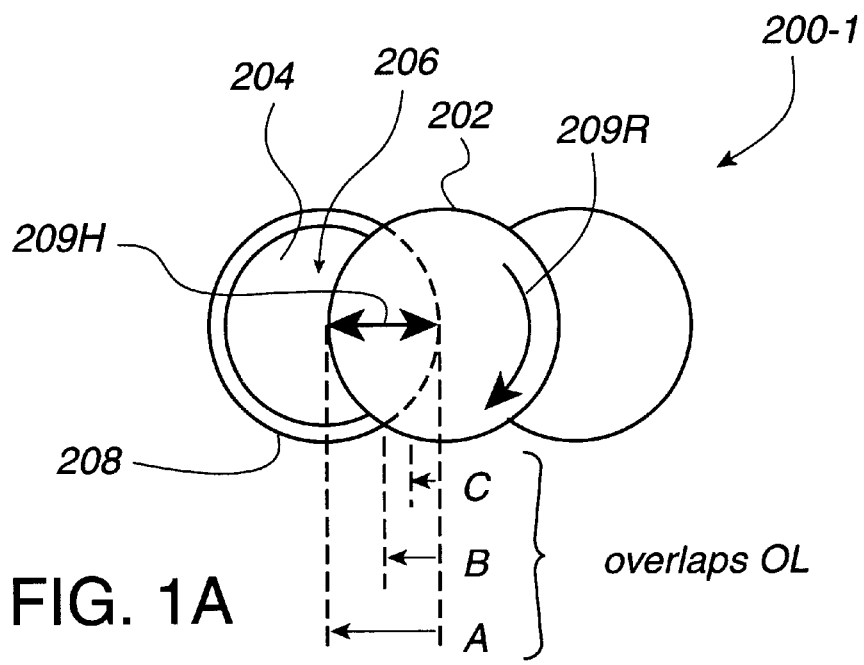
FIG. 1A is a plan view schematically showing a first embodiment of the present invention in which one polishing head contacts both a wafer carried by a wafer carrier and a puck carried by a polishing pad conditioner, the contacts each being eccentrically with respect to a central axis of each of the carriers.
Figure 1B:
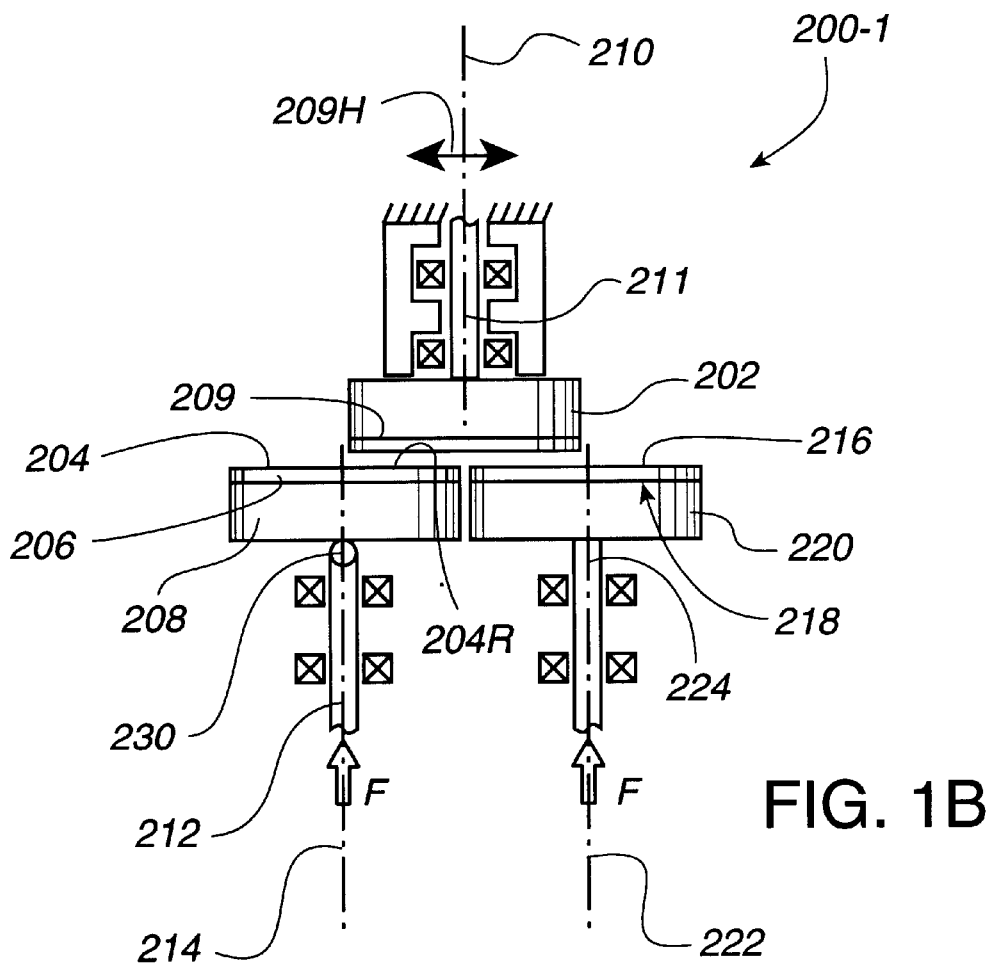
FIG. 1B is an elevational view schematically showing the first embodiment depicted in FIG. 1A, illustrating the central axes of the carriers and eccentric forces resulting from the eccentric contacts.

Referring to FIGS. 1A and 1B, there is schematically shown a first embodiment of the present invention, including a subaperture CMP system 200-1. The embodiment of FIGS. 1A and 1B includes a preparation carrier, or polishing head, 202 which is configured to polish an exposed surface 204 of a wafer 206 mounted on a carrier 208, such as a wafer carrier. The wafer 206 may be any of the wafers described above, for example. The polishing head 202 is designed to polish the surface 204 of the wafer 206 utilizing a polishing pad 209, which may include pads sold by Linear Polisher Technology (LPT), rotary CMP pad materials, fixed abrasive pad materials, etc. In general, any pad material that enables the desired polishing levels and precision can be used for the pad 209. As described in more detail below, the features for making repeatable measurements of the forces identified below, reduce the need for the material of such pads 209 to compensate for mechanical tolerances discussed below.

One motion of the polishing head 202, and of the pad 209 on the head 202, for performing polishing of the wafer 206, for example, or for enabling the pad 209 to be conditioned, is rotation (see arrow 209R) around respective co-axial axes 210 and 211 of the head 202 and the pad 209. Generally, the head 202 is mounted to prevent movement parallel to such coaxial axes 210 and 211, i.e., to prevent movement either toward or away from the respective wafer carrier 208, for example. Another motion of the polishing head 202 and of the pad 209 on the head 202 for performing polishing of the wafer 206, for example, or for enabling the head 202 and the pad 209 to be conditioned, is movement horizontally (see arrow 209H). It may be understood from the arrows 209H in FIGS. 1A and 1B, for example, that a force FP-W may be applied by the polishing head 202 to the wafer 206 and to the wafer carrier 208 at different locations. Such locations are indicated by the displacement DF-W measured from the axis 212 or 214.

Figure 2A:
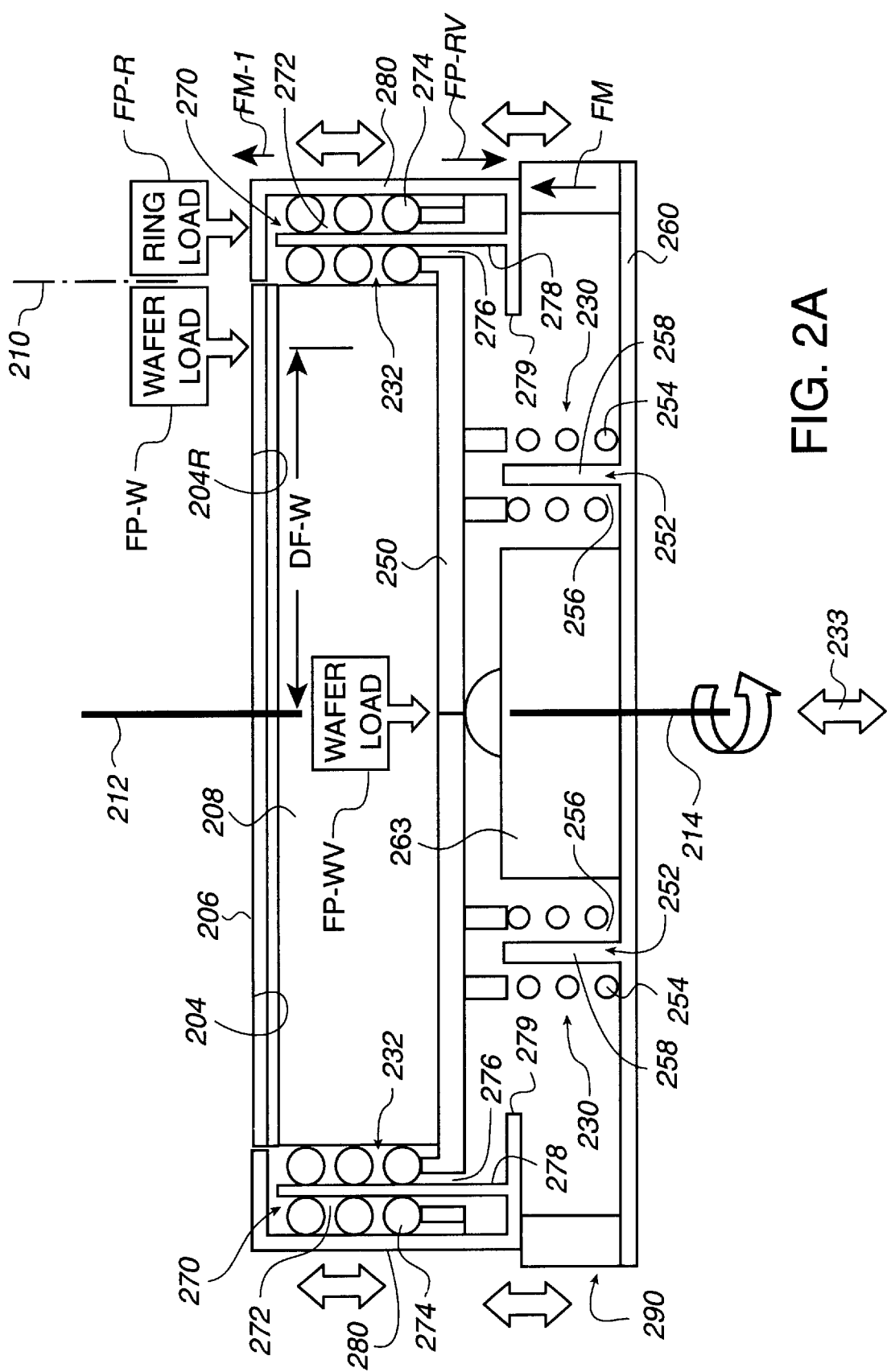
FIG. 2A is an elevational view schematically showing the wafer carrier of the first embodiment, illustrating two separate linear bearing structures, one assembly limiting the direction of relative movement between a main bearing housing and a chuck bearing plate, and a second assembly limiting the direction of relative movement between the main bearing plate and a retaining ring bearing plate.

The subaperture configuration of the system 200-1 introduces flexibility into the polishing operation by utilizing different or same removal rates on different regions of the exposed surface 204 of the wafer 206. Unlike the above-described conventional CMP systems wherein an entire polishing head pad is in contact with the entire exposed surface of the wafer, in the subaperture CMP system 200-1, at any given time T1, the size of an area of a contact surface of the preparation head 202 that is in contact with the exposed surface 204 of the wafer 206 may vary. In addition, in the subaperture CMP system 200-1, by preventing movement of the preparation head 202 toward the wafer carrier 208, movement (see up portion of arrow 233, FIG. 2A) of the wafer carrier 208 toward the polishing head 202 results in applying a force FP-W only to selected regions 204R of the exposed surface 204 of the wafer 206, thereby removing excess materials from those selected regions 204R, exclusively, at a particular time, e.g., T1. Further, as shown in FIG. 2A, one such selected region 204R of the exposed surface 204 of the wafer 206 is displaced horizontally from, or eccentric relative to, a central axis 212 of the wafer carrier 208. The central axis 212 is concentric with a central axis 214 of the wafer 206 carried by the carrier 208. As shown, the displacement of the force FP-W is indicated by DF-W, which is measured horizontally in FIGS. 1A, 1B and 2A. It may be understood from the arrow 209H that the polishing head 202 may move horizontally and contact different ones of the selected regions 204R of the exposed surface 204. Also, the areas of such contacted exposed regions 204R will vary according to the value of the displacement DF-W. Thus, for a given value of the force FP-W applied by the polishing head 202 to the wafer 206, the pressure on the exposed and contacted region 204R will be less as the area of the region 204R increases. For purposes of description, it is to be understood that the force FP-W is an average force applied by the polishing head 202 on the area of the region 204R, and this average force is said to be applied at the center of such area of the region 204R. It may also be appreciated that to uniformly polish the exposed regions 204R of the wafer 206, even amounts of pressure should be applied to the different exposed and contacted regions 204R. As the area of the exposed and contacted regions 204R increases, for example, the force FP-W would increase to have the amounts of pressure be even.

As shown in FIG. 1B, there is an initial orientation of the wafer 206 and of the wafer carrier 208. The initial orientation includes an initial first orientation of the central axis 214 of the wafer 206 and of the central axis 212 of the wafer carrier 208. The initial first orientations of the axes 212 and 214 are, for example, substantially vertically when the polishing head 202 is designed to rotate on the central axis 210 that is also vertical. The term "substantially vertical" is used herein to describe the present invention as defined above. Further, in the same exemplary situation in which the polishing head 202 is designed to rotate on the axis 210 that is also vertical, the initial orientation includes a second initial orientation of the exposed surface 204 of the wafer 206. The second initial orientation of the exposed surface 204 is positioned at an angle (an initial angle) of ninety degrees with respect to the initial substantially vertical orientation of the respective central axes 212 and 214 of the carrier 208 and of the wafer 206.

In the phrase "initial orientation" as used in this application, the word "initial" designates the above-described orientation that occurs at a time T0PW just before the pad 209 of the polishing head 202 engages the exposed surface 204 of the wafer 206. Thus, at the time T0PW there is initially no force FP-W applied by the pad 209 on the wafer 206.

Figure 2B:
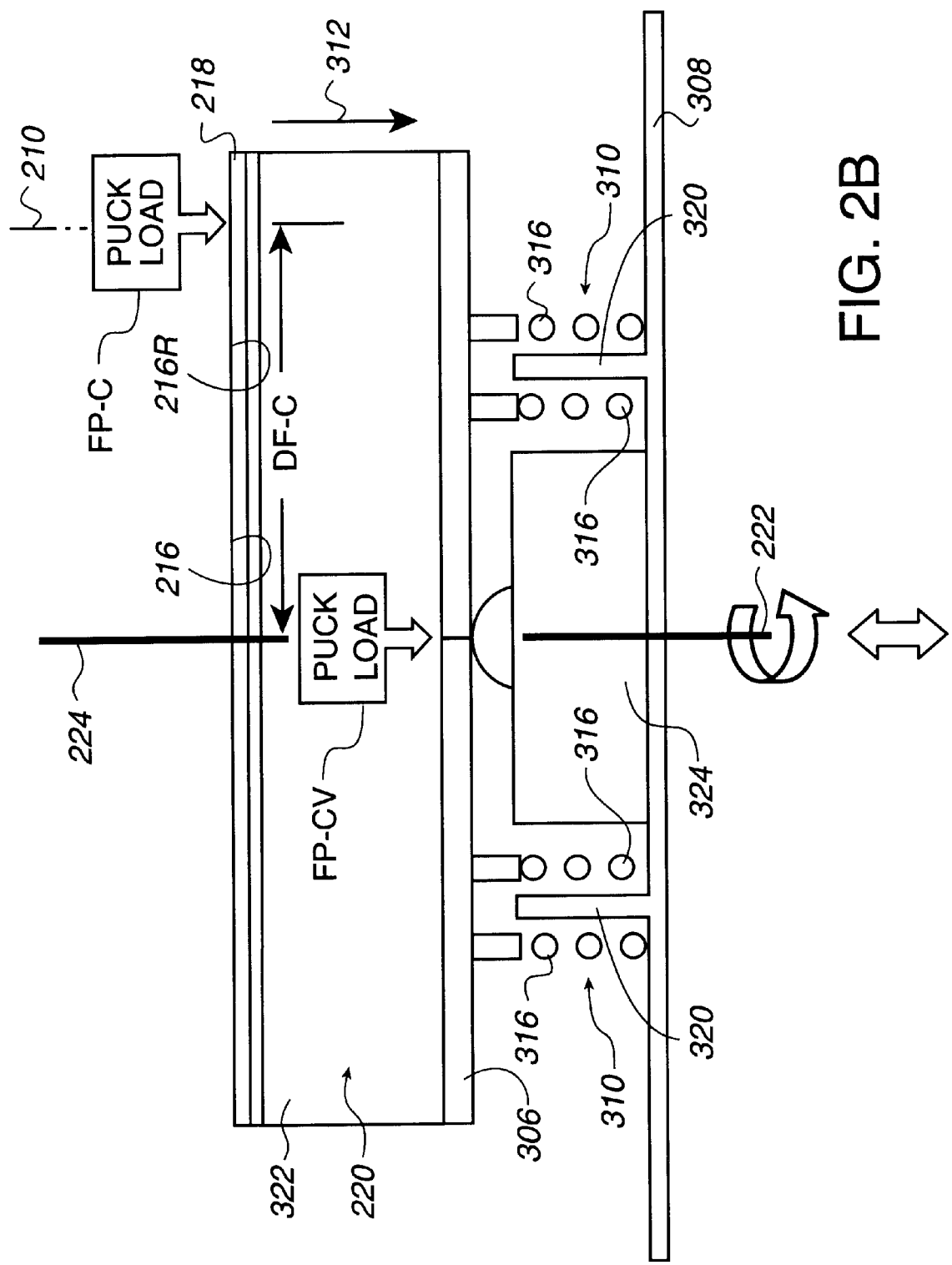
FIG. 2B is an elevational view schematically showing the pad conditioning head of the second embodiment, illustrating linear bearing structures for limiting the direction of relative movement between a main bearing housing and a chuck bearing and load cell plate.

FIGS. 1A, 1B and 2B also show that in the use of the subaperture configuration of the CMP system 200-1, at any given time T1, there may be a variation in the size of an area of a contact surface of the polishing head 202 that is in contact with an exposed surface 216 of a puck 218 mounted on a pad conditioning head 220. Such time T1 is after an initial time T0PP at which the pad 209 is not contacting the puck 218. In addition, in the subaperture CMP system 200-1, with the polishing head 202 held against movement in the direction of the axes 210 and 211, as the pad conditioning head 220 is moved toward the polishing head 202, the polishing head 202 applies another force FP-C, a conditioning force, (FIG. 2B) only to selected regions 216R of the puck 218. One such selected region 216R of the puck 218 of the pad conditioning head 220 is also displaced from, or eccentric relative to, a central axis 222 of the pad conditioning head 220, which is co-axial with a central axis 224 of the puck 218. As shown in FIG. 2B, the displacement of the force FP-C is indicated by DF-C. The displacement DF-C is measured horizontally in FIGS. 1B and 2B and is between the axes 222 and 224, on the one hand, and the axis 210 of the polishing head 202. As described above with respect to the force FP-W being an average force FP-W, the force FP-C is an average force. Similarly, the pressure and area factors relating to the regions 204R apply the regions 216R.

Further, in the same exemplary situation in which the polishing head 202 is designed to rotate on the axis 210 that is also vertical, as shown in FIG. 1B there is also an initial orientation of the puck 218 and of the pad conditioning head 220. This initial orientation includes a third initial orientation of the central axis 222 of the head 220 and of the central axis 224 of the puck 218. The initial third orientations of the axes 222 and 224 are, for example, substantially vertical when the polishing head 202 is designed to rotate on the axis 210 that is also vertical. Further, in the same exemplary situation in which the polishing head 202 is designed to rotate on the axis 210 that is also vertical, the initial orientation includes a fourth initial orientation of the exposed surface 216 of the puck 218. The fourth initial orientation of the exposed surface 216 is positioned at an angle (a first angle) of ninety degrees with respect to the initial substantially vertical orientation of the respective central axes 222 and 224 of the head 220 and of the puck 218.

In the phrase "initial orientation" as used in this application, the word "initial" also designates the above-described orientation that occurs at the time T0PP just before the pad 209 of the polishing head 202 engages the exposed surface 216 of the puck 218. Thus, there is initially no force FP-C (FIG. 2B) applied by the pad 209 on the puck 218.

Reference is further made to FIG. 2A, and to the exemplary situation in which the polishing head 202 is designed to rotate on the axis 210 that is vertical. The CMP system 200-1 includes multiple linear bearing structures 230 and 232 of the wafer carrier 208. In a general sense, the structures 230 and 232 facilitate making repeatable measurements of the eccentric forces FP-W. Thus, the force FP-W applied to the wafer carrier 208 may be accurately measured, as defined above, even though such force FP-W is eccentrically applied to such carrier 208. In more detail, the structures 230 and 232 enable the providing of the above defined accurate indication of an amount of such eccentric force FP-W.

Describing the term "accurate indication" in view of FIG. 2A, for example, the referenced repeatable measurement technique may be described in terms of many of the forces FP-W which from one time T1 to another time T1 have equal values. By the present invention, each time T1 those equal forces FP-W are measured, the measured or indicated value is the same within a very small tolerance. Such equal eccentric forces FPW are applied by the polishing pad 209 to the wafer carrier 208, for example. It is to be understood that as mechanical devices, the structures 230 and 232 will cause some amount (referred to as a force FF, or a friction force FF) of the equal eccentric forces FP-W to be lost, such as due to friction. In this context, the referenced repeatable measurement technique is one which, for each such equal eccentric force FP-W, the loss of force FF within the measurement system and within the system for supporting the carrier, will be substantially the same, i.e., repeatable. Therefore, by providing a minimum of mechanical structure between the forces FP-W and the structures 230 and 232 as described below, there is no force FF lost in the carrier 208, which leaves only each separate bearing structure 230 and 232 as a source of the force FF for a particular respective measurement.

The structure 230, for example, is resistant to all except a vertical component FPWV of the force FP-W applied to the wafer 206 and to the carrier 208 at the location that is eccentric with respect to the initial first orientation of the central axis 212 of the wafer carrier 208. The linear bearing 230 assures that the structure of the wafer carrier 208 is not allowed to move in an undesired manner in response to such an eccentric force FP-W. For example, in such CMP system 200-1 such eccentric force FP-W is not allowed to move such wafer carrier 208 nor the wafer 206 relative to the initial first orientations of the respective central axes 212 and 214 of the respective wafer carrier 208 and wafer 206, except as follows. The exception is that the wafer carrier 208 and the wafer 206 are permitted to move only parallel (see arrow 233) to the initial first orientations of those respective central axes 212 and 214. The arrow 233 is parallel to the vertical component FP-WV.

FIG. 2A schematically depicts two of three of the multiple linear bearing structures 230 in more detail, and FIGS. 5A-1 through 5A-3, and FIGS. 5B-1 through 5B-3 show the three multiple linear bearings 230 in more detail. A main bearing housing 250 is provided with a first set 252 of three linear bearings 253. Each bearing includes three sleeves 254, each of which is made from material sold under the trademark FRELON. The FRELON material is impregnated with hard particulate material for both low friction characteristics and increased wear-resistance. Suitable sleeves 254 may have a one-half inch inside diameter and a length of about one and one quarter inches. The sleeves may be linear bearing Model Number FL08 sold by Pacific Bearing, of Rockford, IL. For illustrative purposes, in FIG. 2A each sleeve 254 is depicted by spaced pairs of circles. Each sleeve 254 is open at a bottom 256 to receive a mating bearing shaft 258 shown in FIG. 2A for illustrative purposes as an upwardly extending line. Each shaft 258 is made from stainless steel material. Suitable shafts 258 may have an outside diameter of about just less than one-half inch so as to provide a clearance of no less than 0.005 inch when the shaft 258 has a size based on the maximum allowable plus tolerance for the shaft 258 and the sleeve has a size based on the maximum allowable minus tolerance. The shaft 258 may be about one and one-quarter inches long. Each shaft 258 extends upwardly from a chuck bearing and load cell plate 260 and extends through the bottom 256 and into one of the sleeves 254. The main bearing housing 250 is fixed to, and carries, a vacuum chuck 262 of the wafer carrier 208. The chuck 262 carries the wafer 206, which during polishing is subjected to the eccentric force FP-W, indicated as a wafer load imposed on the wafer 206.

As described above, FIG. 1B shows the initial orientation of the wafer carrier 208 and the wafer 206 before the pad 209 of the polishing head 202 engages the exposed surface 204 of the wafer 206. Thus, there is initially no force FP-W applied by the pad 209 on the wafer 206, and initially the respective axes 212 of the wafer carrier 208 and 214 of the wafer 206 are vertical and coaxial in the exemplary situation. It is recalled that in the exemplary situation, the polishing head 202 is designed to rotate on the axis 210 that is vertical, and applies the eccentric force FP-W (FIG. 2A) vertically downwardly on the wafer 206 and the head 208. The structure 230 is linear in the direction of the axis 210 of the polishing head and of the axis 211 of the pad 209. Thus, the structure 230 is resistant to all except the vertical component FP-WV of this eccentric force FP-W applied to the wafer 206 and to the carrier 208.

In detail, set 252 of three bearings linear bearings 253 assures that structure of the wafer carrier 208 is not allowed to move in an undesired manner in response to such an eccentric force FP-W. Thus, the linear bearings 253 assure that such eccentric force FP-W does not move such wafer carrier 208 nor the wafer 206 except vertically, which is parallel to the initial first orientations of the respective central axes 212 and 214 of the respective wafer carrier 208 and wafer 206. As a result, the eccentric wafer load FP-W (shown in FIG. 2A acting on the wafer 206), minus the friction force FF, is transferred to the main bearing housing 250 and is referred to as the permitted vertical force component FP-WV. The force component FP-WC is therefore a net force, after deduction of the force FF.

Figures 2, 5B:
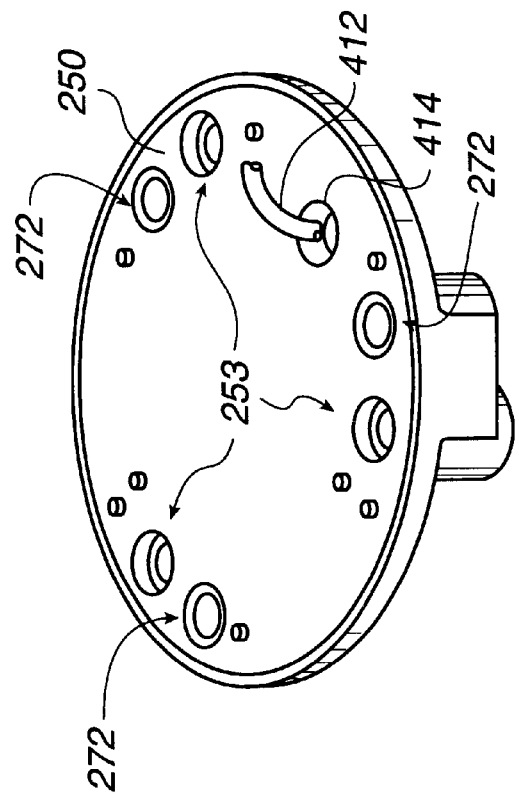

FIGS. 5B-1 and 5A-2 show the multiple linear bearing structures 230 as including an array 265 of the linear bearings 253. The array 265 is configured to divide the operation of the multiple linear bearing structures 230 into parts having a short length in the direction of the axes 212 and 214 and small diameters relative to the diameters (e.g., eight inches) of the wafers 206 and the pucks 218. Moreover, such division locates the linear bearings 253 of the structures 230 at uniformly spaced intervals around a circular path 266 (FIG. 5B-3). In this manner, as the wafer carrier 208 or the pad conditioning head 220 rotate, there is a rapid succession of individual linear bearings 253, for example, located under the eccentric force FP-W that is to be sensed in the operation of the CMP system 200-1.

The force FP-WC acts on a load cell 263 (FIGS. 2A and 5B-1). The load cell 263 may be a standard strain gauge such as Model Number LPU-500-LRC sold by Transducer Techniques, of Temecula, Calif. The load cell may have a load sensing range of from about zero pounds of force to 500 pounds of force. More preferably, a more accurate load sensing range may be used, e.g., from about zero to about 400 pounds of force. The load cell 263 is secured to the chuck bearing and load cell plate 260. The permitted movement of the main bearing housing 250 under the action of the force FP-WC is sensed by, or actuates, the load cell 263, which outputs a wafer load signal 264 (FIG. 5B-1) in response to such movement). As described above, to uniformly polish the exposed regions 204R of the wafer 206, for example, uniform, or even, amounts of pressure should be applied to the different exposed and contacted regions 204R. As the area of the exposed and contacted regions 204R increases, for example, the force FP-W would increase to have the amounts of pressure be even. Since the polishing pad 202 moves in the direction of the arrow 209H during the polishing operations performed on one wafer 206, and because such polishing pad movement causes different areas of the exposed regions 204R to be contacted by the polishing pad 209, the force FP-W applied to the wafer 206 must be varied accurately. Processing of the wafer load signal 264 is performed and the force of the wafer carrier 208 in the upward direction (see F in FIG. 1B) is adjusted as necessary to provide the appropriate force FP-W applied by the polishing pad 202 on the wafer 206 and the wafer carrier 208.

Figure 7:
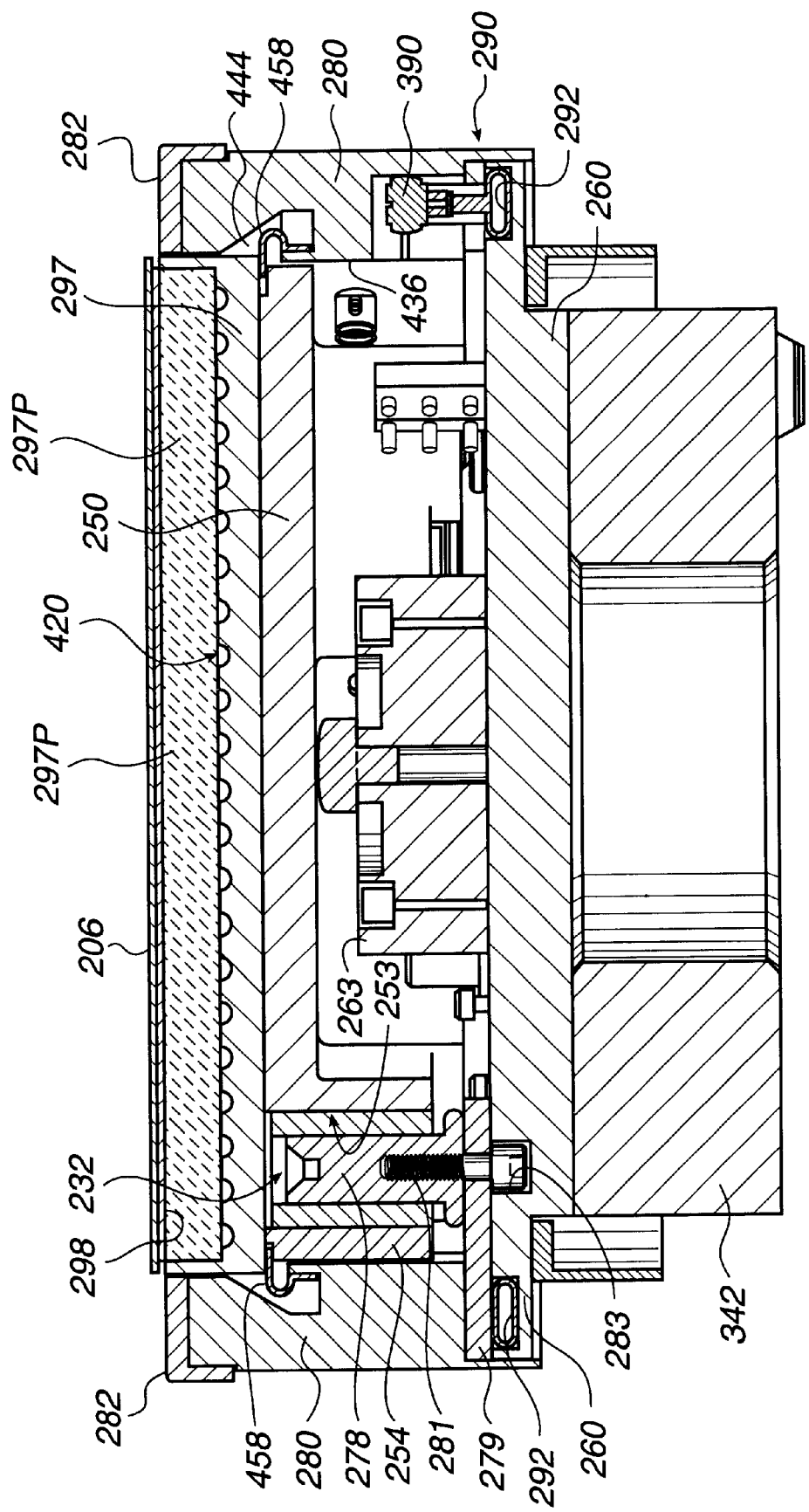
FIG. 7 is a cross sectional elevational view taken on line 7—7 in FIG. 6A showing the main bearing housing movably connected to a retainer ring bearing plate, showing a bearing shaft of the plate in a cylindrical linear bearing on the housing to limit movement of a retainer ring base mounted on the plate.
Figure 15:
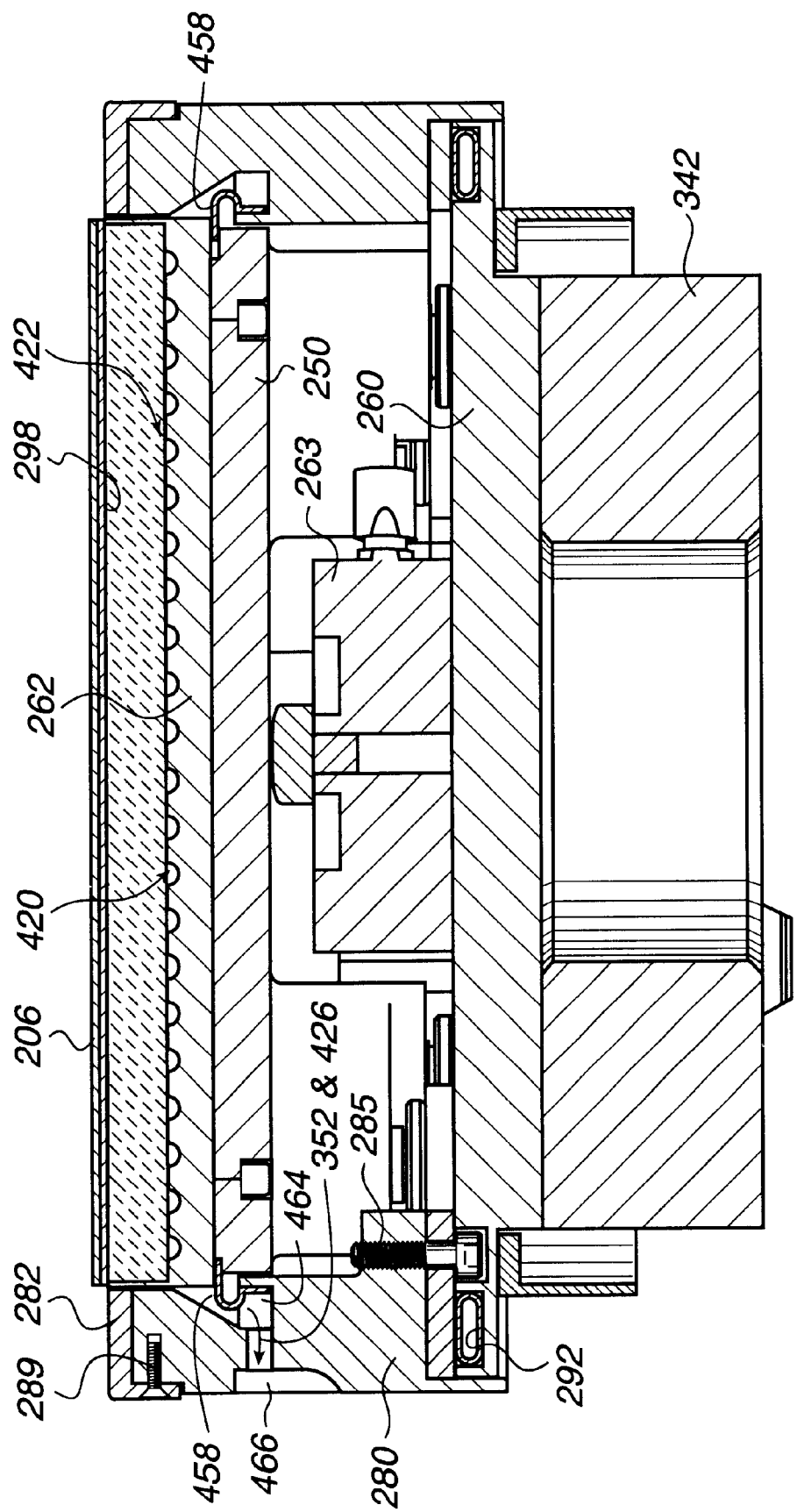
FIG. 15 is a cross section taken along line 15—15 in FIG. 6A through the retainer ring base, illustrating an outlet for removing slurry and DI wafer wash water from the inside of the wafer carrier.

The linear bearing structures 232 are described with reference to FIGS. 1B, 2A, 5A-1 through 5A-3, and 5B-1 and 5B-2. The main bearing housing 250 is provided with a second set 270 of three linear bearings 272, including three sleeves 274 (depicted by spaced pairs of circles). The sleeves 274 have open bottoms 276 to receive mating bearing shafts 278 (depicted as upwardly extending lines). The shafts 278 are mounted on a retainer ring bearing plate 279 by screws 281 received in a bore 283 (FIG. 7). The bore 283 is dimensioned to permit the screw to move with the plate 279 relative to the plate 260, such as for vertical travel of 0.050 inch of the retainer ring 282. The bearings 272 may be the same type bearings as the bearings 253, for example. The retainer ring bearing plate 279 is secured to a retainer ring base 280 by screws 285 (FIG. 15). The base 280 is designed to move vertically as limited by the linear bearings 272 of the second set 270, and is free, for example, to move through the same amount of travel (0.050 inch) as the plate 279. At the top of the retainer ring base 280 a retainer ring 282 is removably provided for contacting the polishing pad 209. The retainer ring 282 is thus mounted for movement independently of the plate 260 and independently of the main bearing housing 250. The retainer ring 282 engages the polishing pad 209, such that the retainer ring 282 may be replaced from time to time as by loosening screws 289 (FIG. 15).

As described above, FIG. 1B shows the initial orientation of the wafer carrier head 208. The head 208 includes the retainer ring base 280 and the retainer ring 282. The retainer ring base 280 surrounds and is spaced from the vacuum chuck 262. The retainer ring 282 is designed to be engaged by the polishing pad 209 during the wafer polishing operations, and the polishing pad 209 imparts a force FP-R on the retainer ring 282. The force FP-R is eccentric with respect to the axis 212 of the wafer carrier 208.

At a time T0PRR before the pad 209 of the polishing head 202 engages the retainer ring 282, an outer cylindrical surface 284 is vertical. The surface 284 is defined by the retainer ring base 280 and the retainer ring 282. At such time T0PRR, there is initially no force FP-R applied by the pad 209 on the retainer ring 282, and respective central axes 286 and 288 of the retainer ring base 280 and retainer ring 282 are vertical.

It is recalled that in the exemplary situation, the polishing head 202 is designed to rotate on the axis 210 that is vertical. Thus, the polishing head 202 applies the eccentric force FP-R vertically downwardly onto the retainer ring 282. Generally, the structure 232 functions in the same manner as the above-described functioning of the structure 230. In more detail, the structure 232 facilitates making repeatable measurements of the eccentric forces FP-R. Thus, the force FP-R applied to the retainer ring 282 may be accurately measured, as defined above, even though such force FP-R is eccentrically applied to such retainer ring 282. In more detail, the structure 232 enables the providing of the above defined accurate indication of an amount of such eccentric force FP-R.

Figure 6A:
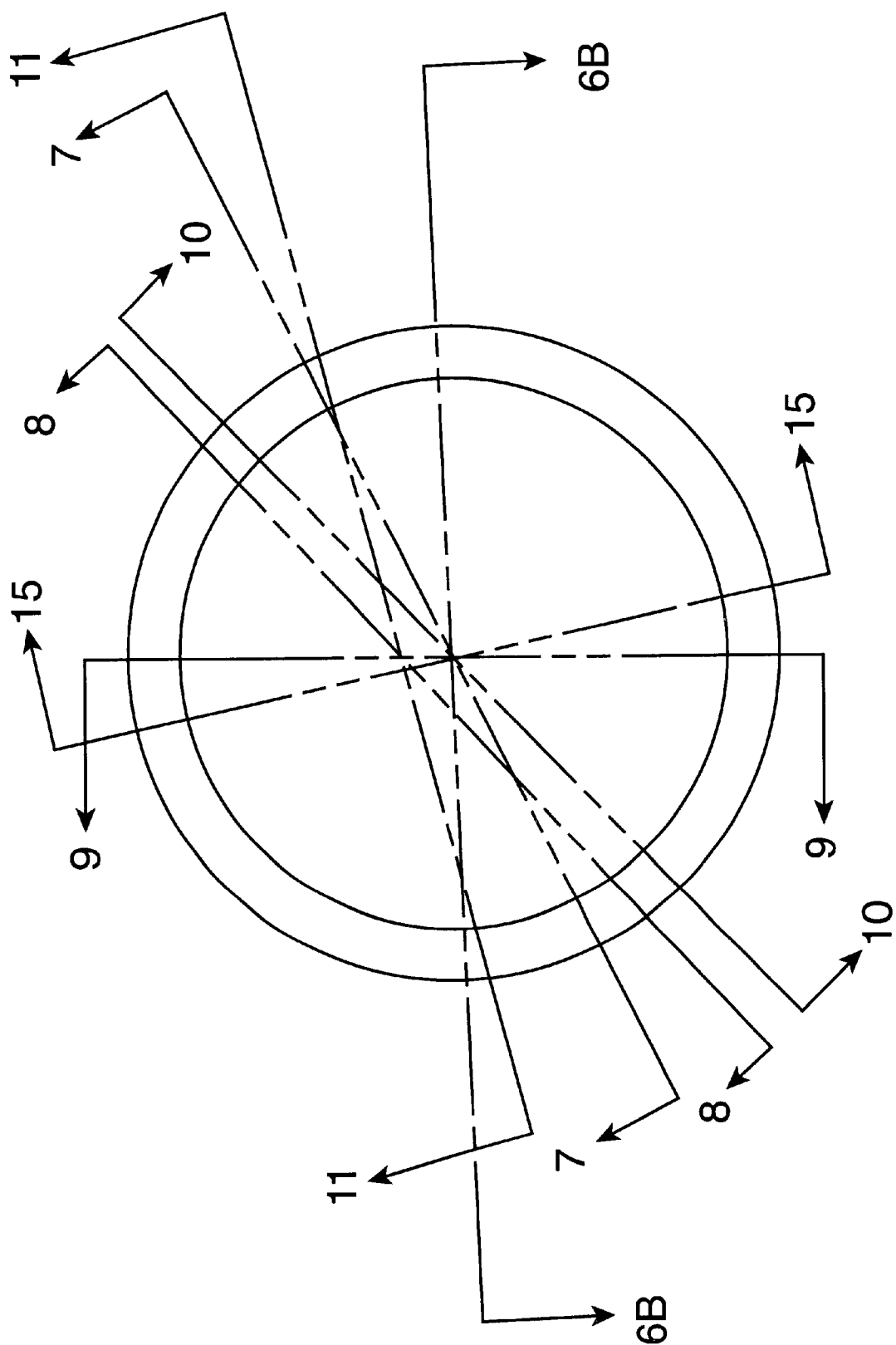
FIG. 6A is a plan view of the wafer carrier, showing various lines at which sections are taken to illustrate internal structure.
Figure 6B:
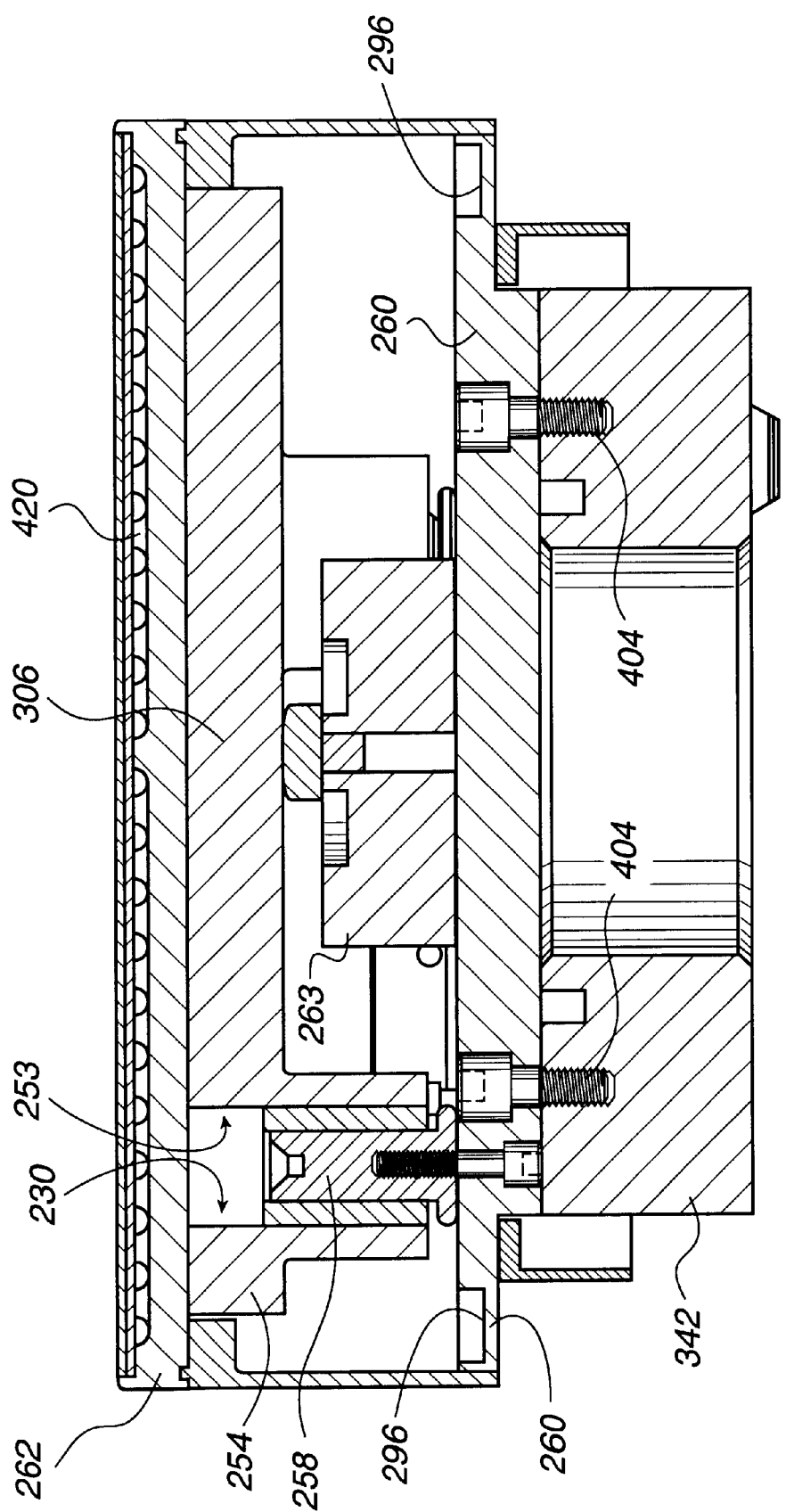
FIG. 6B is a cross sectional elevational view taken on line 6B—6B in FIG. 6A showing the main bearing housing assembled fixedly with a chuck bearing and load cell plate, showing bearing shafts of the plate in cylindrical linear bearings on the housing, and a center of the main housing pressing on a load sensor button of a load cell.

The structure 232 is resistant to all except a vertical component FP-RV of this eccentric force FP-R applied to the retainer ring 282. In detail, the set 270 of three bearings linear bearings 273 assures that structure of the retainer ring 282 is not allowed to move in an undesired manner in response to such an eccentric force FP-R. Thus, the linear bearings 272 assure that such eccentric force FP-R does not move such retainer ring 282, except as follows. The retainer ring 282 is permitted to move vertically, parallel to the initial third orientation of the central axis 212 of the respective wafer carrier 208, which are coaxial. As a result, the eccentric load FP-R (shown in FIG. 2B acting on the retainer ring 282), minus the force FF relating to the structure 232, is transferred to the retainer ring bearing plate 279 as the permitted vertical force component FP-RV. Referring to FIGS. 2A and 6B, for example, it may be understood that the motion of the retainer ring 282 that is limited by the structure 232 is independent of the motion of the wafer carrier 208 that is limited by the structure 230.

A linear motor 290 is mounted between the chuck bearing and load cell plate 260 and the retainer ring bearing plate 279. The linear motor 290 may preferably be provided in the form of a sealed cavity, or more preferably in the form of a pneumatic motor or an electromechanical unit. A most preferred linear motor 290 is shown in FIGS. 5A-1, 5B-1, 7, 12A, 13A and 14A including a pneumatic bladder 292 supplied with pneumatic fluid (see arrow 293) through an inlet 294. As shown in FIGS. 5B-1 and 13A the chuck bearing and load cell plate 260 is provided with an annular groove 296 for receiving the bladder 292. The linear motor 290 is selectively actuated by supplying the fluid 293 to the bladder 292 at different amounts of pressure (PB) according to the amount of a desired stroke of the bladder 292. For example, referring to FIGS. 12A and 12B, a maximum stroke of the bladder 292 may be 0.10 inches measured vertically. Such maximum stroke compares to a vertical dimension (or thickness) of the wafer206, which may be 0.02 inches. For purposes of description, the plate 260 may be said to be fixed in the vertical direction, such that when the fluid 293 is admitted into the bladder 292 the bladder will urge the plate 279 upwardly by a distance corresponding to the particular stroke of the bladder 292 resulting from the pressure of the fluid 293. The bladder 292 will thus move the retainer ring bearing plate 279, and thus the retainer ring base 280 and the retainer ring 282, up (in this example) relative to the wafer 206 positioned on the vacuum chuck 262.

Figure 13B:
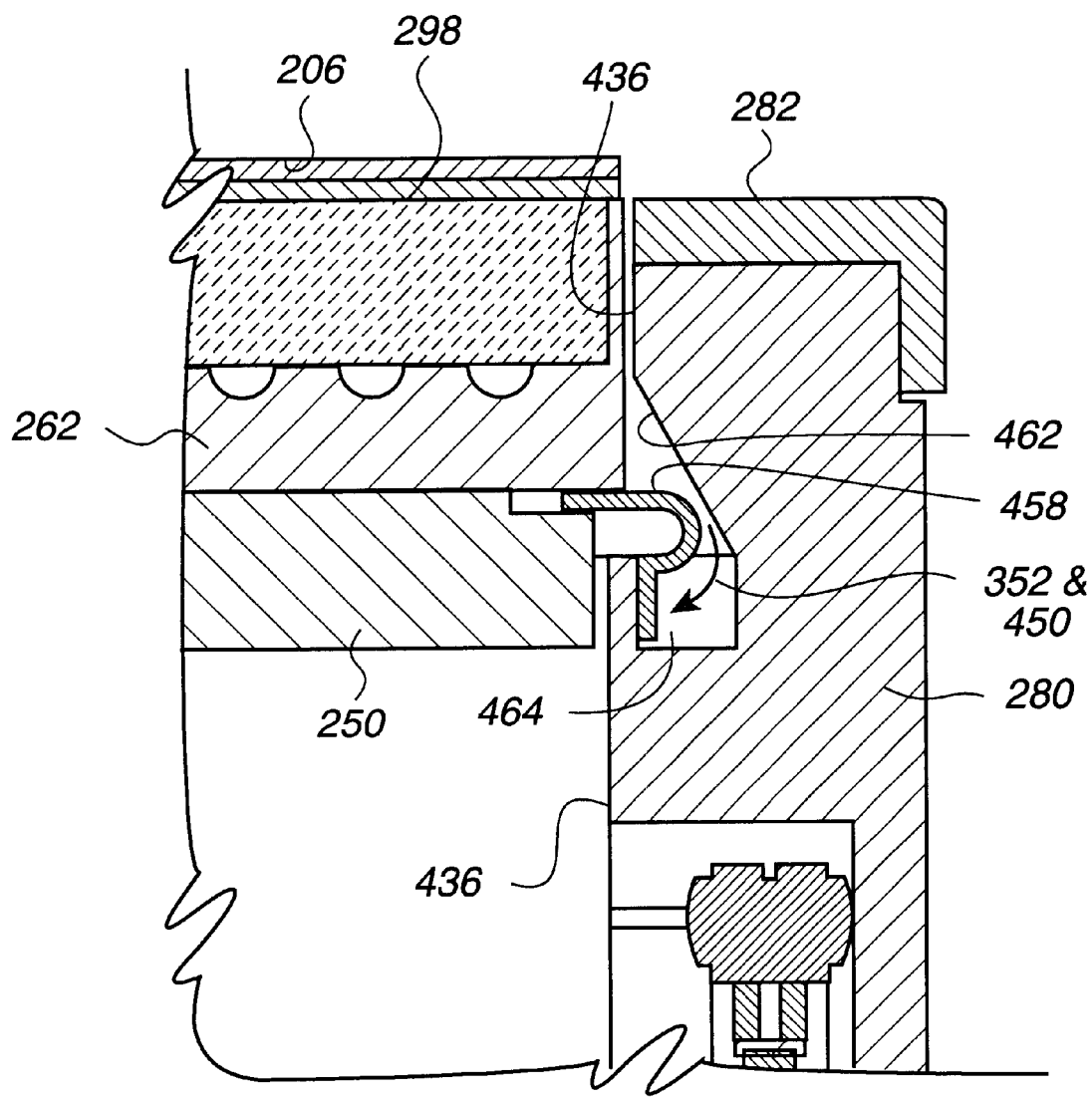
FIG. 13B is a further enlarged portion of FIG. 13A.

The pressure PB of the fluid 293 may be one of many pressures, for example. In a general, preliminary sense, the fluid 293 under pressure is used to move the retainer ring 282 into one of three vertical positions. The pressure PB may be in a range of from about 15 psi. to about seven to ten psi, for example. FIGS. 13A and 13B are cross sections showing the retainer ring 282 in one of the three positions, a disengaged position, in which the retainer ring 282 is away from (below) both the wafer 206 and a carrier film 298 mounted on the vacuum chuck 262. In the disengaged position, the retainer ring 282 does not interfere with removal of the wafer 206 from the chuck 262, and the pressure PB is low relative to the pressure PB required to position the retainer ring 282 in the other positions.

Figure 14A:
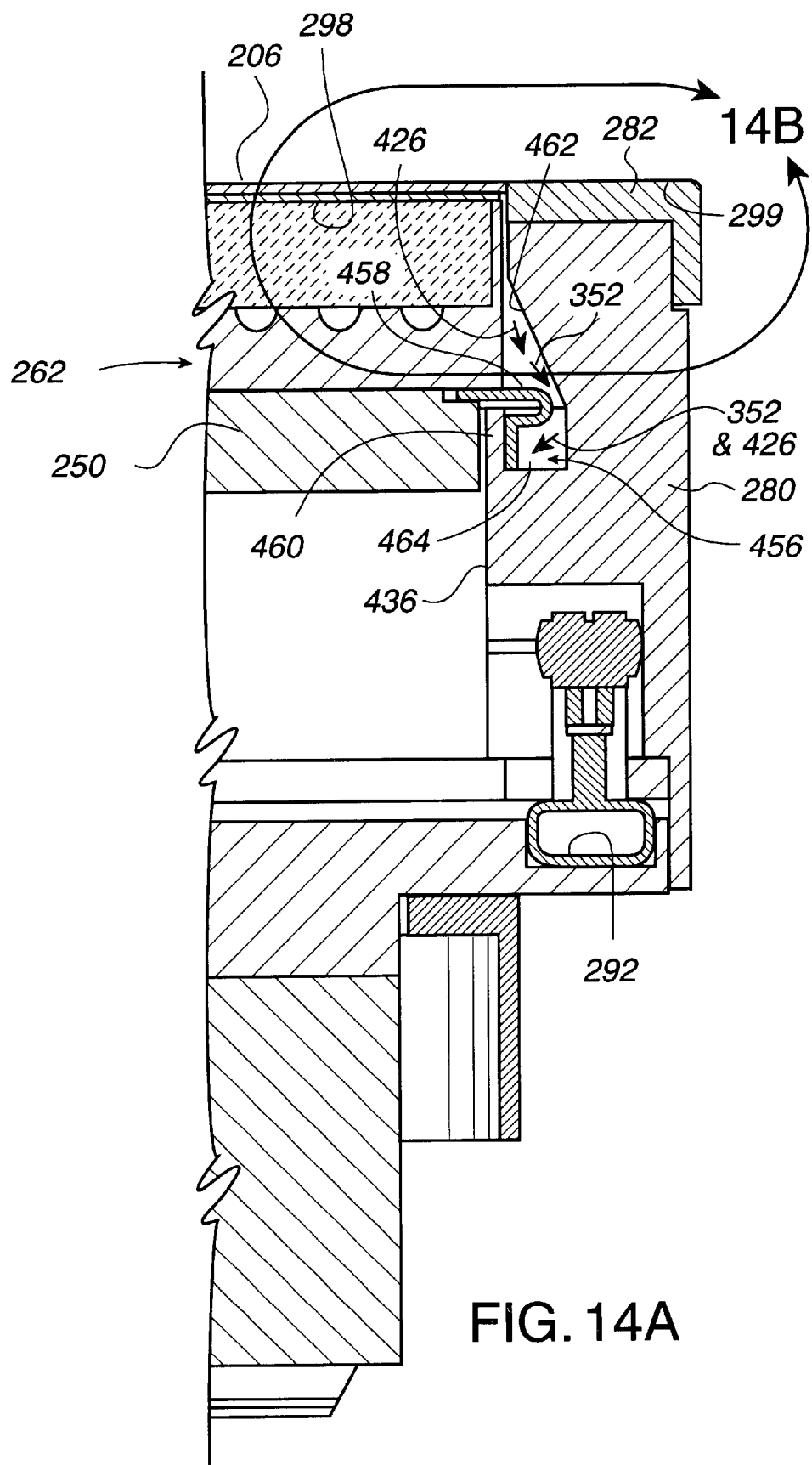
Figure 14B:
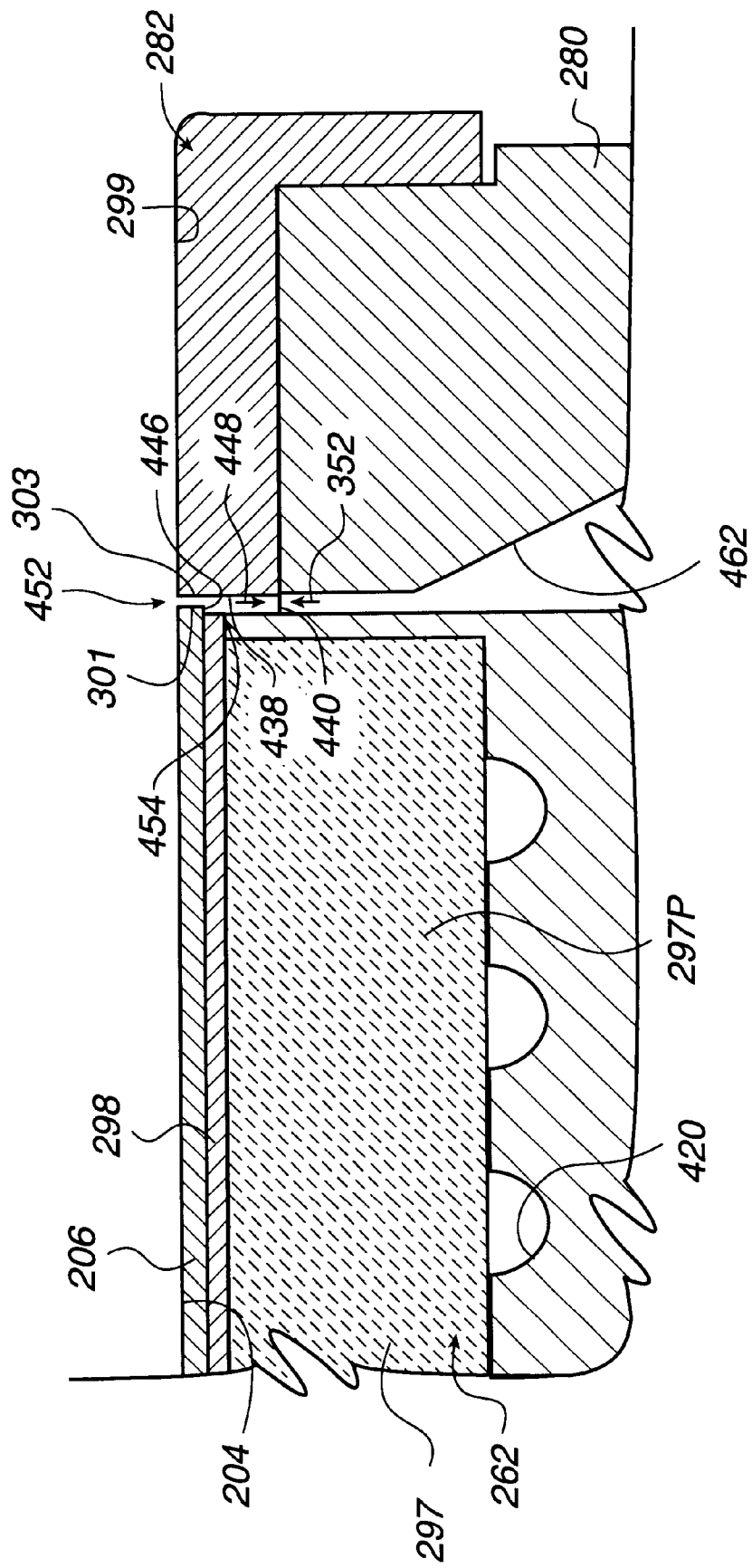
FIG. 14B is a further enlarged portion of FIG. 14A.

The cross-sections shown in FIGS. 14A and 14B depict a next higher one of the three positions of the retainer ring, which is referred to generally as "a" polishing position, and as described below in detail, may be a range of positions parallel to the axes 214 and 212. The general polishing position is the position of the ring 282 during polishing of the wafer 206. In this polishing position, an upper surface 299 of the retainer ring 282 is horizontally aligned with, or coplanar with, the upper (exposed) surface 204 of the wafer 206. As shown in FIG. 14B, in the polishing position, a peripheral edge 301 of the wafer 206 is surrounded by an inner wall 303 of the retainer ring 282, and the surfaces 299 and 204 are coplanar.

Figure 12B:
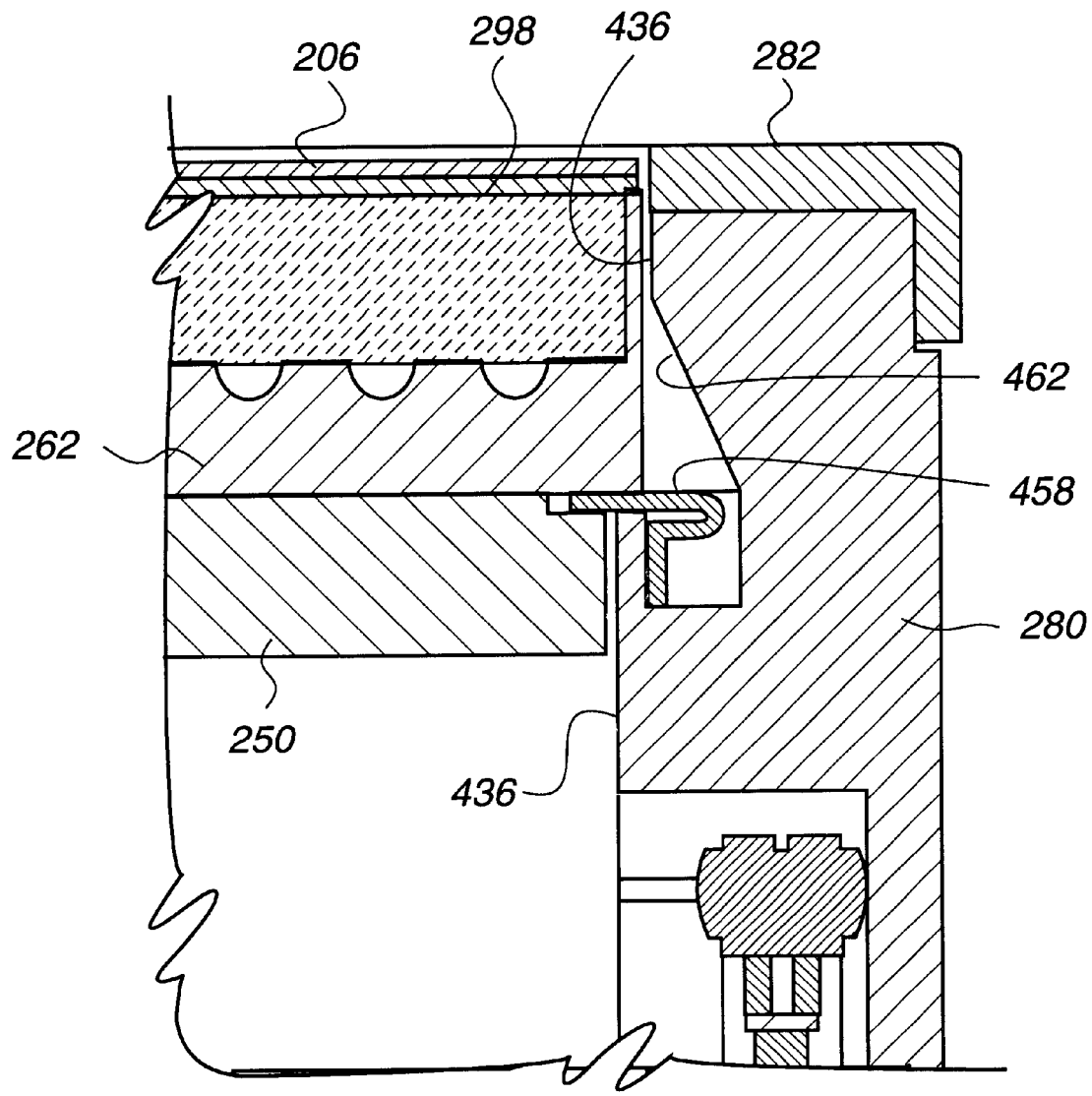
FIG. 12B is a further enlarged portion of FIG. 12A.

As noted, thirdly, FIGS. 12A and 12B show a cross section in which the retainer ring 282 is in a maximum up, or wafer-capture, position suitable for locating the wafer 206 on the carrier film 298 of the vacuum chuck 262 with the axis 214 of the wafer 206 coaxial with the axis 212 of the wafer carrier 208. As shown in FIG. 12B, in the maximum up position, the peripheral edge 301 of the wafer 206 remains surrounded by the inner wall 303 of the retainer ring 282 and the upper surface 299 of the retainer ring 2882 is above the exposed surface 204 of the wafer 206 to facilitate ease of placing the wafer 206 on the chuck 262 within the retainer ring 282.

In more detail, the ring load force FP-R acts eccentrically on the retainer ring 282 and tends to move the ring 282 eccentrically. However, the linear bearings 272 assure that the movements of the retainer ring 282 and of the base 280 are only vertical, parallel to the initial orientations of the respective central axes 286 and 288 of the respective retainer ring base 280 and retainer ring 282. As a result, only the vertical, downwardly acting component FP-RV of the force FP-R (the component FP-RV being shown in FIG. 2A as a ring load acting vertically on the retainer ring 282) is transferred through the retainer ring base 280 to the retainer ring bearing plate 279. Also, the linear motor 290 applies an upward force FM (FIG. 2A) to the retainer ring bearing plate 279 that supports the shafts 278 of the linear bearings 272. The linear bearings 272 also assure that only a vertical component force, or net force, FM-V of the force FM is effective to move the retainer ring base 280 and the retainer ring 282 against the vertical component FP-RV of the ring load force FP-R. In this manner, the permitted movement of the retainer ring 282 in response to the force FP-W (i.e., movement parallel to the initial position of the axis 212 and 214) is coaxial with (and thus in the same direction as) the permitted movement of the chuck 262 and the wafer 206 on the chuck 262 in response to the force FP-W (i.e., the direction parallel to the initial position of the axis 212 and 214).

As to the noted range of polishing positions of the retainer ring 282, due to the above-described need to vary the upward force F (FIG. 1B) applied to the wafer carrier 208 (according to the area of the exposed and contacted region 204R), it may be understood that it is also necessary to vary the force FM applied to the retainer ring 282, which will vary the net force FM-V applied to the polishing pad 209. For example, as shown in FIGS. 1A and 1B, as the polishing head 202 moves from a far leftward location not overlapping the retainer ring 282, and moves to the right and gradually overlaps the retainer ring 282, there is only a small initial area of the retainer ring 282 overlapped by the polishing head 202. As the overlapped area varies with such motion 209H, to keep the polishing pressure constant on the area of the retainer ring 282 contacted by the polishing pad 209, and for example on the contacted areas of the exposed region 204R that are adjacent to the retainer ring 282, the force FM-V must be varied. As a result, the above-described polishing position of the retainer ring 282 is in detail a range of positions determined according to what force FM-V must be applied by the retainer ring 282 to the pad 209 in order to keep the polishing pressure constant.

Figure 19A:
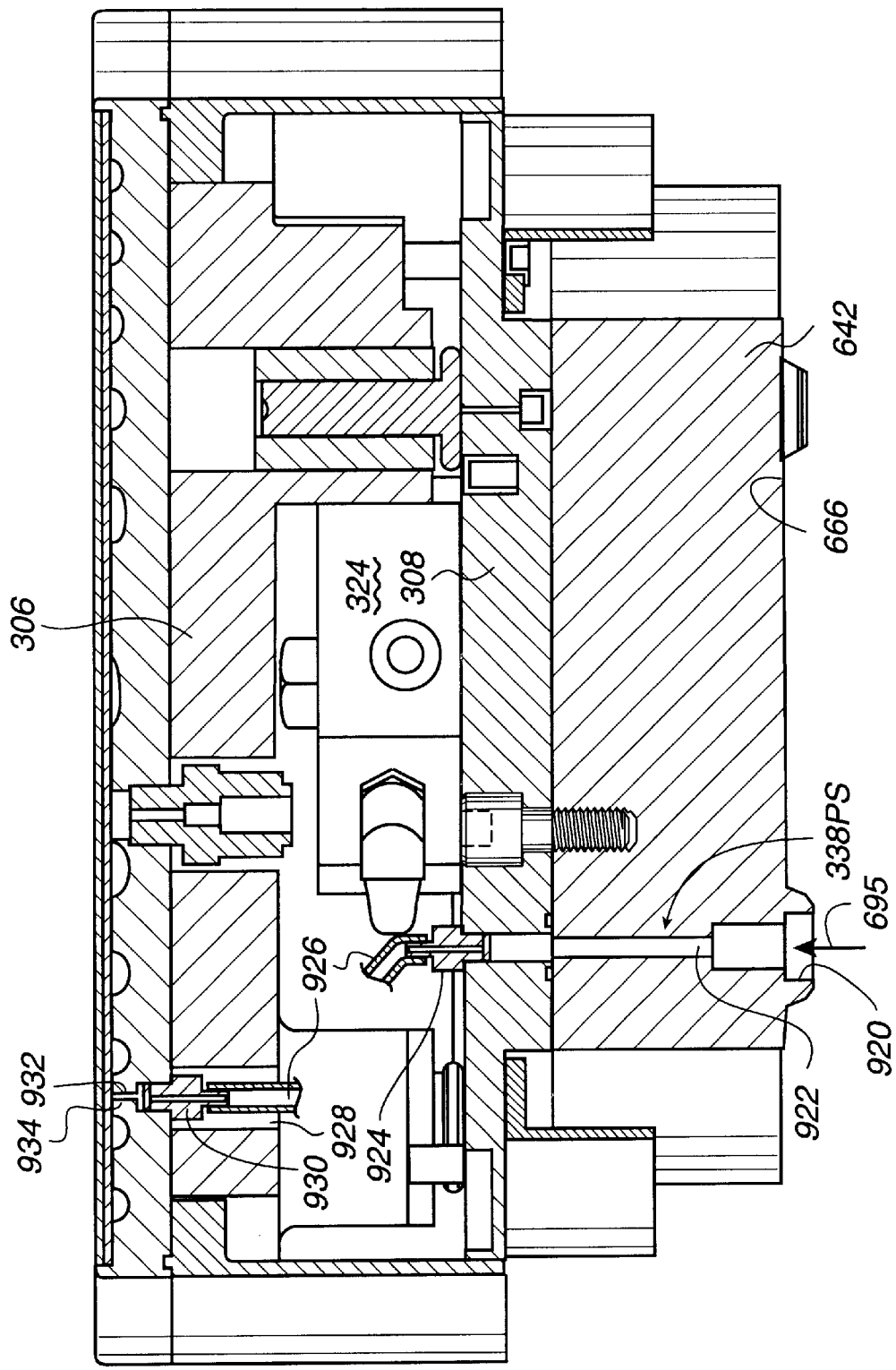
FIG. 19A is a cross section taken along lines 19A—19A in FIG. 18, showing a vacuum conduit to a chuck for determining whether the puck is properly on the chuck.
Figure 19B:
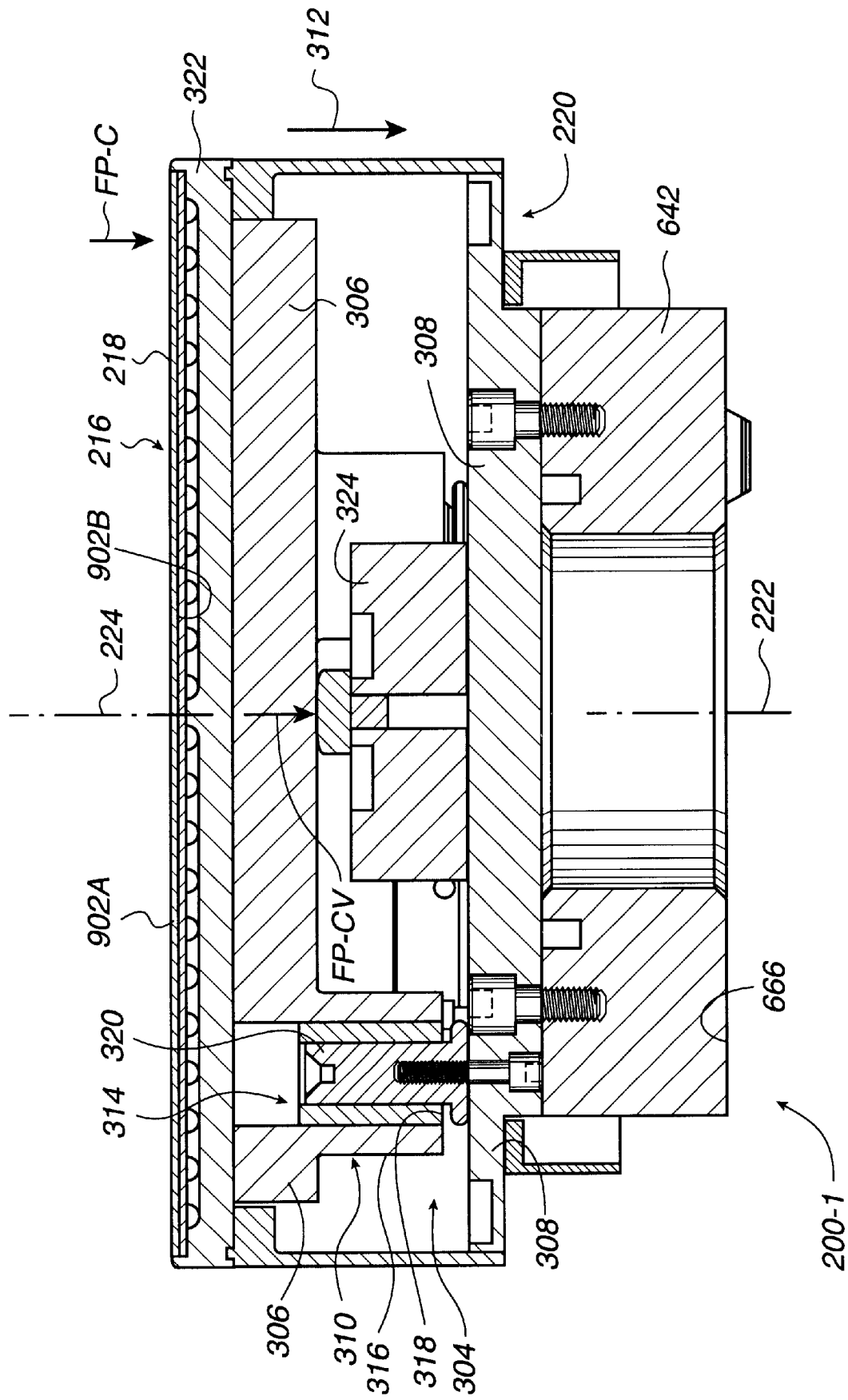
FIG. 19B is a cross section taken along lines 19B—19B in FIG. 18, showing a linear bearing used with the chuck.
Figure 20:
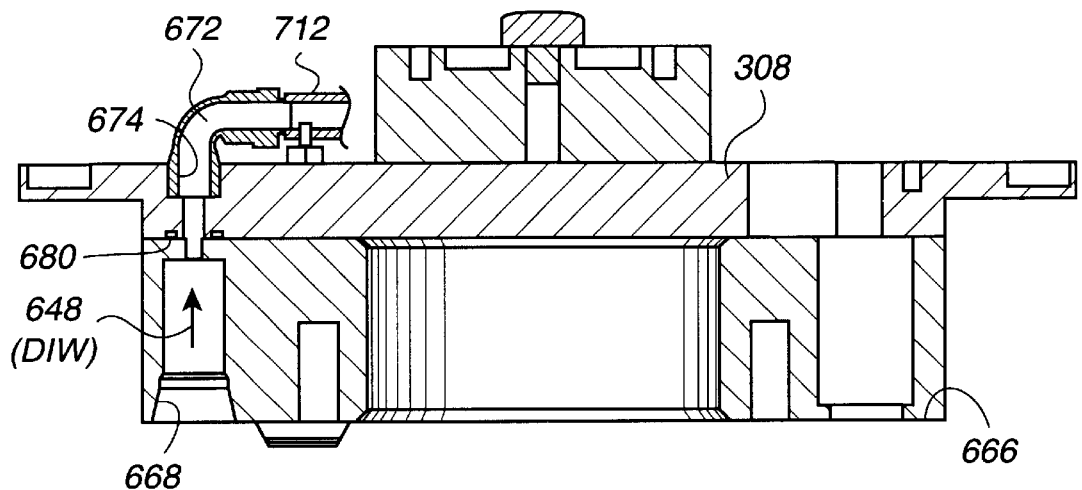
FIG. 20 is a cross section taken along lines 20—20 in FIG. 18, showing a conduit for supplying DI water for purging the puck on the chuck.

FIGS. 2B and 19B show the pad conditioning head 220, illustrating a linear bearing assembly 304 for limiting the direction of relative movement between a main bearing housing 306 and a puck bearing and load cell plate 308. It is recalled that in the exemplary situation, the polishing head 202 is designed to rotate on the axis 210 that is vertical. The CMP system 200-1 includes additional multiple linear bearing structures 310 of the pad conditioning head 220. Generally, the structures 310 are similar to the structures 230. Thus, the structures 310 function in the same manner as the above-described functioning of the structure 230. In more detail, the structure 310 facilitates making repeatable measurements of the eccentric forces FP-C. Thus, the force FP-C applied to the puck 218 and the carrier or head 220 may be accurately measured, as defined above, even though such force FP-C is eccentrically applied to such puck 218 and head 220. The structure 310 therefore enables the providing of the above defined accurate indication of an amount of such eccentric force FP-C.

In more detail, the structures 310 are resistant to all except a vertical component FP-CV of the force FP-C applied to the puck 218 at the location that is eccentric with respect to the initial orientation of the central axis 222 of the pad conditioning head 220. In this manner, the linear bearing structures 310 assure that the structure of the head 220 is not allowed to move in an undesired manner in response to such an eccentric force FP-C. For example, the head 220 and the puck 218 are permitted to move only parallel (see arrow 312) to the initial orientations of those respective central axes 222 and 224, which are coaxial. The arrow 312 is parallel to the vertical component FP-CV.

FIG. 2B schematically depicts two of three of the multiple linear bearing structures 310 in more detail, and FIGS. 16A, 16B, and 19B show the three multiple linear bearings 310 in more detail. The main bearing housing 306 is provided with three linear bearings 314, including three hollow cylindrical sleeves 316. The sleeves 316 have an open bottom 318 to receive and allow the sleeves 316 to cooperate with respective shafts 320. The sleeves 316 of the linear bearings 314 may be the same Model Number FL08 sold by Pacific Bearing, of Rockford, Ill. as in the bearings 230 and 232, for example, and are depicted in FIG. 2B in a manner similar to that shown in FIG. 2A. The shafts 320 may be made in the same manner as described above with respect to the shafts 258. The main bearing housing 306 is fixed to, and carries, a chuck 322 of the pad conditioning head 220. The chuck 322 carries the puck 218, which during contact with the polishing head 202 is subjected to the eccentric force FP-C, indicated in FIG. 2B as a puck load imposed on the puck 218.

As described above, FIG. 1B shows the initial orientation of the pad conditioning head 220 and the puck 218 before the pad 209 of the polishing head 202 engages the exposed surface 216 of the puck 218, i.e., at the initial time T0PP. Thus, there is initially no force FP-C applied by the pad 209 on the puck 218, and initially the respective axes 222 of the head 220 and 224 of the puck 218 are vertical in the exemplary situation. It is recalled that in such situation, the polishing head 202 is designed to rotate on the axis 210 that is vertical, and at any of the times T1 described above may apply the eccentric force FP-C (FIG. 2B) vertically downwardly on the puck 218 and the head 220. The structure 310 is resistant to all except the vertical component FP-CV of this eccentric force FP-C applied to the head 220 and to the puck 218. In detail, the three linear bearings 314 assure that structure of the head 220 is not allowed to move in an undesired manner in response to such an eccentric force FP-C. Thus, the linear bearings 314 assure that such eccentric force FP-C does not move such head 220 nor the puck 218 except vertically, which is parallel to the initial orientations of the respective central axes 222 and 224 of the respective head 220 and puck 218. As a result, the eccentric wafer load FP-C (shown in FIG. 2B acting on the puck 218), minus a corresponding force FF, is transferred to the main bearing housing 306 as the vertical component force, or net force, FP-CV and acts on a load cell 324 (FIGS. 2B, 16B, and 19B. The load cell is secured to the puck bearing and load cell plate 308. The permitted movement of the main bearing housing 306 is sensed by, or actuates, the load cell 324, which outputs a puck load signal 326 (FIG. 16B). The load cell 324 may be the same as the load cell 263 and the load cell signal 326 may be used in a manner similar to that of the load cell signal 264.

In view of the above discussion, it is to be understood that a tendency of the chuck 262 or of the wafer carrier 208, or of the pad conditioning head 220, to tilt, or to move out of the described initial orientation, is only a tendency, i.e., an action not taken. The action of tilting is not taken because of the above-described operation of the linear bearing structures 230, 232, and 310 for example.

Figure 3A:
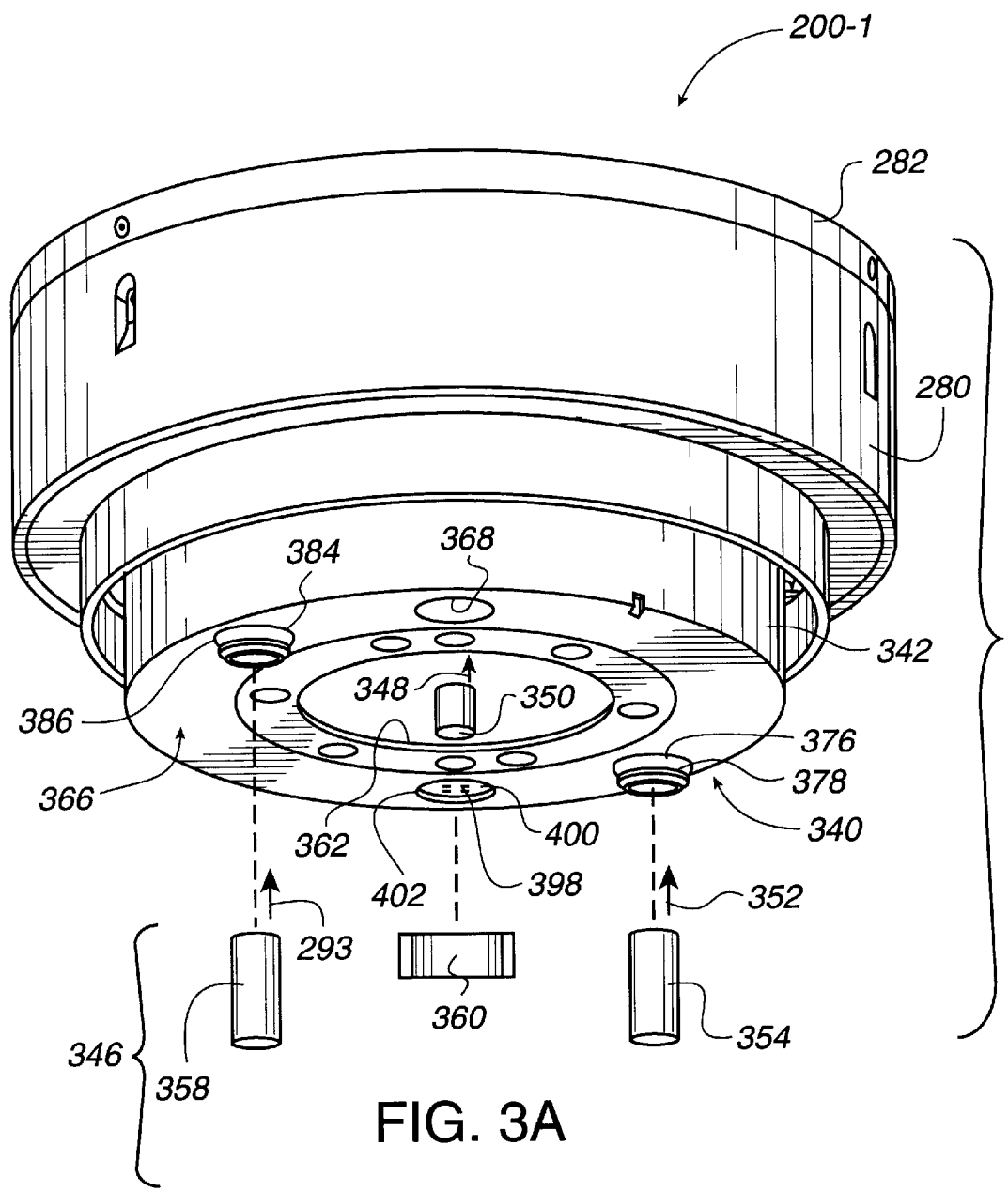
FIG. 3A is a three dimensional schematic view showing the structural elements of the wafer carrier of the first embodiment, illustrating the bottom of an upper section of a rotary tool changer (RTC)
Figure 3B:
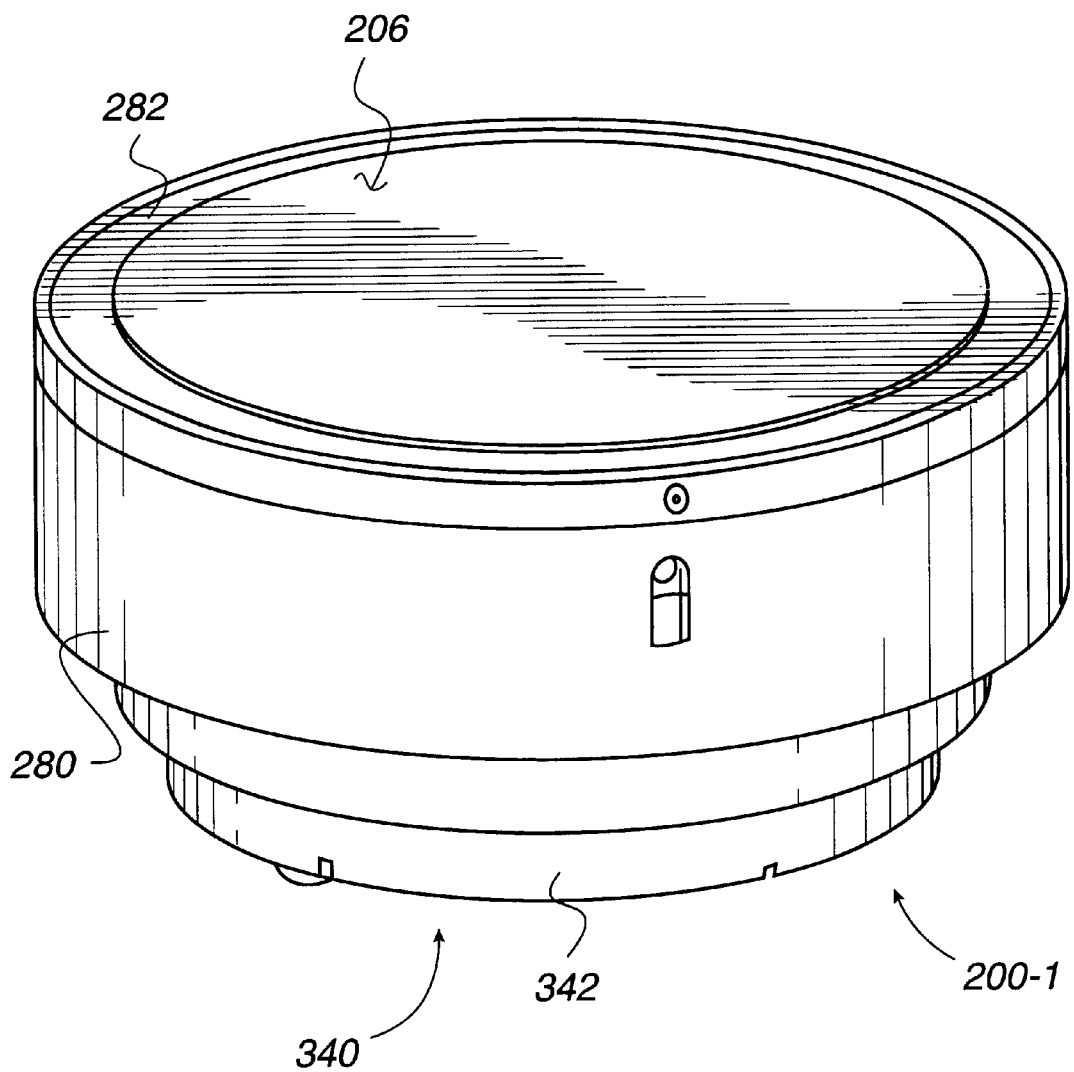
FIG. 3B is a three dimensional schematic view showing the structural elements of the wafer carrier of the first embodiment, illustrating the top of a vacuum chuck of the wafer carrier.
Figure 3C:
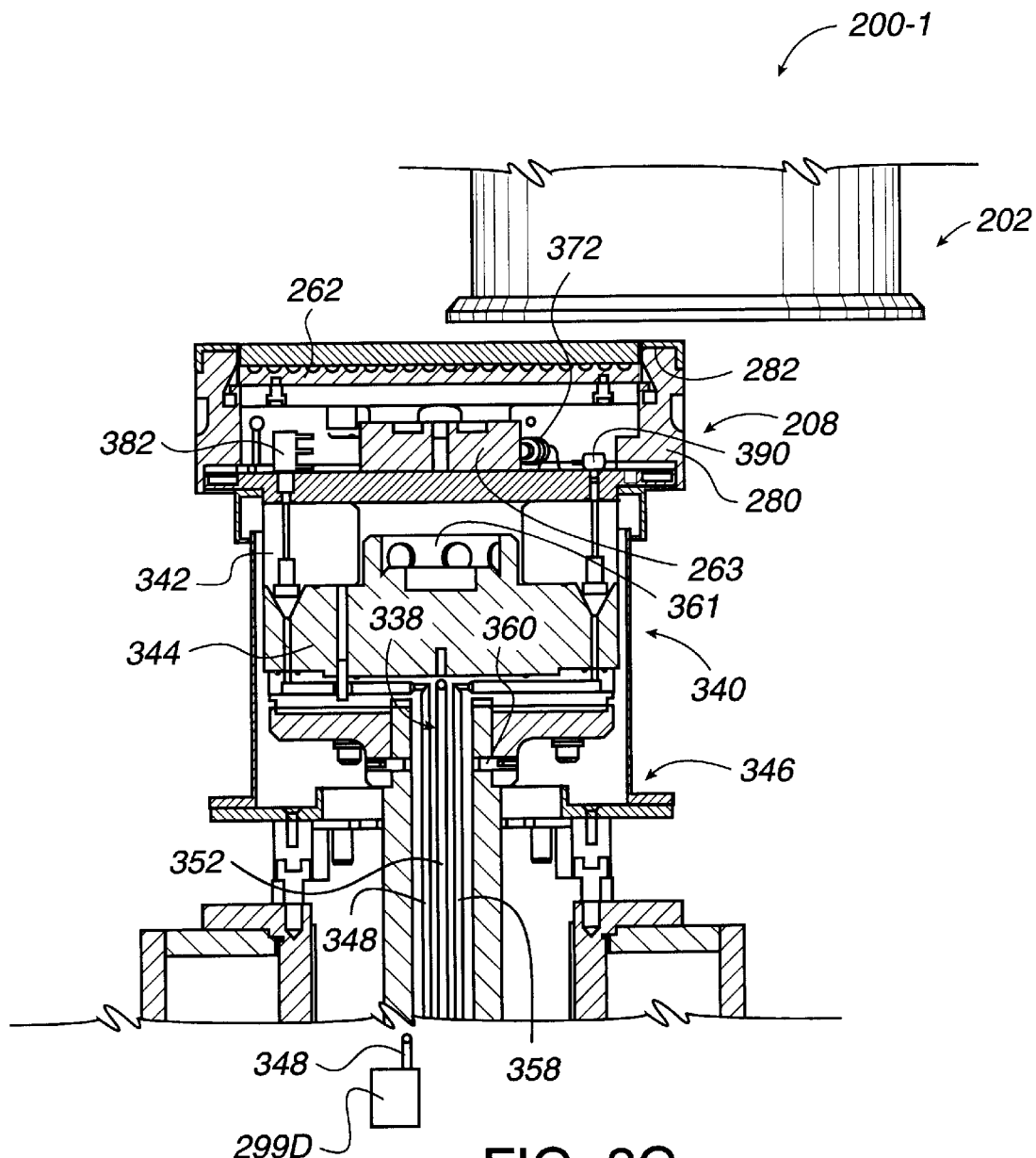
FIG. 3C is a schematic view of the wafer carrier, showing in dashed lines a spindle for supporting and supplying facilities to the carrier head, and a polishing head.

The CMP system 200-1 is not only provided with the above-described features that facilitate making repeatable measurements of the eccentric forces FP-W, for example, but is also provided with facilities (generally referred to using the reference number 338) for other CMP operations. The facilities 338 of the wafer carrier 208, for example, include facilities 338C for the vacuum chuck 262; facilities 338B for the bladder 292; facilities 338S for the retainer ring 282; and facilities 338 LC for the load cell 263. Such facilities 338 are provided for the CMP operations without interfering with the CMP operations. Considering these facilities 338 of the wafer carrier 208, reference is made to the three dimensional views of FIGS. 3A, 3B, and 3C and to the exploded views of FIGS. 4A and 4B, and to the enlarged perspective views of FIGS. 5A-1 through 5A-3 and FIGS. 5B-1 through 5B-3. FIGS. 3A through 3C show assemblies of structural elements of the first embodiment 200-1, including a rotary tool changer 340 to which the chuck bearing and load cell plate 260 is secured. The rotary tool changer 340 includes an upper section 342 and a lower section 344 (FIG. 3C). The lower section 344 is attached to a spindle 346 that rotates and applies vertical forces in up and down directions to the lower section 344. The upward vertical force is shown as forces F in FIG. 1B and result in the force that the polishing pad 209 resists in applying the force FP-W, for example. As shown in FIGS. 3A and 3C, the spindle 346 also provides the facilities 338C by supplying fluid, such as de-ionized water (DI water) 348 and vacuum, through a conduit 350 to the lower section 344 for use in the vacuum chuck 262. Additionally, the spindle 346 separately provides the facilities 338S by supplying fluid such as DI water 352 through a conduit 354 to the lower section 344 for cleaning the wafer 206 and the inside of the retainer ring base 280. Also, the spindle 346 separately provides the facilities 338B by supplying the fluid 293 (such as air under pressure) through a conduit 358 to the lower section 344 for operating the linear motor 290. The spindle 346 also provides the facilities 338LC by providing a slip ring 360 that connects with an electrical connector (not shown) on the lower section 344. The connector on the lower section 344 mates with a connector (not shown) to enable output of the wafer load cell signal 264 from the system 200-1.

The lower section 344 and the upper section 342 mate in a standard manner by way of a releasable connector 361 (FIG. 3C). To releasably join the sections 342 and 344, the connector 361 has a can (not shown) driven by a piston rod (not shown) from the lower section 344 into a hollow center 362 of the upper section 342. The cam engages ball bearings (not shown) and urges the ball bearings outwardly and partially from a race (not shown) and partially into a V-shaped groove (not shown). The ball bearings releasably hold the upper section 342 and the and lower section 344 tightly joined. When it is desired to separate the upper and lower sections 342 and 344, the cam is retracted from the upper section 342 to allow the ball bearing to fully exit the V-shaped groove and release the upper section 342.

Figure 9:
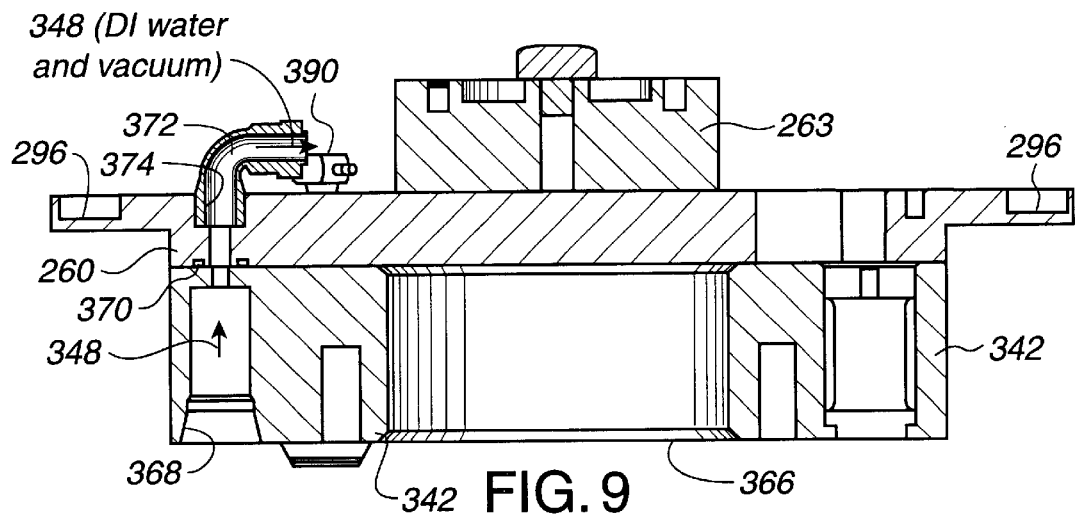
FIG. 9 is a cross section taken along line 9—9 in FIG. 6A through a fluid connector, wherein the connector supplies DI water and vacuum to the vacuum chuck.

FIGS. 3A and 9 show the bottom 366 of the upper section 342. Four ports in the upper section 342 are provided for the facilities 338. A first port 368 mates with a similar port (not shown) of the lower section 344 to supply the DI water and vacuum (see arrow 348). The port 368 receives a standard conical seal that extends from the similar port of the lower section 344. The DI water 348 flows, and the vacuum 348 is applied, through the port 368, past an O-ring 370 shown in FIG. 5A-1 to a nozzle 372 shown in FIG. 5B-1 threaded into a threaded port 374 of the plate 260.

Figure 10:
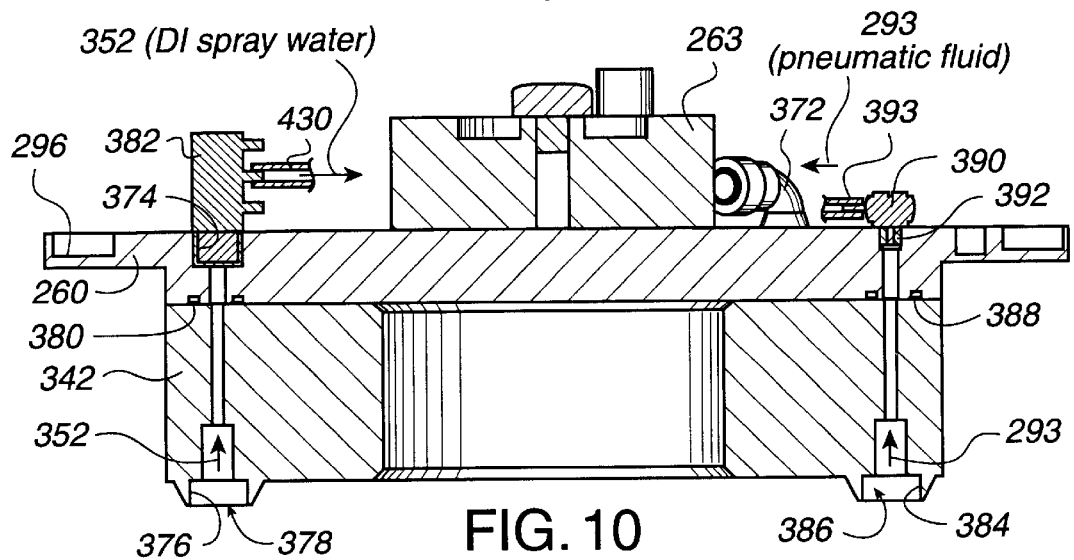
FIG. 10 is a cross section taken along line 10—10 in FIG. 6A through a fluid manifold and load cell plate, illustrating one of six DI water conduits from the manifold to six separate nozzles in a retaining ring base for supplying DI wafer wash water.
Figure 11:
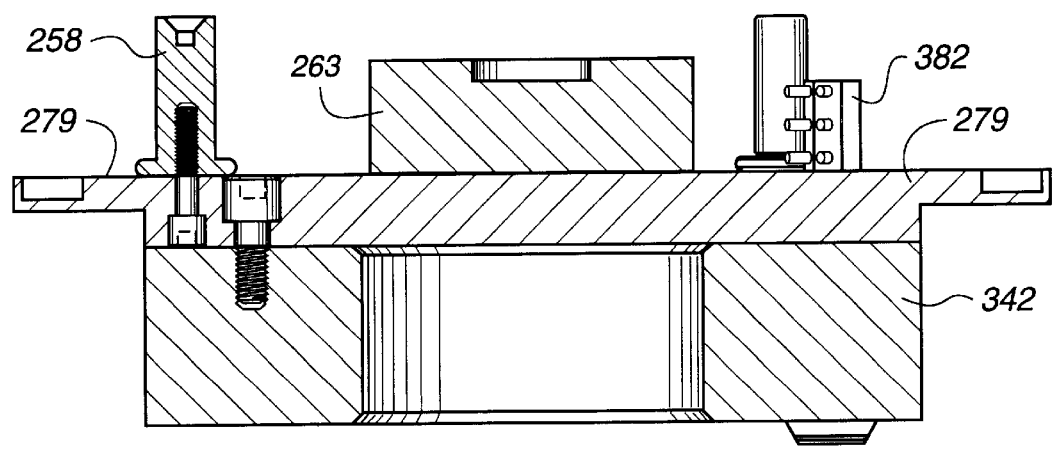
FIG. 11 is a cross sectional side elevational view of the chuck bearing and load cell plate illustrating the plate assembled by screws to an upper section of the RTC.

FIGS. 3A and 10 show a second port 376 that mates with a similar port (not shown) of the lower section 344 to supply the DI water (see arrow 352). The port 376 has a seal 378 mating with a standard conical seal (not shown) that extends from the similar port of the lower section 344. The DI water 352 flows through the port 376, past an O-ring 380 shown in FIG. 5A-2 to a six-outlet manifold nozzle 382 shown in FIGS. 5B-2 and 10. The nozzle 382 is threaded into a threaded port 374 of the plate 260.

FIGS. 3A, 5B-2, and 10 show a third port 384 that mates with a similar port (not shown) of the lower section 344 to supply the air (see arrow 293). The port 384 has a seal 386 mating with a standard conical seal (not shown) that extends from the similar port of the lower section 344. The air (see arrow 293) flows through the port 384, past an O-ring 388 shown in FIG. 10 to a single outlet fluid connector 390. The connector 390 is threaded into a threaded port 392 of the plate 260, and via a conduit 393 is connected to the inlet 294 of the bladder 292.

The slip ring 360 on the spindle 346 is connected through the connector (not shown) on the lower section 344 which mates with a pogo pin connector received in a port in the lower section 344. The pogo pins extend upwardly into resiliently biased contact with electrical contacts 398 (FIG. 3A) of a connector 400 provided in a port 402 of the upper section 342. The port 402 has a shoulder (not shown) against which the connector 400 is urged when the plate 260 is connected to the upper section 342, as by six screws 404. The port 402 is aligned with a keyhole-shaped port 406 shown in FIG. 5A-1 as being provided in the plate 260. The port 406 is large enough to pass the connector 400 (to permit the connector 400 to move into the port 402). A conductor 408 extends from the connector 400 through the port 406 to a load cell amplifier 410 shown in FIG. 4A secured to the plate 260. The amplifier 410 is connected to the load cell 263 and receives the wafer load cell signal 264.

Figures 2, 5A:
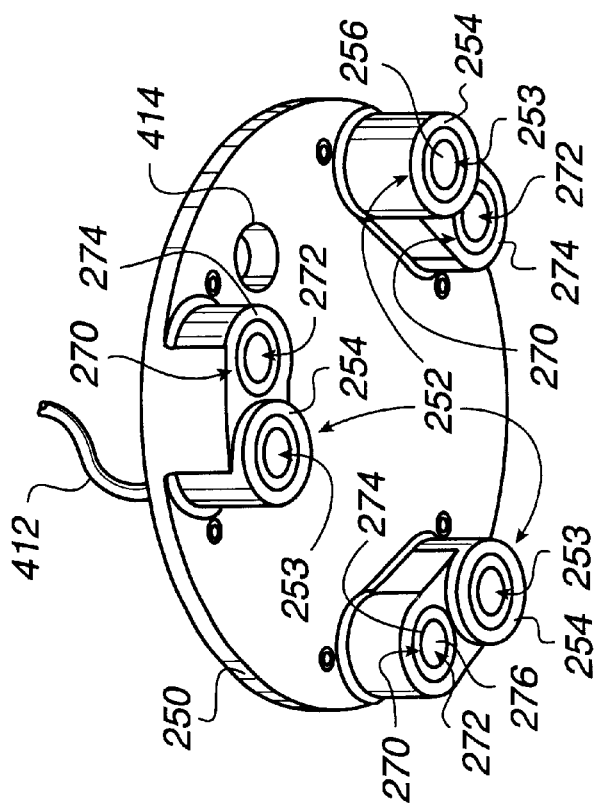
Figures 3, 5B:
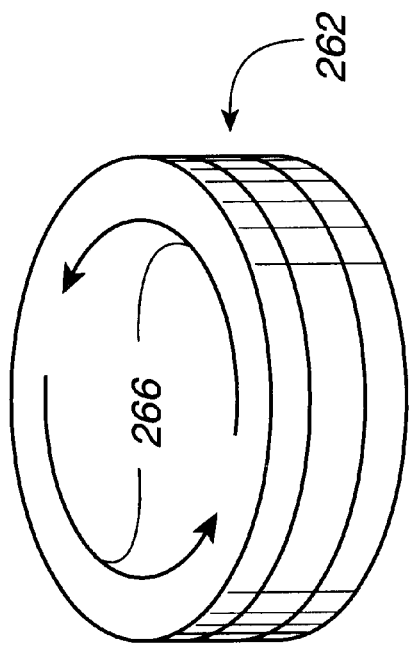
Figures 3, 5A:
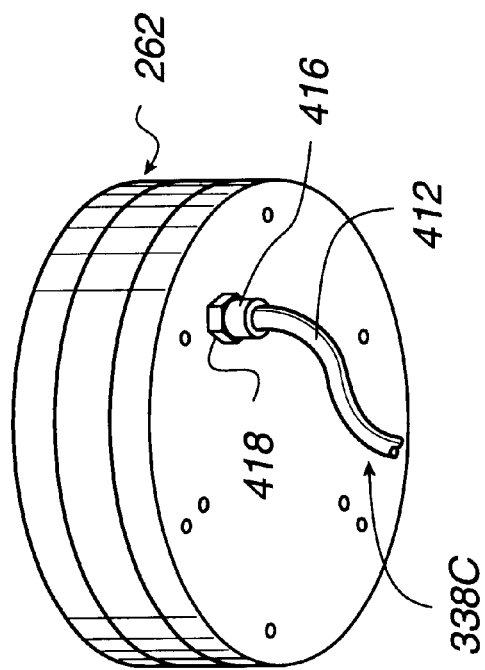

FIG. 5A-3 shows the facilities 338C in the form of tubing 412 that is connected to the nozzle 372 (FIG. 5B-1) that is mounted on the chuck bearing and load cell plate 260. The tubing 412 extends upwardly through a through-hole 414 in the main bearing housing 250 shown in FIG. 5A-2 and extends to a push-to-connect tubing connector 416 shown in FIG. 4B. The connector 416 is threaded into a port 418 drilled into the chuck 262. The port 418 supplies the vacuum or the DI water 348 to a manifold 420 (FIG. 15) of the chuck 262 to evenly distribute the vacuum or the DI water 348 across an upper surface 422 of the chuck 262.

A porous layer 297 is mounted on the upper surface 422. The layer 297 is fabricated from porous ceramic material having relatively large pores 297P (FIG. 7). The relatively large pores 297P provide passageways through which the DI water 348 flows or the vacuum 348 is applied from the manifold 420. The large pores 297P are located uniformly across the entire area of the vacuum chuck 262 and thus apply the vacuum from the manifold 420 across the entire area of the chuck 262. Similarly, the large pores 297P supply the DI water 348 all across the area of the chuck 262. Further, the large size pores 279P are not so large that the application of the vacuum 348 will deform the wafer 206 as in the prior use of relatively few (e.g., six) vacuum holes in direct contact with the wafers 206. For all of these purposes, the pores 297P may preferably have a large pore size, and more preferably a pore size in the range of from about twenty to about fifty microns, and most preferably about thirty to about forty microns, which is significantly greater than typical ceramics having pore sizes in the submicron range to one micron.

Figure 8:
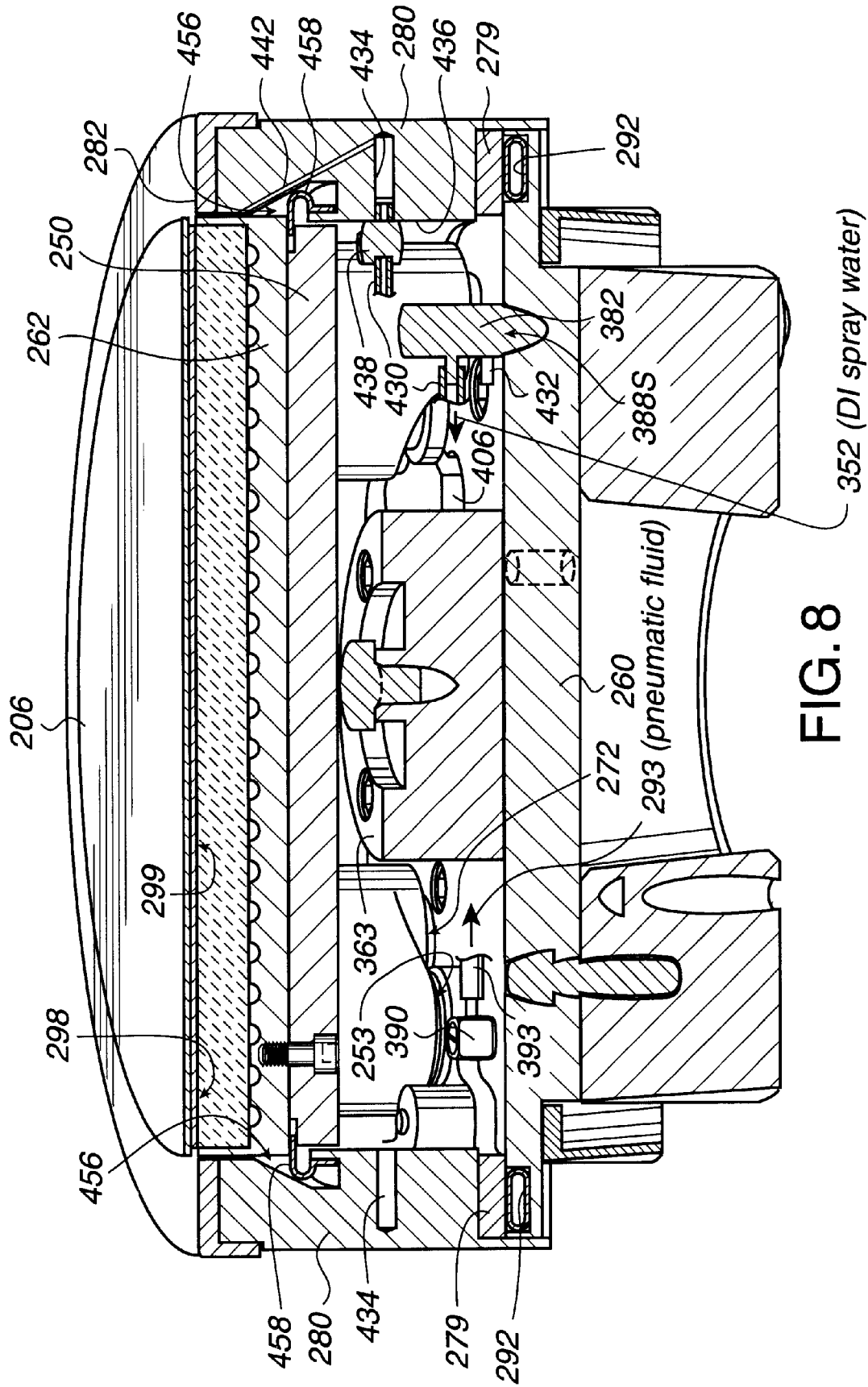
FIG. 8 is a cross section taken along line 8—8 in FIG. 6A showing facilities including various connectors that supply fluids used in the wafer polishing.

FIGS. 7 and 8 show a carrier film 298 provided on the manifold 420 and extending over an upper surface 499 of the porous layer 297 to further evenly distribute the vacuum or the DI water 348 across the area of the chuck 262. The film 298 is made from material sold under the trademark RODEL as Model Number RF 200. The film 298 is provided with cut holes or apertures having a size in a range of from 0.010 inches to 0.015 inches, for example. The layer 297 also has a porous characteristic and provides continuations of the passageways of the layer 297 through which the DI water 348 flows or the vacuum 348 is applied from the layer 297. The layer 297 and the film 298 cooperate to uniformly and finely distribute the vacuum 348 from the manifold 420 across the entire area of the chuck 262. Also, the layer 298 serves to keep particles from contacting the upper surface 422 of the vacuum chuck 262, and when washed as described below, avoids contaminating the wafers 206.

In the operation of the vacuum chuck 262, when the wafer 206 is properly mounted on the vacuum chuck 262 the axis 214 of the wafer 206 will be oriented coaxially with the axis 212 of the wafer carrier 208. To hold the wafer 206 on the carrier film 298, the vacuum 348 is applied to the third port 384 and thus to the chuck manifold 420 to reduce the pressure under the carrier film 298. The reduced pressure allows ambient pressure to force the wafer 206 against the carrier film 298. In this proper mount, the wafer 206 will block all of the passageways of the carrier film 298, thus the pores 297P of the layer 297 will have a significantly reduced flow of air therein. If the wafer 206 is tipped on the film 298, or is otherwise not positioned on the film 298 in the noted coaxial orientation, the air flow into the carrier film 298 will be measurably greater as detected by a pressure detector 299D (FIG. 3C) indicating the improper orientation.

DI water 348 is fed under pressure to the port 384 and thus to the manifold 420. The DI water 348 flows from the manifold 420 into the pores 297P of the layer 297, and from the layer 297 through the carrier film 298 and under the wafer 206. The DI water 348 eliminates the pressure differential across the wafer 206, releases the wafer 206 from the chuck 262, and cleans the outer, wafer-contacting surface of the carrier film 298. Further flow of the DI water 348 through the pores of the film 279P forces slurry 426 out of the pores 297P of the film 297 and off the film 298, cleaning the vacuum chuck 262 in preparation for polishing the next wafer 206. Such flows of the DI water 348 through the film 298 and the layer 297 avoid collection or accumulation of particles under the wafer 206 when the wafer 206 is mounted on the film 298. The DI water 348 and the removed slurry 426 flow into a central containment tub (not shown). FIGS. 5B-1 and 8 show the facilities 338S for the supply of the DI water 352 from the manifold 382. Tubing 430 is provided in six lengths, one length being connected to one of six outlets 432 of the manifold 382. The manifold 382 extends upwardly through the open center of the bladder 292 and the open center of the retainer ring plate 279, such that each length of the tubing 430 is within the space between the retainer ring base 280 and the load cell 263. The retainer ring base 280 is shown in FIG. 8 having inlets 434 tapped into an inner side wall 436. Six such inlets 434 are provided at evenly spaced intervals around the inner side wall 436. The inner side wall 436 is fabricated from a hard engineering plastic, which may be an unreinforced semicrystalline thermoplastic polymer material, such as polyethylene terephthalate sold under the trademark ERTALYTE PET-P by Port Plastics provide dimensionally stable inlets 434. Each inlet 434 is provided with a tubing fitting 438 that connects with one of the lengths of tubing 430.

Figure 22:
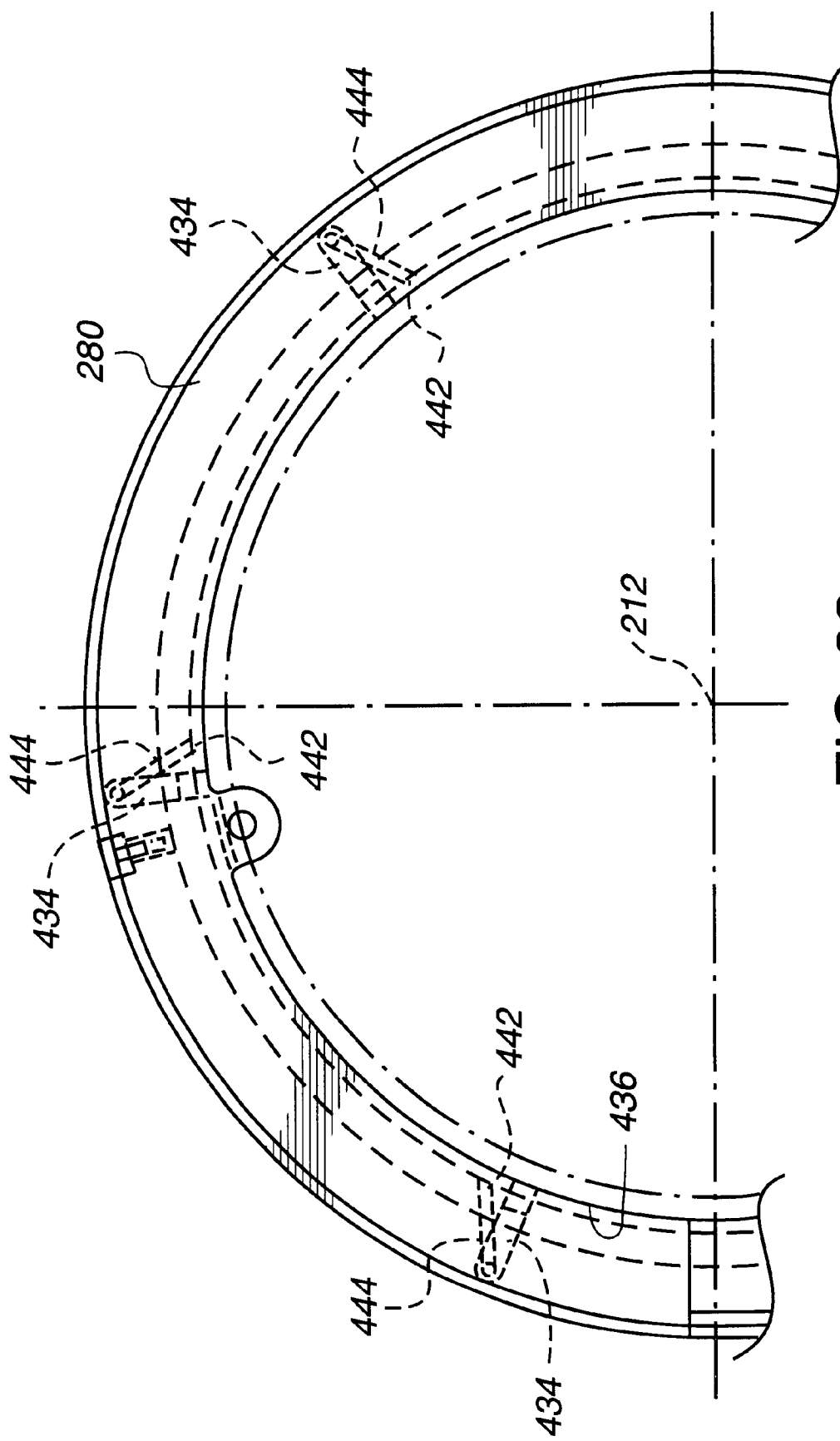
FIG. 22 is a cross sectional view of the wafer carrier taken at an angle to the plane of the exposed wafer surface in FIG. 6A, illustrating three of six DI water nozzles in the retaining ring base for supplying DI wafer wash water, showing the nozzles extending at an angle to a plane that includes the carrier axis, to direct the DI water partly in the direction of the circumference of the retaining ring.

The DI water 352 is supplied through the spindle 346 and to the manifold 382, which distributes the DI water 352 to the lengths of tubing 430 and to the fittings 438. FIGS. 14A and 14B show the general polishing position of the retainer ring 282, wherein the exposed surface 204 of the wafer 206 is coplanar, or horizontally aligned, with the top 299 of the retainer ring 282. The retainer ring base 280 is also shown separated from the vacuum chuck 262 by a space 440. As shown in FIGS. 8 and 22, each of the fittings 438 and inlets 434 is connected to a passageway 442 in the side wall 436. Each passageway 442 has an angular configuration to provide an upwardly and inwardly directed nozzle 444. FIG. 8 also shows each nozzle 444 oriented to direct the DI water 352 into the space 440. FIG. 22 also shows each passageway 442 extending away from a radial direction so as to direct the DI water 352 in a circumferential (or circular) direction (see arrow 445) around the axis nozzle 444. The passageway 442 supplies the DI water 352 to the nozzle 444 which directs the DI water 352 into the space 440 in the circular direction 445. In the enlarged view of FIG. 14B, the DI water (see arrow 352) from the nozzle 444 is also shown flowing against an underside (or overhang) 446 of the wafer 206 that overhangs the vacuum chuck 262. The overhang 446 may extend about 0.040 inches beyond the retainer ring base 280. Also, FIG. 14B shows (see arrow 448) a flow or seepage of the slurry 426 through a crack, or annular slit 452, between the retainer ring 282 and the wafer 206. The flow 448 allows the slurry 426 to enter the space 440.

The DI water 352 directed against the underside 446 of the wafer 206 removes the slurry 450 from the upper end of the space 440. A dam 454 blocks exit of the DI water 352 and the slurry 426 from an upper end of the space 440. The dam 454 is defined by the overhanging underside 446 of the wafer 206 and the thin dimensioning of the slit 452. As shown in FIG. 14A, an outlet 456 is machined into the side wall 438 below the dam 454 and adjacent to a seal 458. The outlet 456 is configured to provide an annular-shaped lip 460 that is opposite to a sloped entry wall 462. The lip 460 and the opposed wall 462 define an outlet cavity 464. Under the action of centrifugal force during rotation of the wafer carrier 208, the slurry 426 and the DI water 352 from the nozzles 444 is urged outwardly, into the cavity 464, and through an outlet orifice 466. The outlet orifice 466 extends through the retainer ring base 280 to the containment tub (not shown).The seal 458 is annular in shape and extends from the cavity 464, over the lip 460, across the space 440, and is tightly secured (e.g., gripped) between the main bearing housing 250 and the vacuum chuck 262. In this manner, the dam 454, the seal 458, and the related adjacent structure of the carrier 208 contain the slurry 426 and the DI water 352. The DI water 352 cleans the underside 446 of the wafer 206 and the space 440. The outlet 456 receives the slurry 426 and the DI water 352 that has been urged from the space 440 without any pumping mechanism other than the rotation of the carrier 208.

The CMP system 200-1 is not only provided with the above-described feature of making repeatable measurements of the eccentric forces FP-W, but is also provided with facilities (generally referred to using the reference number 338) for other CMP operations. The facilities 338 of the pad conditioning head 220, for example, include facilities 338PS for sensing the puck 218 on the chuck 322; facilities 338PP for purging the puck 218; and facilities 338 LCP for the load cell 324. Such facilities 338 are provided for the CMP operations without interfering with the CMP operations. Considering these facilities 338 of the pad conditioning head 220, reference is made to the three dimensional exploded views of FIGS. 16A and 16B, and to the three dimensional view of FIG. 17A, and to the cross sectional view of FIGS. 19A. In the following descriptions, structural elements that are the same as or very similar to those described above are described using reference numbers three hundred more than the previous reference number.

Figure 17A:
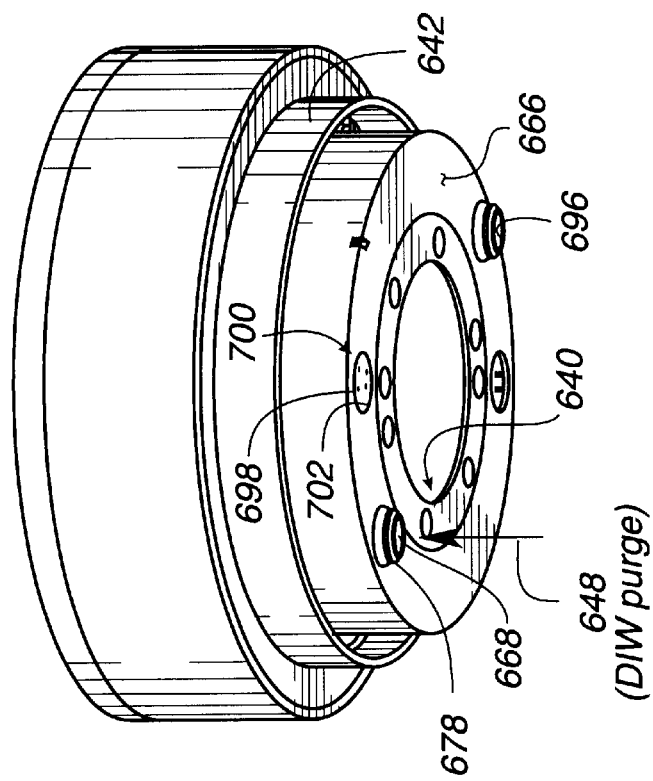
FIG. 17A is a three dimensional schematic view showing the structural elements of the puck carrier of the first embodiment, illustrating the bottom of an upper section of a rotary tool changer (RTC)
Figure 17B:
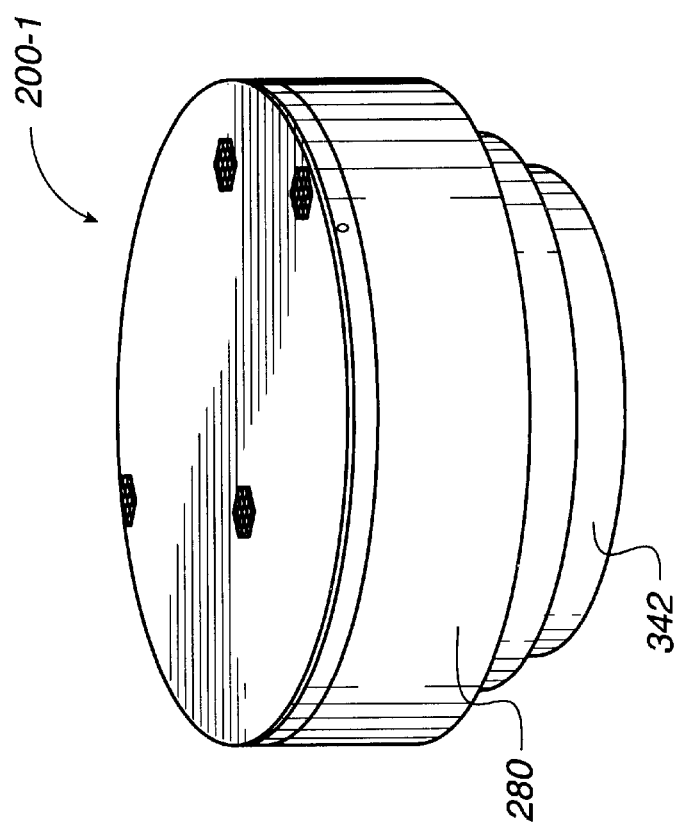
FIG. 17B is a three dimensional schematic view showing the structural elements of the puck carrier of the first embodiment, illustrating the top of the upper section of the RTC.
Figure 17C:
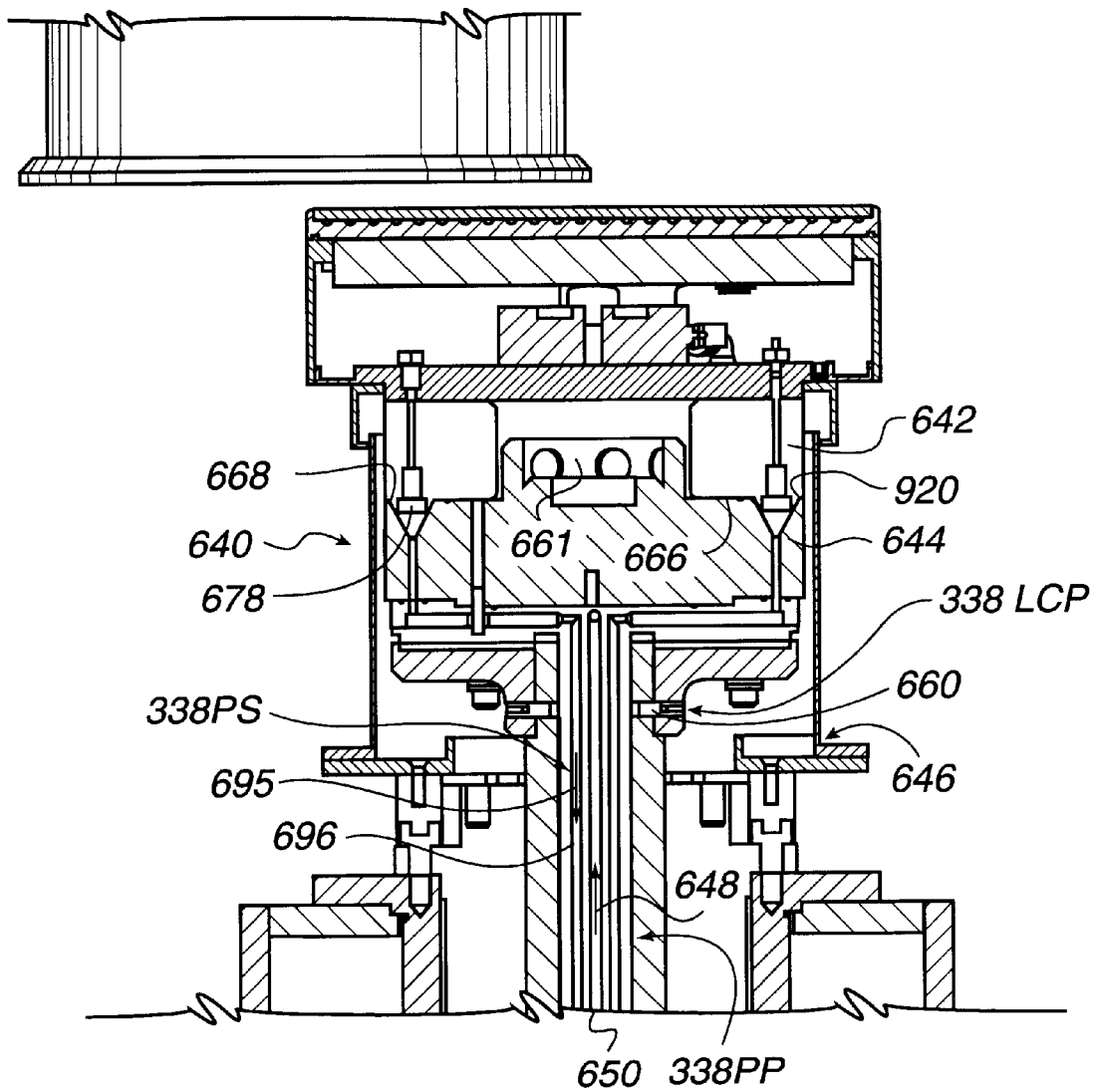
FIG. 17C is a schematic view of the wafer carrier, showing in dashed lines a spindle for supporting and supplying facilities to the carrier head, and a illustrating the polishing head.
Figure 18:
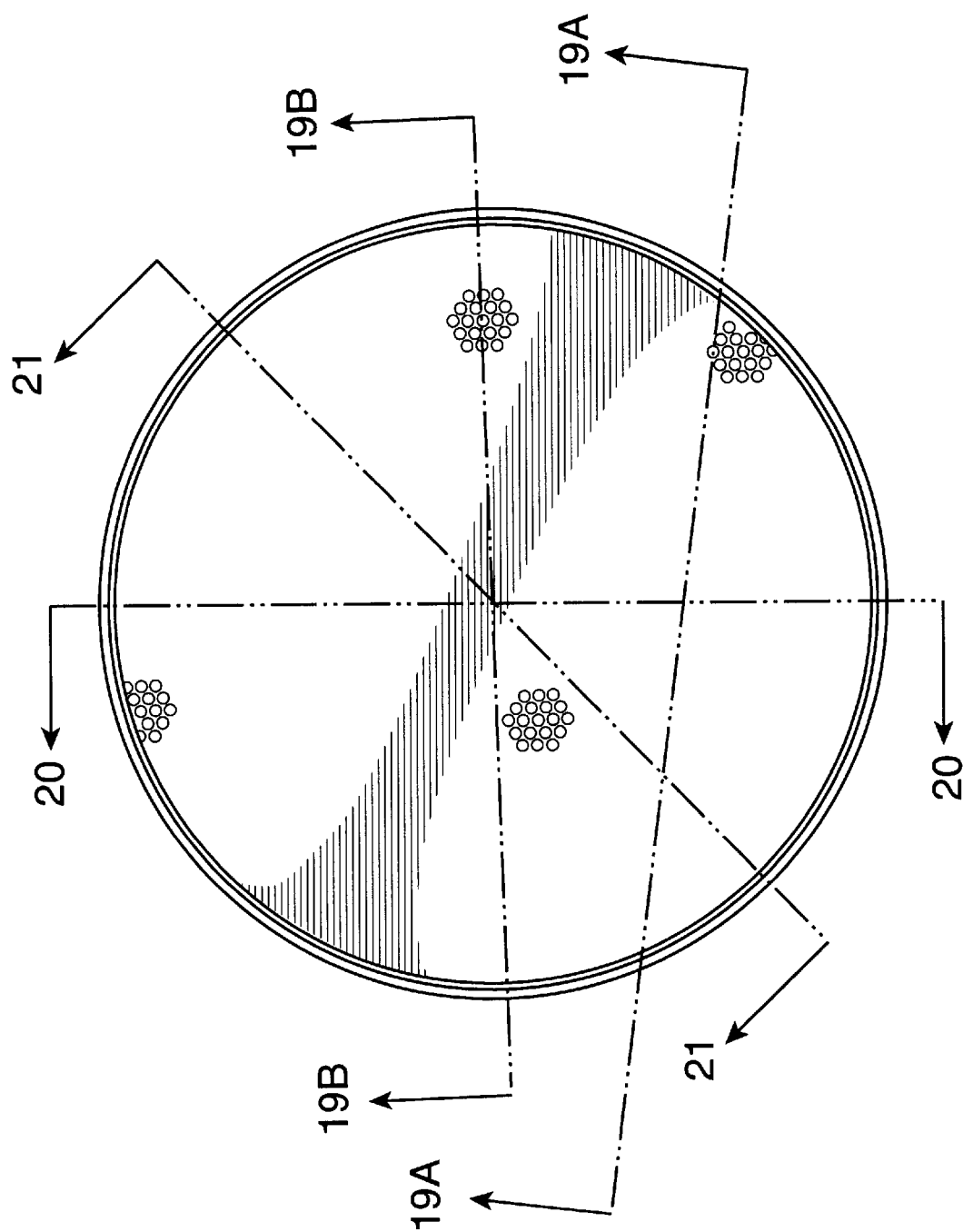
FIG. 18 is a plan view of the puck carrier, showing lines along which sections have been taken.

FIGS. 17A and 17B show assemblies of structural elements of the first embodiment 200-1, including a rotary tool changer 640 to which the puck bearing and load cell plate 308 are secured. The rotary tool changer 640 includes an upper section 642 and a lower section 644 (FIG. 17C). The lower section 644 is attached to a spindle 646 that rotates and applies vertical forces in up and down directions to the lower section 644. As shown in FIG. 17C, the spindle 646 also provides the facilities 338PP by supplying fluid, such as DI water 648, through a conduit 650 to the lower section 644 for use in the chuck 322. Additionally, the spindle 646 separately provides the facilities 338PS by applying a vacuum 695 through a conduit 696 to the lower section 644 for sensing the presence or absence of the puck 218 on the chuck 322.

The spindle 646 also provides the facilities 338LCP by providing a slip ring 660 connected to a system (not shown) for processing the puck load cell signal 326 to determine the force applied by the puck 218 to the polishing pad 209 during the polishing operations. The slip ring 660 is connected through a connector (not shown) on the lower section 644 which mates with a pogo pin connector (not shown) received in a port (not shown) in the lower section 644. Referring to FIG. 17A, pogo pins extend upwardly into resiliently biased contact with electrical contacts 698 of a connector 700 provided in a port 702 of the upper section 642. The port 702 has a shoulder (not shown) against which the connector 700 is urged when the plate 308 is connected to the upper section 642, as by six screws 704. The port 702 is aligned with a port 706 shown in FIG. 16B as being provided in the plate 560. The port 706 is large enough to pass the connector 700 (to permit the connector 700 to move into the port 702). A conductor 708 extends from the connector 700 through the port 706 to a load cell amplifier 710 shown in FIG. 16B secured to the plate 560. The amplifier 710 is connected to the load cell 324 and receives the puck load cell signal 326.

The lower section 644 and upper section 642 mate in the standard manner described above, i.e., by way of a releasable connector 661 (FIG. 17C). The structure described above releasably joins the sections 642 and 644. Two pressurized air lines actuate the piston (not shown) of the connector 661 to cause the connector 661 to lock the upper section 642 to the lower section 644, or to release the two sections.

The puck is purged to remove polishing debris and other material. The puck 218 is shown in FIGS. 16A, 16B, and 19B as including two disk-like layers 902A and 902B that are adhered to each other. A first layer 902A is fabricated from carbon steel that is provided with perforations 903. The perforations 903 may be apertures having a size of about 0.150 inches, for example. The perforations 903 are uniformly spread over the entire layer 209A. The perforated carbon steel layer 902A is nickel plated. The perforated and nickel plated layer 209A is then coated with diamond material. The layer 209A is in the form of a disk having a diameter of about 9.5 inches, which conforms to the diameter of the outer portion of the retainer ring 282 and to the diameter of the second layer 209B. The second layer 209B is a magnetic disk having an adhesive backing. The layer 209B is provided with smaller perforations or openings 904. For example, the openings 904 may have a size in the range of from about 0.010 inches to about 0.015 inches. The puck 218 is mounted on the pad conditioning head 220 with the layer 902B touching the head 220 so that the diamond coated surface faces the pad 209.

The facilities 338PP for purging the puck 218 include the upper section 642. FIGS. 17A, 17C, 19B, and 20 show the bottom 666 of the upper section 642. Three ports in the upper section 642 are provided for the facilities 338. A first port 668 mates with a similar port of the lower section 644 to supply the DI water (see arrow 648) for the purging operation. The DI water 648 flows through the port 668 past an O-ring 680 to a fitting 672 shown in FIG. 20 threaded into a threaded port 674 of the plate 308. The fitting 672 is connected to a tube, or conduit, 712. The tube 712 extends upwardly from the fitting 672 through a through-hole 714 in the main bearing housing 306 (FIG. 16A) and extends to a push-to-connect tubing connector 716. The connector 716 is threaded into a port 718 drilled into the chuck 322. The port 718 is shown in FIG. 16B supplying the DI water 648 to a manifold 720 of the chuck 322 to evenly distribute the DI water 648 across an upper surface 722 of the chuck 322. The chuck 322 is provided with a lip 900 that extends above the upper surface 722. The lip 900 defines a dam that retains a pool or reservoir of the DI water 648 on the chuck 322. The DI water 648 is supplied to the chuck 322 at a preferred flow rate of about two hundred to three thousand cubic cm. per minute (ccm), and at a more preferred flow rate of about four hundred to two thousand ccm, and at most preferred range of about 1000 ccm to 1200 ccm and flows outwardly from the manifold 720 through the perforations and openings in the puck 218, and past the puck 218 and slowly over the lip 900 forming a waterfall slowly flowing off the chuck 322. In this manner the puck 218 on the chuck 322 is immersed in the DI water 648 and the DI water flowing past the puck 218 purges, or cleans, the puck 218, thereby assisting in the desired conditioning of the polishing pad 209 by the puck 218.

Figure 21:
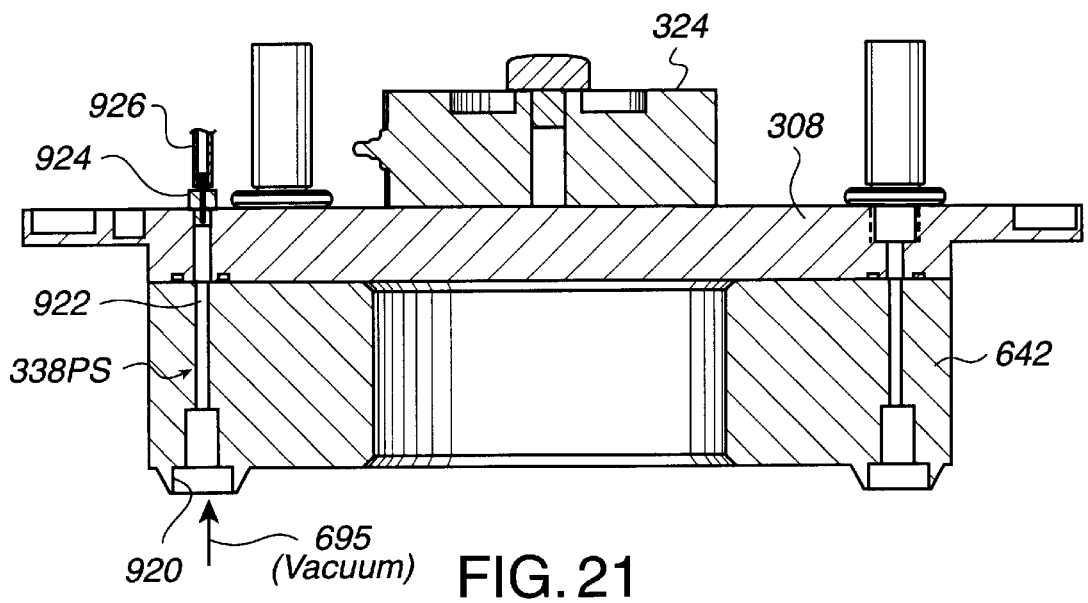
FIG. 21 is a cross section taken along lines 21—21 in FIG. 18, showing the vacuum conduit exiting a base of the puck carrier.

FIGS. 19A and 21 show the facilities 338PS configured as a port 920 to which the vacuum 695 is applied by the conduit 696. A bore 922 connects the port 920 to a nozzle 924 that is mounted on the puck bearing and load cell plate 308. Tubing 926 is connected to the nozzle 924 and extends upwardly through a through-hole 928 in the main bearing housing 306. The tubing 926 is connected to a fitting 930 secured to the housing 306. The fitting 930 applies the vacuum 695 to a bore 932 drilled into the housing 306 and aligned with a ridge 934 of the manifold 720. The bore 932 extends to the top of the ridge 934. In this manner, the presence of the puck 218 properly on the chuck 322 will block the flow of air into the bore 932, causing the pressure in the bore 932 to decrease. This decreased pressure is reflected as decreased pressure in the conduit 696. The conduit 696 is connected to a pressure sensor, such as a pressure sensor similar to the pressure sensor 299D (FIG. 3C). The pressure sensor detects the decreased pressure and determines that the puck 218 is properly on the chuck 322. If the puck 218 is only partly on the chuck 322, or is not at all on the chuck 322, the flow of air into the bore 932 will not be blocked and the pressure in the bore 932 and thus in the conduit 696 will not decrease. As a result, the pressure sensor will determine that the puck 218 is not properly on, or is not at all on, the chuck 322, such that the polishing operation should be interrupted.

Figure 23:
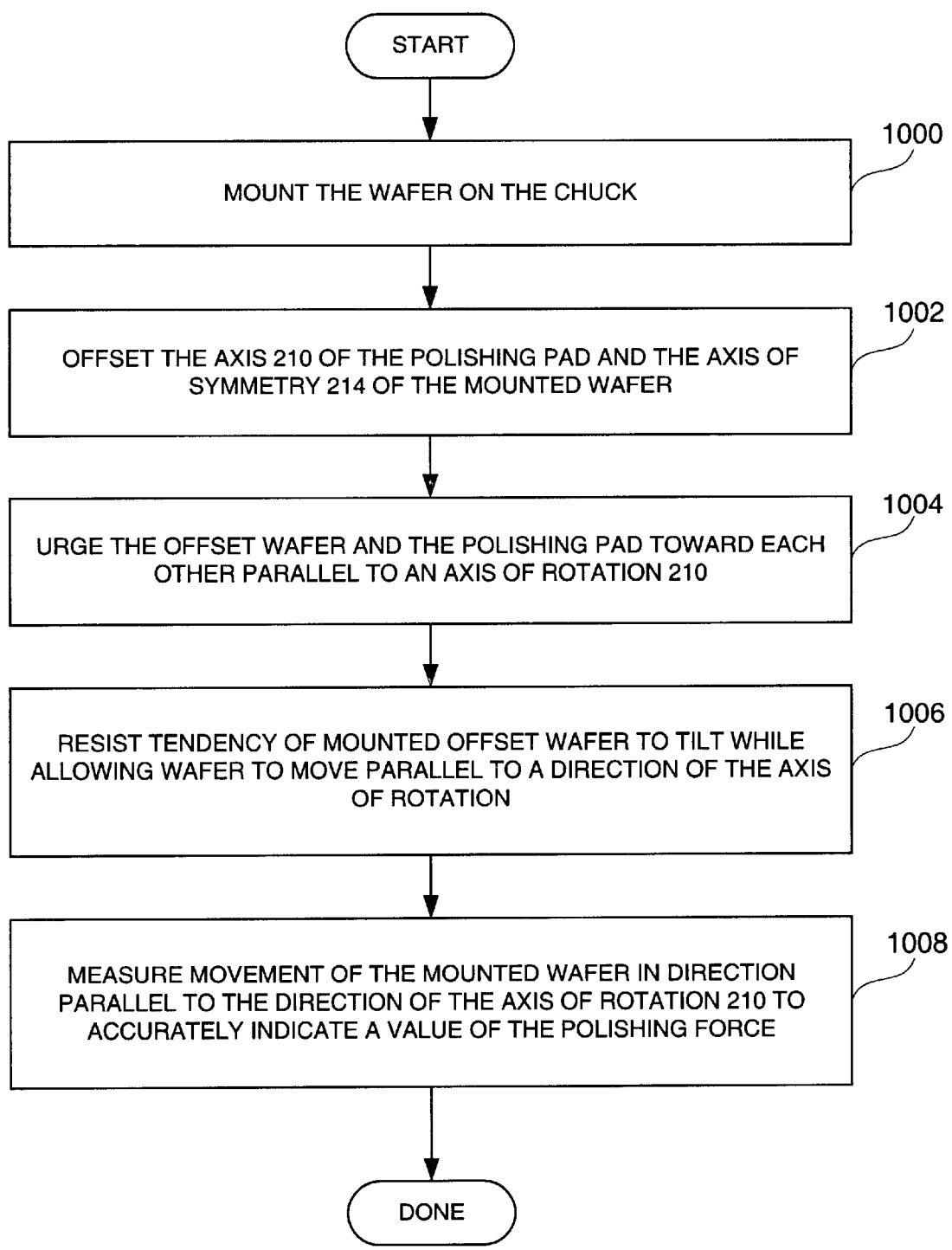
FIGS. 23 through 37 depict flow charts illustrating operations in various methods of the present invention.

Referring to FIG. 23, the present invention provides a method for controlling relative movement between the wafer 206 and the CMP polishing pad 209. The method may include an operation 1000 of mounting the wafer 206 on the chuck 262. It may be recalled that the wafer 206 has an axis 214, which may be referred to as an axis of symmetry. This mounted position is described above as the initial position of the wafer axis 214. The method moves to operation 1002 by offsetting the axis 210 of the polishing pad 209 and the axis of symmetry 214 of the mounted wafer 206, which is shown in FIG. 1B. The axis 210 is the axis on which the pad rotates. The method then moves to an operation 1004 by urging the pad 209 and the offset wafer 206 toward each other parallel to the axis of symmetry 214, as shown by the arrow 209V in FIG. 1B. With the rotary tool changer urging the wafer carrier 208 upwardly and holding the chuck 262 at a fixed position in the direction of the axis 212 of the wafer carrier 208, the urging operation 1004 causes the pad 209 to impose a polishing force, such as the force FP-W, on the mounted wafer 206 eccentrically with respect to the axis of symmetry 214. In response to the polishing force FP-W, the wafer 206 has the above-described tendency to tilt such that the axis of symmetry 214 tends to move out of parallel with the axis 210, which is the axis of rotation of the pad 209. During the urging, the method moves to an operation 1006 by resisting the tendency of the mounted offset wafer 206 to tilt while allowing the wafer 206 to move parallel to the direction of the axis of rotation 210, and along the initial position of the wafer axis 214. The movement along the initial position of the wafer axis 214 is in response to the force FP-WV in FIG. 2A, for example, and reflects the operation of the linear bearings 232 in response to the eccentric force FP-W. The method may also move to an operation 1008, which during the urging operation and the resisting operation, is performed by measuring the movement of the wafer 206 parallel to the direction of the axis of rotation 210 to indicate a value of the polishing force, i.e., the force FP-W. The operations shown in FIG. 23 are then done.

Figure 24:
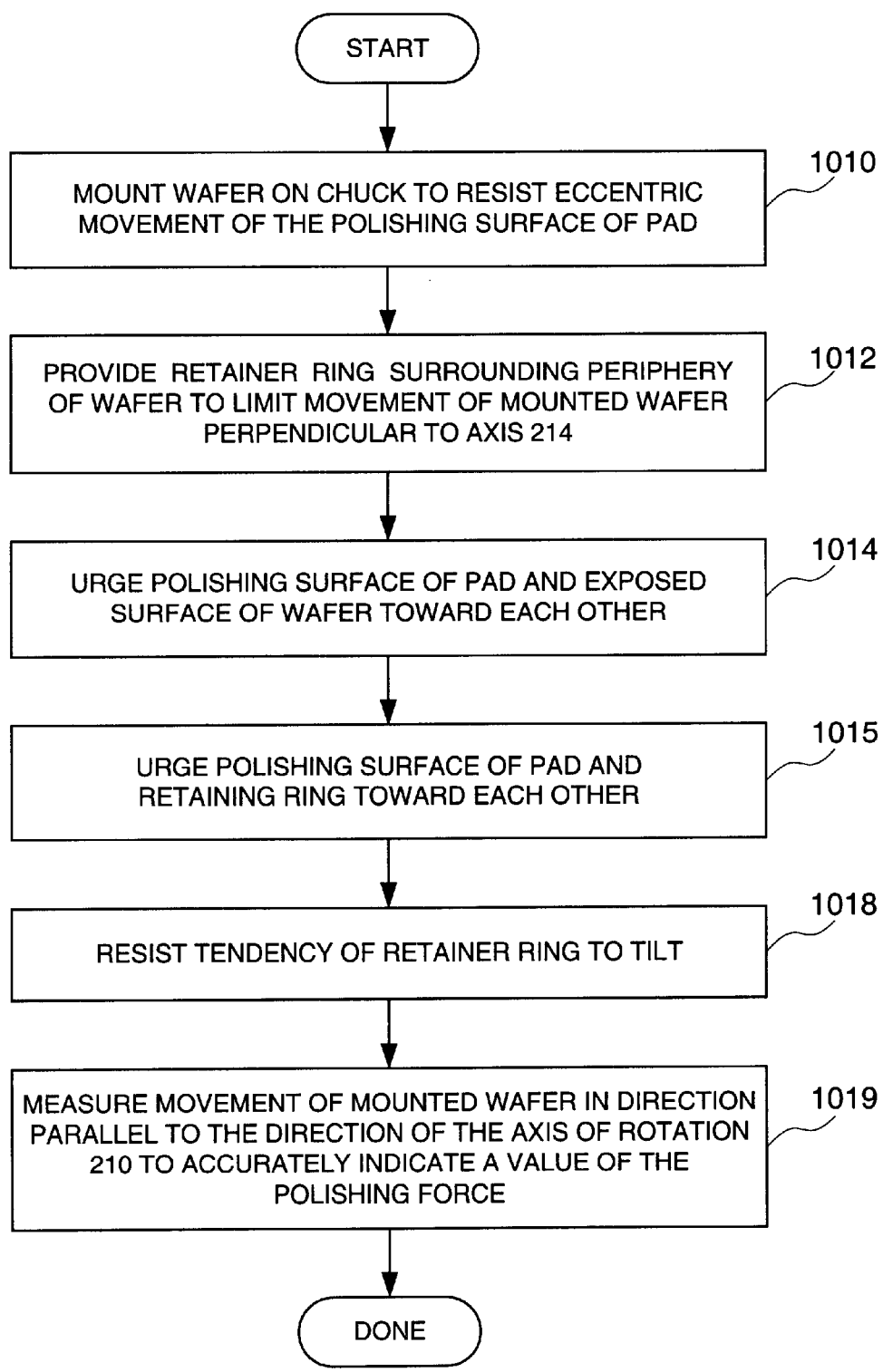

Referring to FIG. 24, another aspect of the present invention provides a method for mounting the wafer 206 for a polishing operation performed by the pad 209 having a polishing surface. From the start, the method may include an operation 1010 of mounting the wafer 206 on the chuck 262 to resist movement of the polishing surface of the pad 209 which FIG. 1B shows is applied eccentrically with respect to the axis of symmetry 214 of the wafer 206. The wafer 206 is shown in FIG. 14B as having the edge, or periphery, 301 symmetric with the axis of symmetry 214. The axis 214 is normally perpendicular to the exposed surface of the pad 209. The method moves to operation 1012 by providing the retainer ring 282 having a first position (FIG. 12A) surrounding the periphery 301 of the wafer 206 to limit movement of the wafer 206 perpendicular to the axis 214. The method moves to operation 1014 by urging the exposed surface of the pad 209 and the wafer 206 toward each other so that the pad 209 exerts the polishing force FP-W tending to tilt the wafer 206 and the axis of symmetry 214 into respective positions out of perpendicularity with respect to the polishing surface. The method moves to operation 1015 by urging the exposed surface of the pad 209 and the retaining ring 282 toward each other so that the pad 209 exerts the polishing force FP-W tending to tilt the retaining ring 282 and the axis of symmetry 288 into respective positions out of perpendicularity with respect to the polishing surface of the pad 209. The method moves to operation 1018 by the action of the linear bearings 253 resisting the tendency of the retainer ring 282 to tilt. Such resisting limits the movement of the retainer ring 218 to movement perpendicular to the exposed surface of the pad 209. As described above, in this manner the permitted movement of the retainer ring 282 in response to the force FP-W (i.e., movement parallel to the initial position of the axis 212 and 214) is in the same direction as the permitted movement of the chuck 262 and the wafer 206 on the chuck 262 in response to the force FP-W (i.e., the direction parallel to the initial position of the axis 212 and 214). Further, the resisting in this manner facilitates making repeatable measurements of the eccentric forces FP-W. Thus, by the resisting of operation 1018 the force FPW applied to the wafer carrier 208 may be accurately measured, as defined above, even though such force FP-W is eccentrically applied to the retainer ring 282. The method may also move to an operation 1019, which during the urging operations 1014 and 1015 and the resisting operation 1018, is performed by measuring the movement of the wafer 206 parallel to the direction of the axis of rotation 210. As defined above, this measuring provides an accurate indication of a value of the polishing force, i.e., the force FP-W. The operations shown in FIG. 24 are then done.

Figure 25:
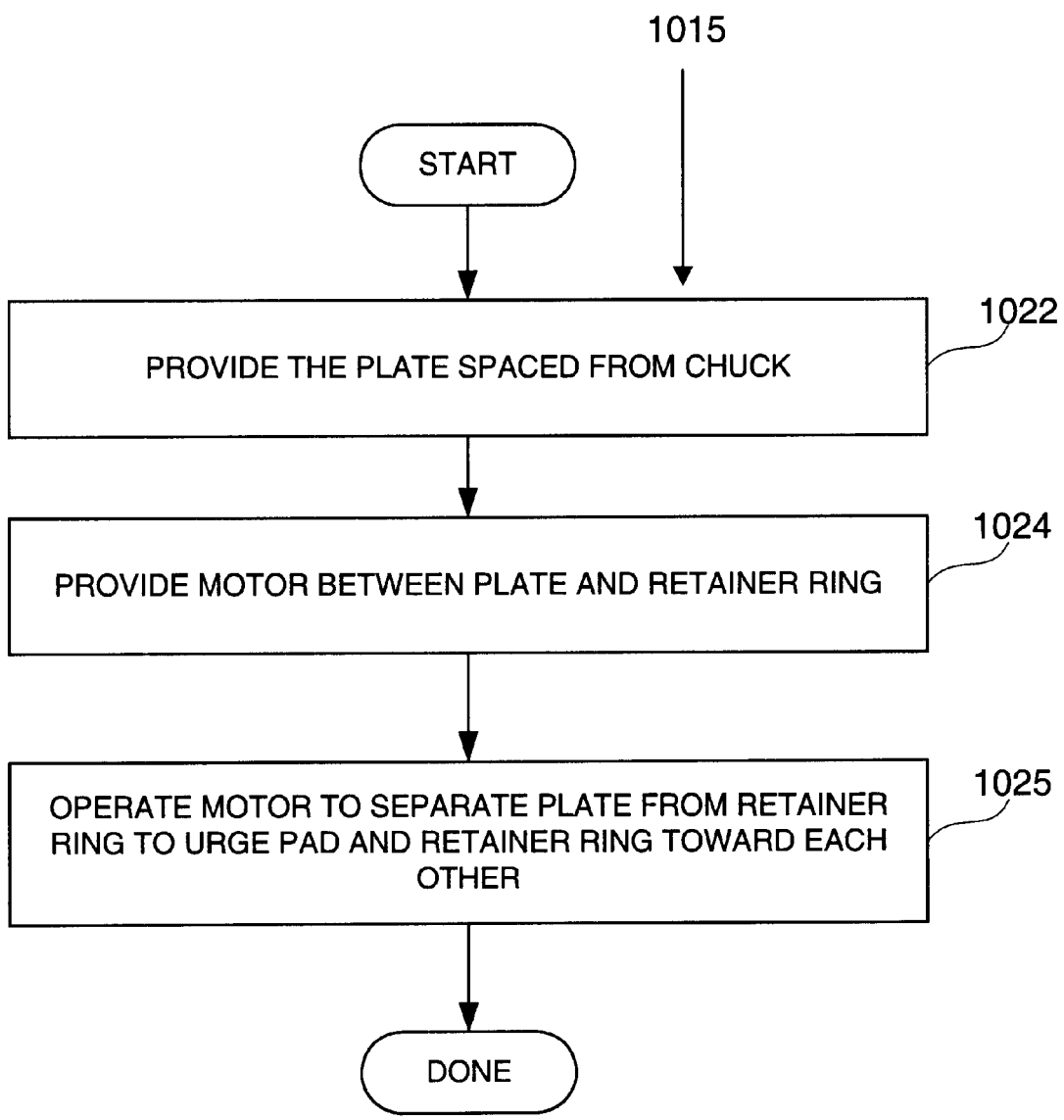

As shown in FIG. 25, operation 1015 may include a suboperation 1022 of providing the plate 260 spaced from the chuck 262. Operation 1015 may also include a suboperation 1024 of providing the bladder 292 between the plate 260 and the retainer ring 282. Operation 1015 may also include a further suboperation 1025 of operating the bladder 292, such as by inflating the bladder 292 with fluid at a first pressure. Such inflation moves the retainer ring 282 and the pad 209 toward each other.

Figure 26:
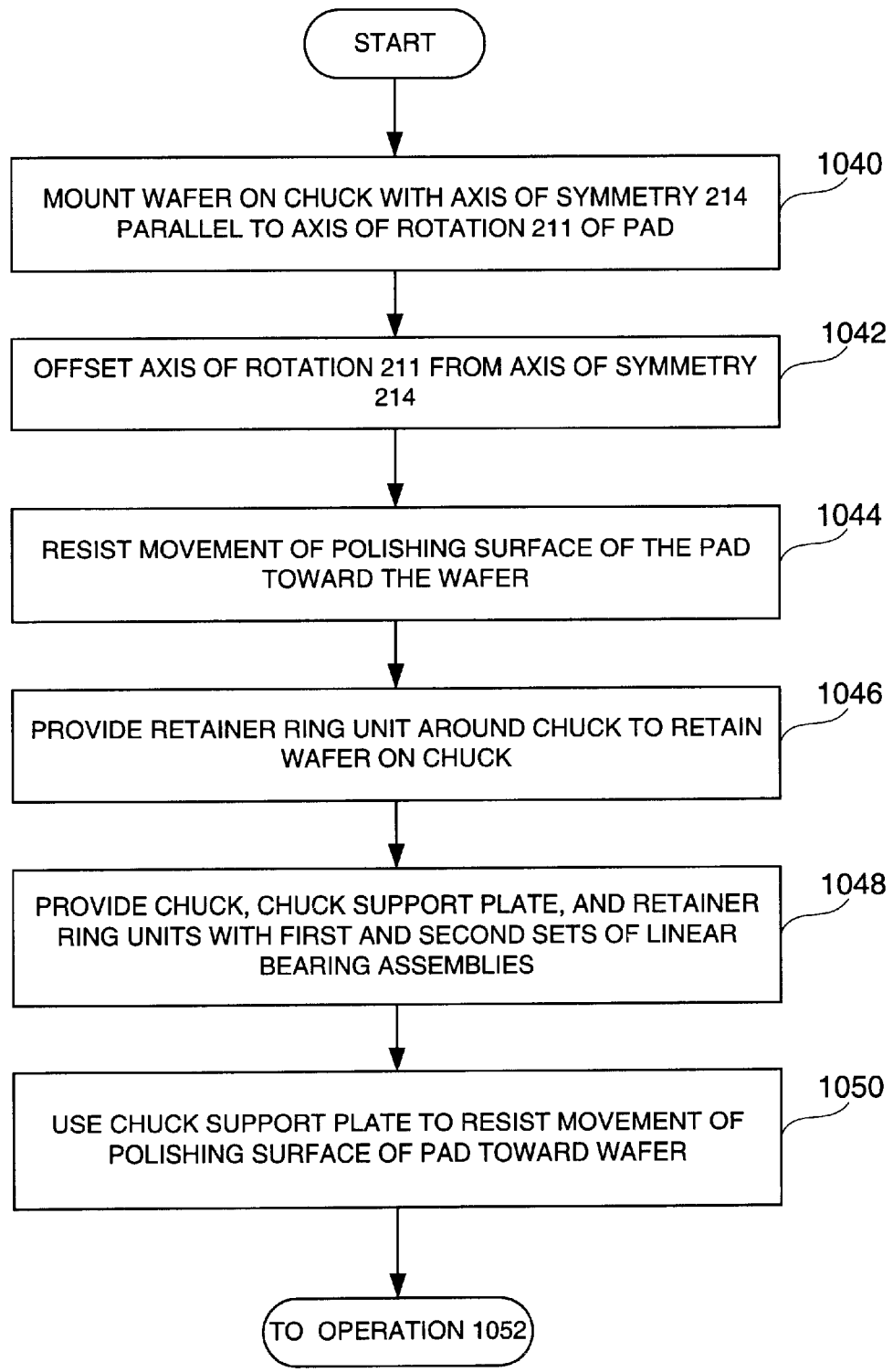
Figure 27:
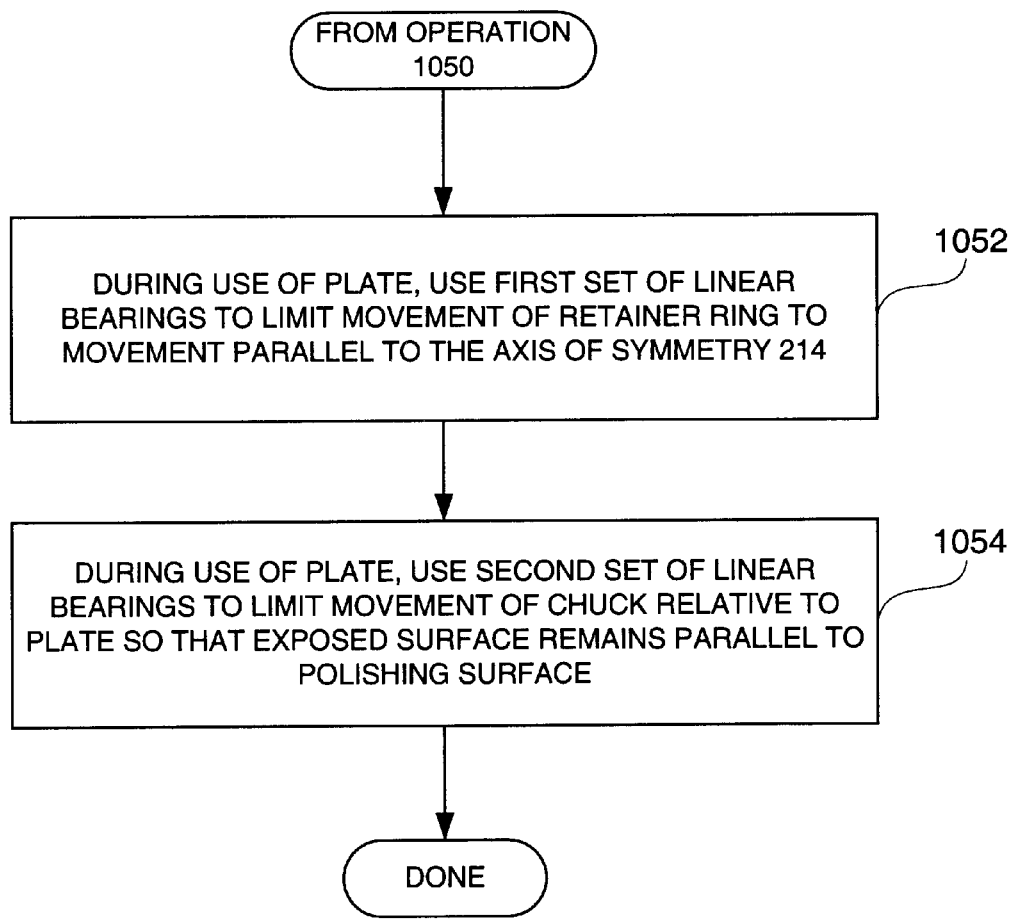

Referring to FIG. 26, another aspect of the present invention provides a method for controlling relative movement between the wafer 206 and a chemical machining pad 209. The method may include an operation 1040 of mounting the wafer 206 on the 262 chuck, the wafer 206 having the axis of symmetry 214 perpendicular to a polishing surface of the pad 209 and coaxial with the carrier axis 212, and parallel to the axis of rotation 211 of the pad 209. The method moves to operation 1042 by offsetting the axis of rotation 211 of the pad 209 from the axis of symmetry 214 of the mounted wafer 206. The method moves to operation 1044 by resisting movement of the polishing surface of the pad 209 toward the wafer 206. The chuck support plate 260 is provided for this purpose. The chuck 262 is movable relative to the chuck support plate 260. The method moves to operation 1046 by providing the retainer ring unit (e.g., ring 282 and base 280) around the chuck 262 for movement to retain the wafer 206 on the chuck 262 (e.g., assist in placing the wafer 206 on the chuck 262, FIG. 12B). The retainer ring 282 may also expose the wafer 206 to the surface of the pad 209 for polishing (FIG. 14A). The method moves to operation 1048 by providing the chuck 262, the chuck support plate 260, and the retainer ring units (280 and 282) with a plurality of pairs of linear bearing assemblies 230 and 232, each of the assemblies having a housing 254 or 274 provided with a bearing axis perpendicular to the polishing surface of the pad 209. Each of the assemblies has the linear shaft 258 or 278 received in a respective one of the housings 254 or 274. The first set 252 of the assemblies is between the chuck 262 and the retainer ring units (280 and 282), and the second set 270 of the assemblies is between the chuck 262 and the chuck support plate 260. The method moves to operation 1050 by holding the chuck support plate 260 at a fixed position along the axis 212 to resist the movement of the polishing surface of the pad 209 toward the wafer 206. Alternatively, the plate 260 may be urged toward the pad 209. On either case, the pad imposes the polishing force FP-W on the mounted wafer 206 and on the retainer ring 282 eccentrically with respect to the axis of symmetry 214. In response to the polishing force FP-W the wafer 206 and the chuck 262 have the tendency to tilt such that the axis of symmetry 214 tends to move out of parallel with the axis of rotation 210. Referring to FIG. 27, during the holding operation 1050 an operation 1052 is performed by which the first set 252 of the assemblies is effective to limit the movement of the retainer ring 282 to movement parallel to the axis of symmetry 214. During the holding of the chuck support plate 260, for example, operation 1054 is performed by which the second set 270 of the assemblies is effective to limit movement of the chuck 262 relative to the chuck support plate 260 to movement parallel to the axis of symmetry 214.

Figure 28:
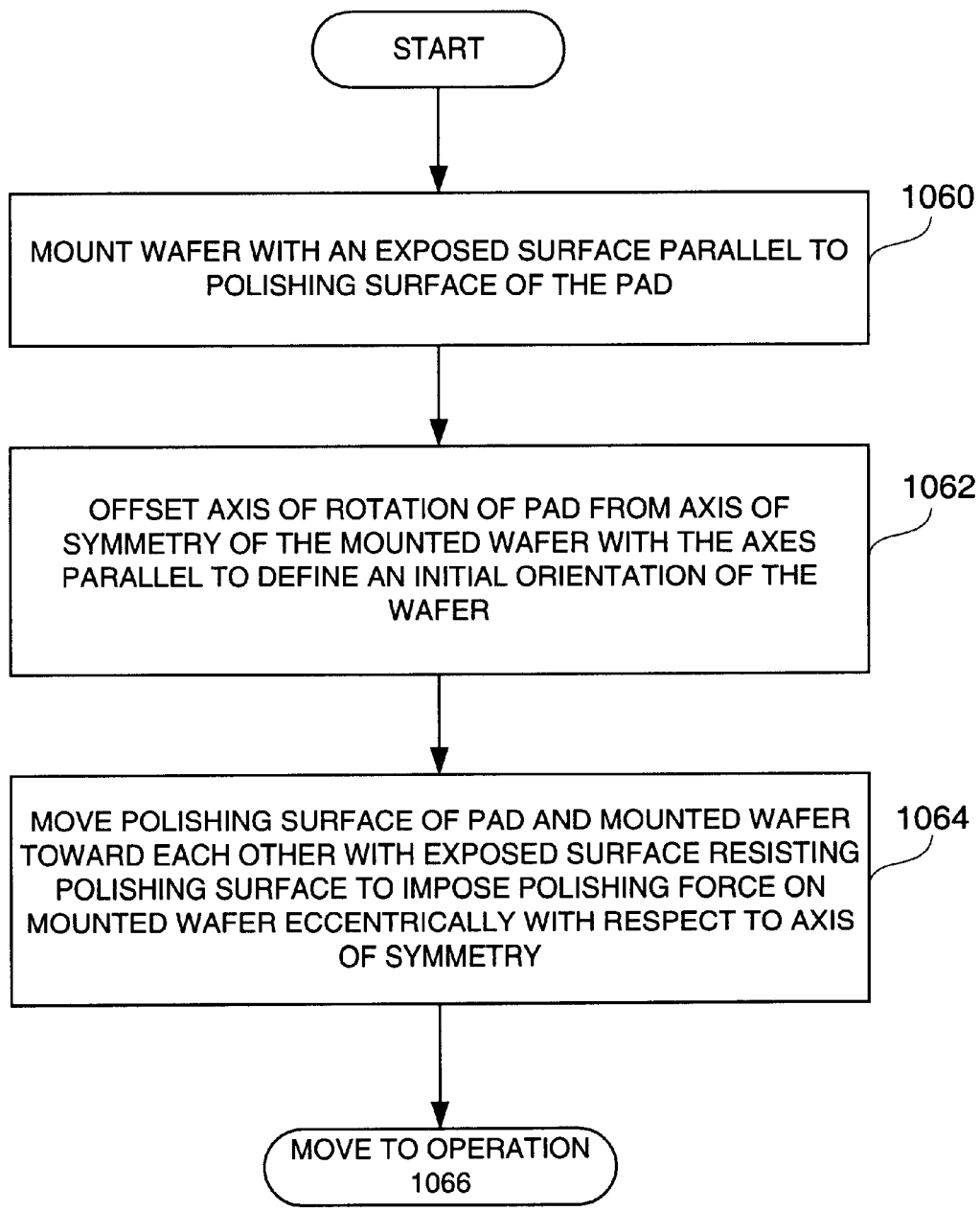
Figure 29:
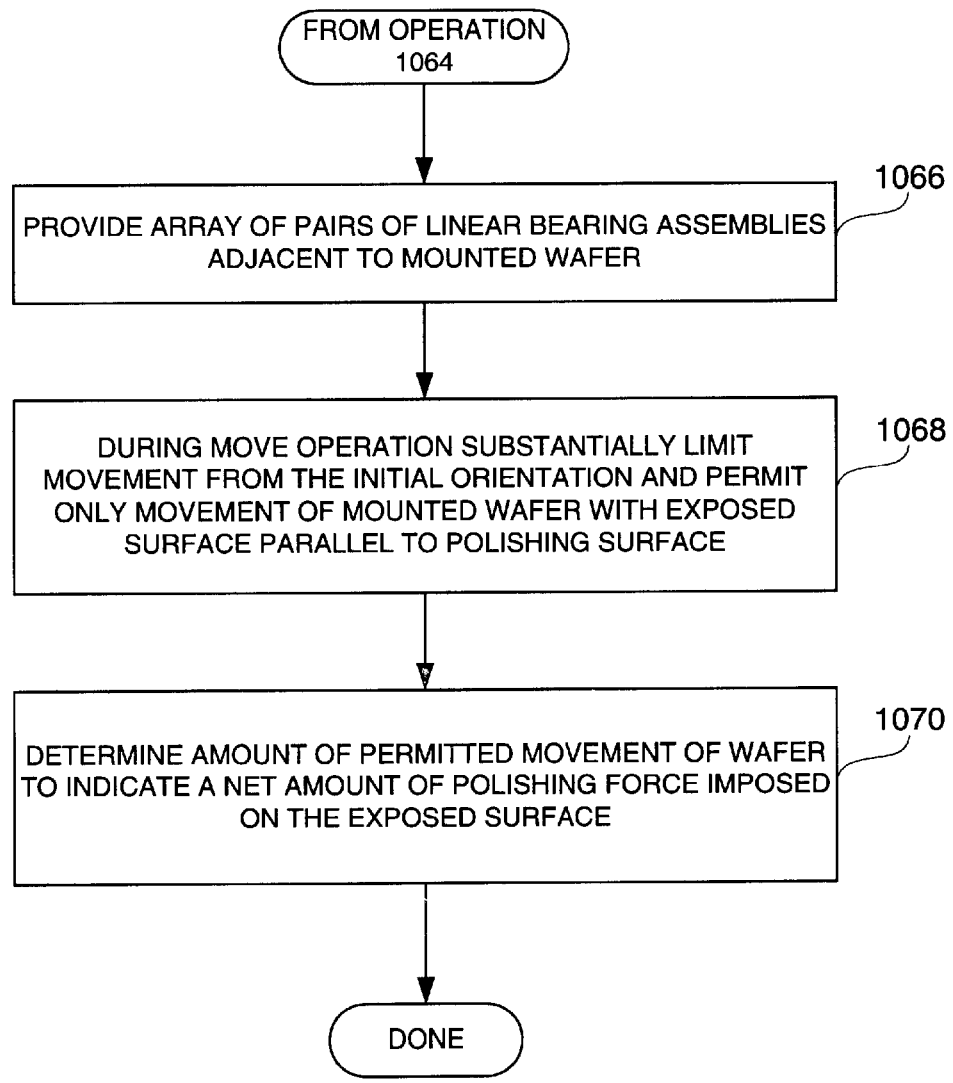

Referring to FIG. 28, the present invention provides a method for controlling relative movement between the wafer 206 and the CMP polishing pad 209. The method may include an operation 1060 of mounting the wafer 206 on the chuck 262 with an exposed surface 204 parallel to the polishing surface of the pad 209. The method moves to operation 1062 by offsetting the axis of rotation 210 of the polishing pad 209 from the axis of symmetry 214 of the mounted wafer 206 with the axes parallel to define an initial orientation of the wafer 206. The method then moves to an operation 1064 by moving the polishing surface of the pad 209 and the mounted offset wafer 206 toward each other with the exposed surface 204 resisting the polishing surface so that the force FP-W is imposed on the mounted wafer 206 eccentrically with respect to the axis 214. Referring to FIG. 29, an operation 1066 provides the array 265 of linear bearing assemblies 253, for example, adjacent to the mounted wafer 206. During the moving of operation 1064, the method moves to an operation 1068 by substantially limiting movement from the initial orientation of the wafer 206 and permitting only movement of the mounted wafer 206 with the exposed surface 204 parallel to the direction of the polishing surface of the pad 209. The method also moves to an operation 1070, which during the urging operation and the resisting operation, is performed by measuring the amount of the permitted movement of the wafer 206 with the exposed surface 204 parallel to the direction of the polishing surface of the pad 209. This indicates a value of a net amount of the polishing force imposed on the exposed surface 204.

Figure 30:
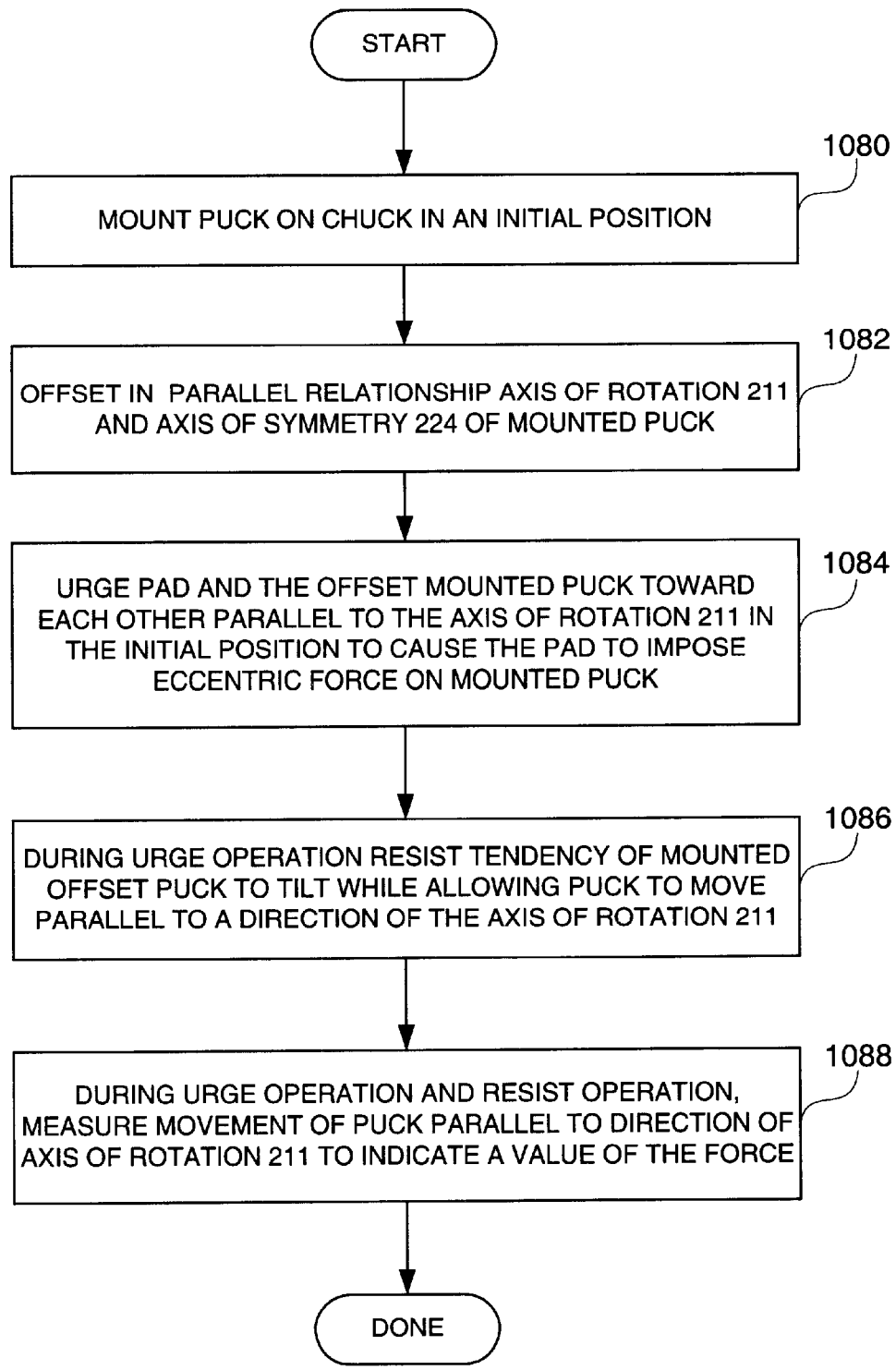

The present invention also provides a method for controlling relative movement between the pad conditioning puck 218 and the chemical machining pad 209 Referring to FIG. 30, the method may include an operation 1080 of mounting the puck 218 on the chuck 322, the puck 218 having an axis of symmetry 224 (in an initial position). The method moves to operation 1082 by offsetting the axis of rotation 211 of the pad 209 and the axis of symmetry 224 of the mounted puck 218 in parallel relationship. The method moves to operation 1084 by urging the pad 209 toward the offset puck 218 parallel to the axis of rotation 210 (in the initial position) to cause the pad 209 to impose the conditioning force FP-C on the mounted puck 218 eccentrically with respect to the axis of symmetry 224. In response to the conditioning force FP-C the puck 218 has a tendency to tilt such that the axis of symmetry 224 tends to move out of parallel with the axis of rotation 211. The method moves to operation 1086 during the urging operation 1084 by resisting the tendency of the mounted offset puck 218 to tilt while allowing the puck 218 to move parallel to a direction of the axis of rotation 211. The method may also include an operation 1088 performed during the urging operation 1084 and the resisting operation 1086, by measuring the movement of the puck 218 parallel to the direction of the axis of rotation 211 to indicate a value of the conditioning force FP-CV. Such indication may, according to the present invention, be an accurate indication as defined herein.

Figure 31:
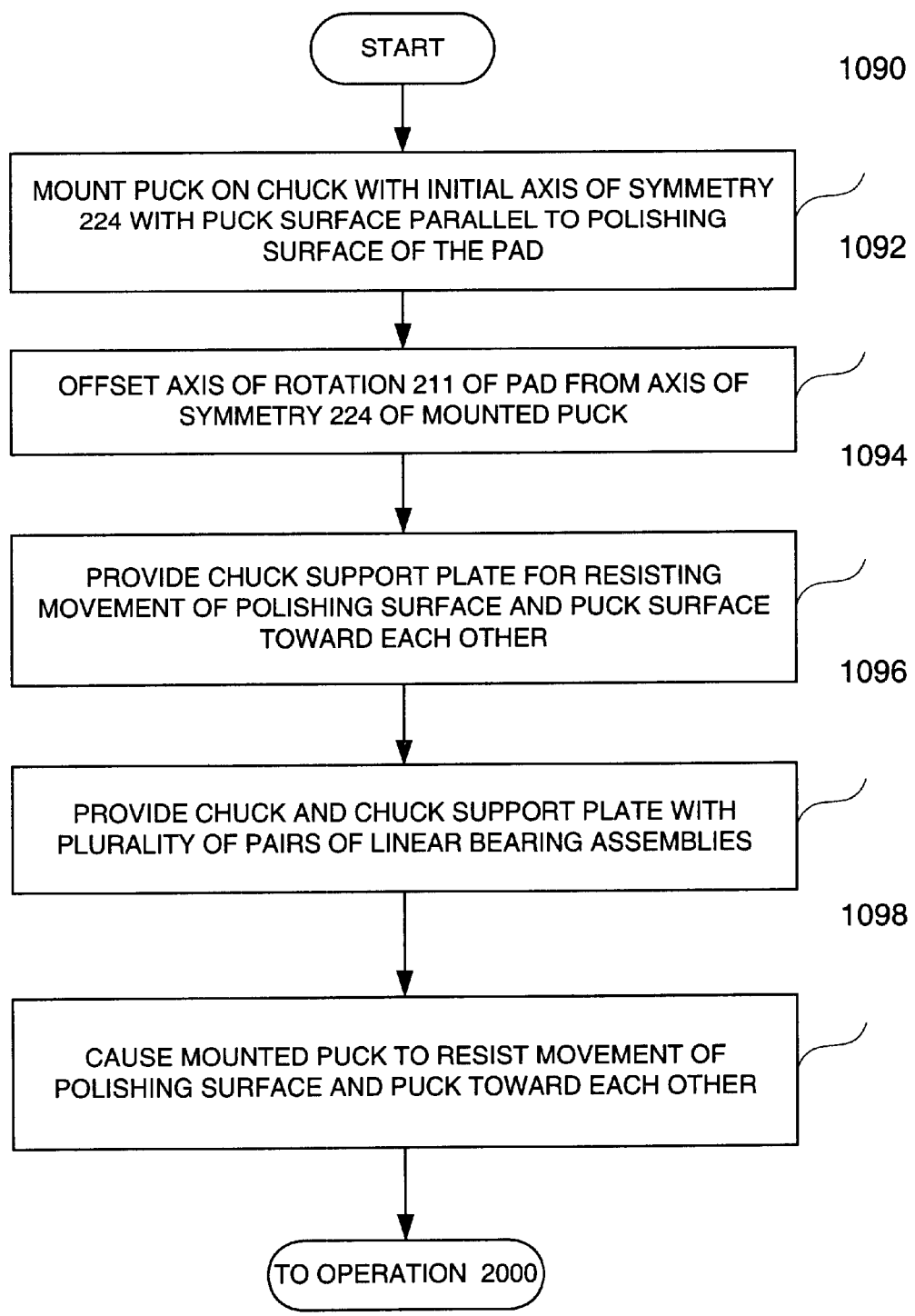
Figure 32:
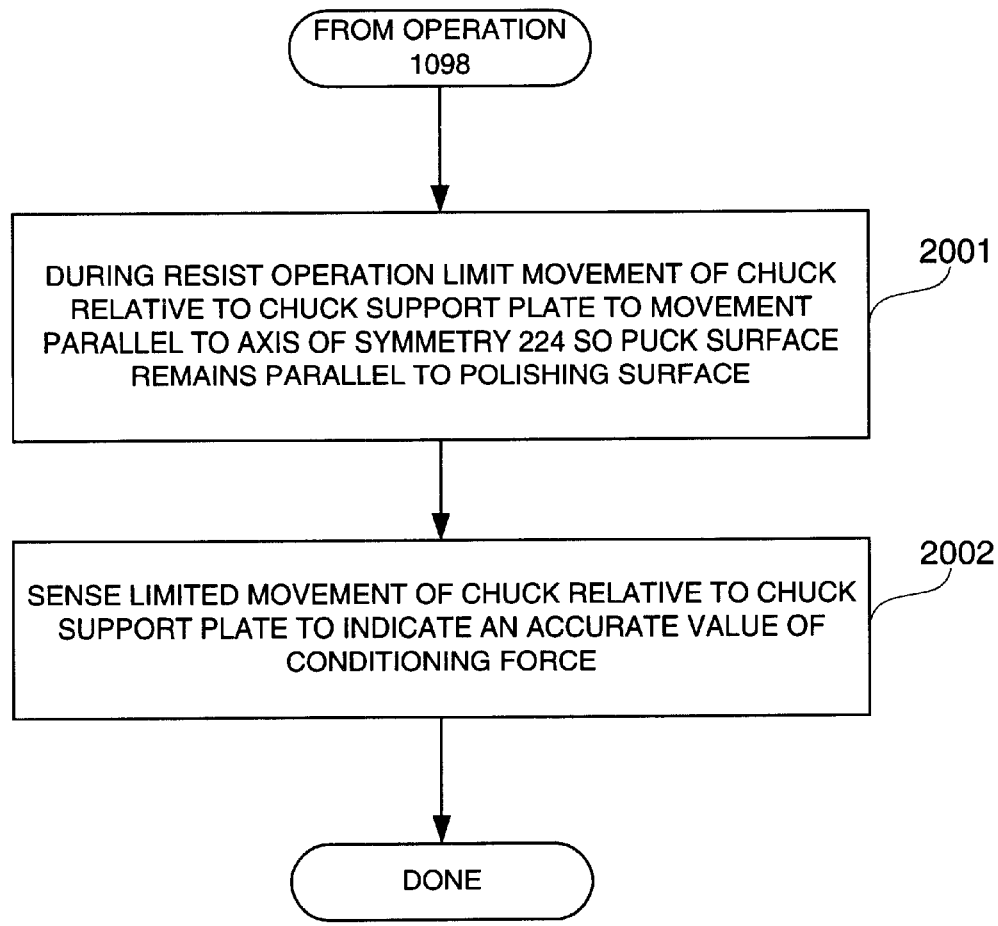

Referring to FIG. 31, the present invention also provides a method for controlling relative movement between the chemical machining pad 209 and the pad conditioning puck 218. The method may include an operation 1090 of mounting the puck 218 on the chuck 322, the puck 218 having the initial axis of symmetry 224 and a puck surface parallel to the polishing surface of the pad 209. The pad 209 has the axis of rotation 211. The method moves to operation 1092 by offsetting the axis of rotation 211 of the pad 209 from the axis of symmetry 224 of the mounted puck 218. The method moves to operation 1094 by providing the chuck support plate 308 for resisting movement of the polishing surface of the pad 209 toward the puck 218, the chuck 322 being movable relative to the chuck support plate 308. The method moves to operation 1096 by providing the chuck 322 and the chuck support plate 308 with a plurality of pairs of linear bearing assemblies 304. Each of the assemblies 304 has a housing 316 provided with a bearing axis perpendicular to the polishing surface of the pad 209. Each of the assemblies 304 has a linear shaft 320 received in a respective one of the housings 316. The assemblies 304 are between the chuck 322 and the chuck support plate 308. The method moves to operation 1098 by holding the chuck support plate 308 at a fixed position to resist the movement of the polishing surface of the pad 209 toward the puck 218. The pad 209 imposes the conditioning force FP-W on the mounted puck 218 eccentrically with respect to the axis of symmetry 224. In response to the conditioning force FP-C, the chuck 322 and the puck 209 on the chuck 322 have a tendency to tilt such that the axis of symmetry 224 tends to move out of parallel with the axis of rotation 211. During the holding of the chuck support plate 308 at the fixed position the method moves to an operation 1098 in which the assemblies 304 are effective to cause the mounted puck 218 to resist movement of the polishing surface of the pad 209 and the puck 218 towards each other. Referring to FIG. 31, the method moves to an operation 2000 to limit movement of the chuck 322 relative to the chuck support plate 308 to movement parallel to the initial position of the axis of symmetry 224. In this manner the puck surface remains parallel to the polishing surface. The method may move to operation 2002 by sensing the limited movement of the chuck 322 relative to the chuck support plate 308 to indicate an accurate value of the conditioning force FP-CV.

Figure 33:
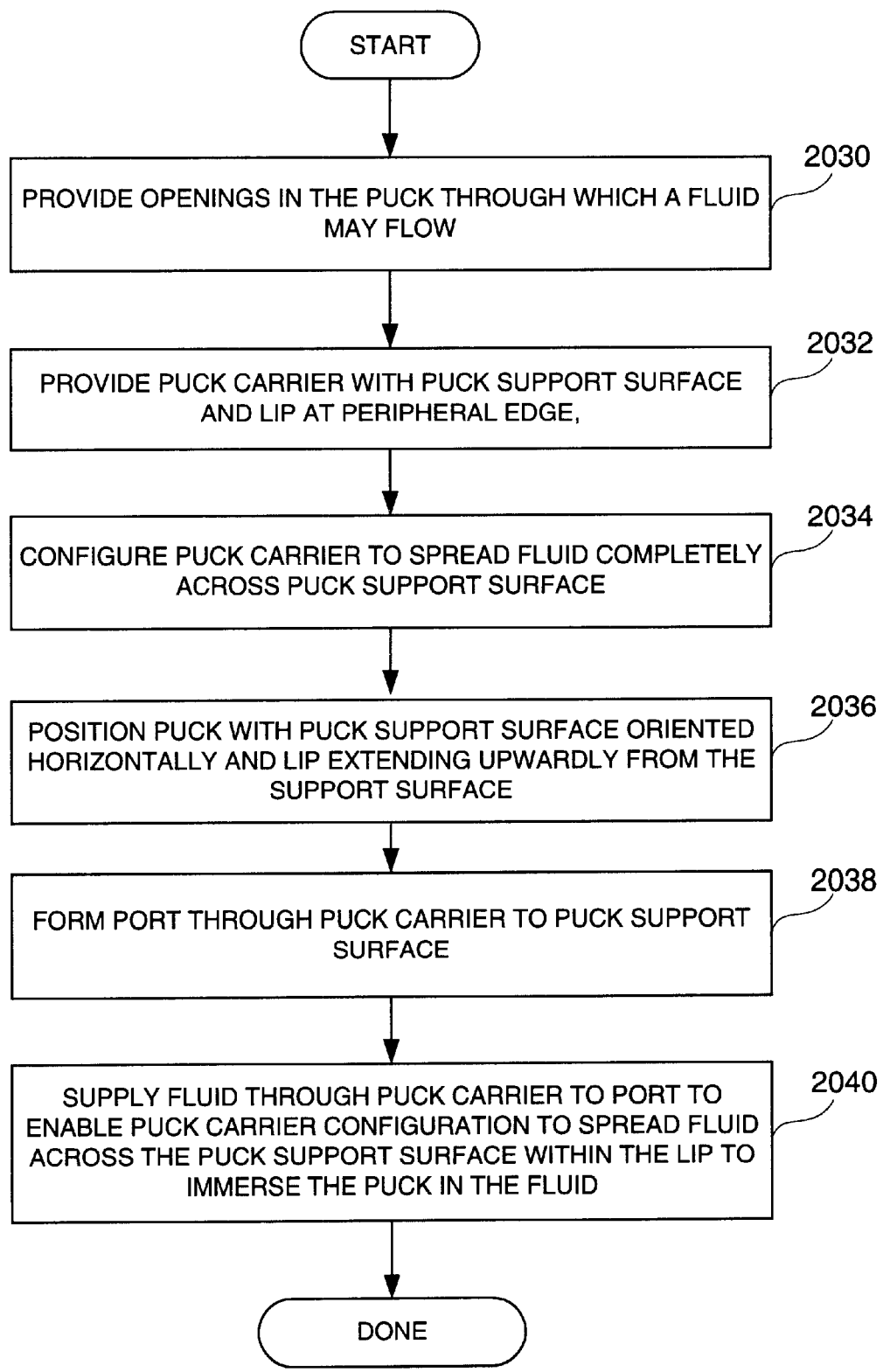

Referring to FIG. 33, another aspect of the method of the present invention relates to a method of purging the puck 218 for conditioning the chemical mechanical polishing pad 209. The method starts by an operation 2030 of providing the openings 903 and 904 in the puck 218 through which the fluid 648 may flow. The method moves to an operation 2032 in which the puck carrier 220 is provided with an upper surface and the lip 900 at the peripheral edge of the puck 218. The method moves to operation 2034 in which the puck carrier is configured conforming to the configuration of the manifold 420 of the chuck 262 to spread the fluid 648 completely across the surface of the puck support carrier 220. The method moves to operation 2036 in which the puck 218 is positioned with the puck support surface oriented horizontally and the lip 900 extending upwardly from the support surface. The method moves to operation 2038 in which the port 920 and ducts 926 are formed through plate 308 and section 642 of the puck carrier 220 to the puck support surface on which the puck 218 is to be placed. The method moves to operation 2040 in which the fluid DI water 648 is supplied through the puck carrier 220 to the port 932 to enable the configuration of the puck carrier 220 (i.e., a manifold) to spread the DI water 648 across the puck support surface within the lip 900 to immerse the puck 218 in the DI water 648 in the reservoir. The supply is such as to make the DI water 648 flow outwardly from the manifold 720 through the perforations 903 and openings 904 in the puck 218, past the puck 218 and slowly over the lip 900 forming a waterfall slowly flowing off the chuck 322. In this manner the puck 218 on the chuck 322 is immersed in the DI water 648 and the DI water 648 flowing past the puck 218 purges, or cleans, the puck 218, thereby assisting in the desired conditioning of the polishing pad 209 by the puck 218.

Figure 34:
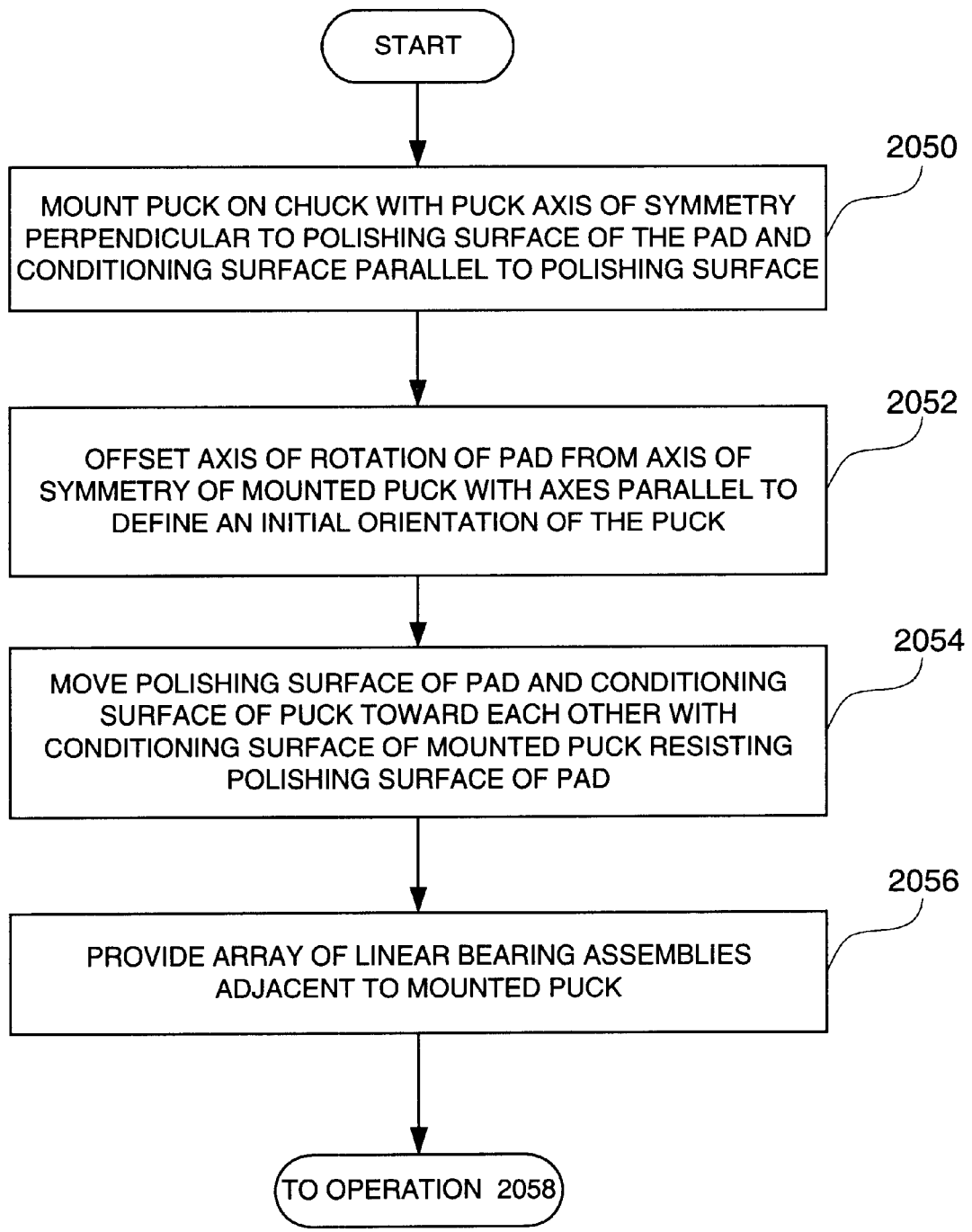

Referring to FIG. 34, another aspect of the method of the present invention relates to a method of conditioning a polishing pad. The method starts with an operation 2050 in which a puck 218 is mounted on a chuck 322 with the puck axis of symmetry 224 perpendicular to polishing surface of the pad 218 and the conditioning surface of the pad 209 parallel to the polishing surface. The method moves to an operation 2052 in which the axis of rotation 211 of the pad 209 is offset from the axis of symmetry 224 of the mounted puck 218 with the axes 224 and 211 parallel to define an initial orientation of the puck 218. The method moves to an operation 2054 in which the polishing surface of the pad 218 and the conditioning surface of puck 218b are moved toward each other with the conditioning surface of the mounted puck 218 resisting the polishing surface of the pad 209. The method moves to an operation 2056 to provide the array 265 of linear bearing assemblies such as 310 adjacent to the mounted puck 218.

Figure 35:
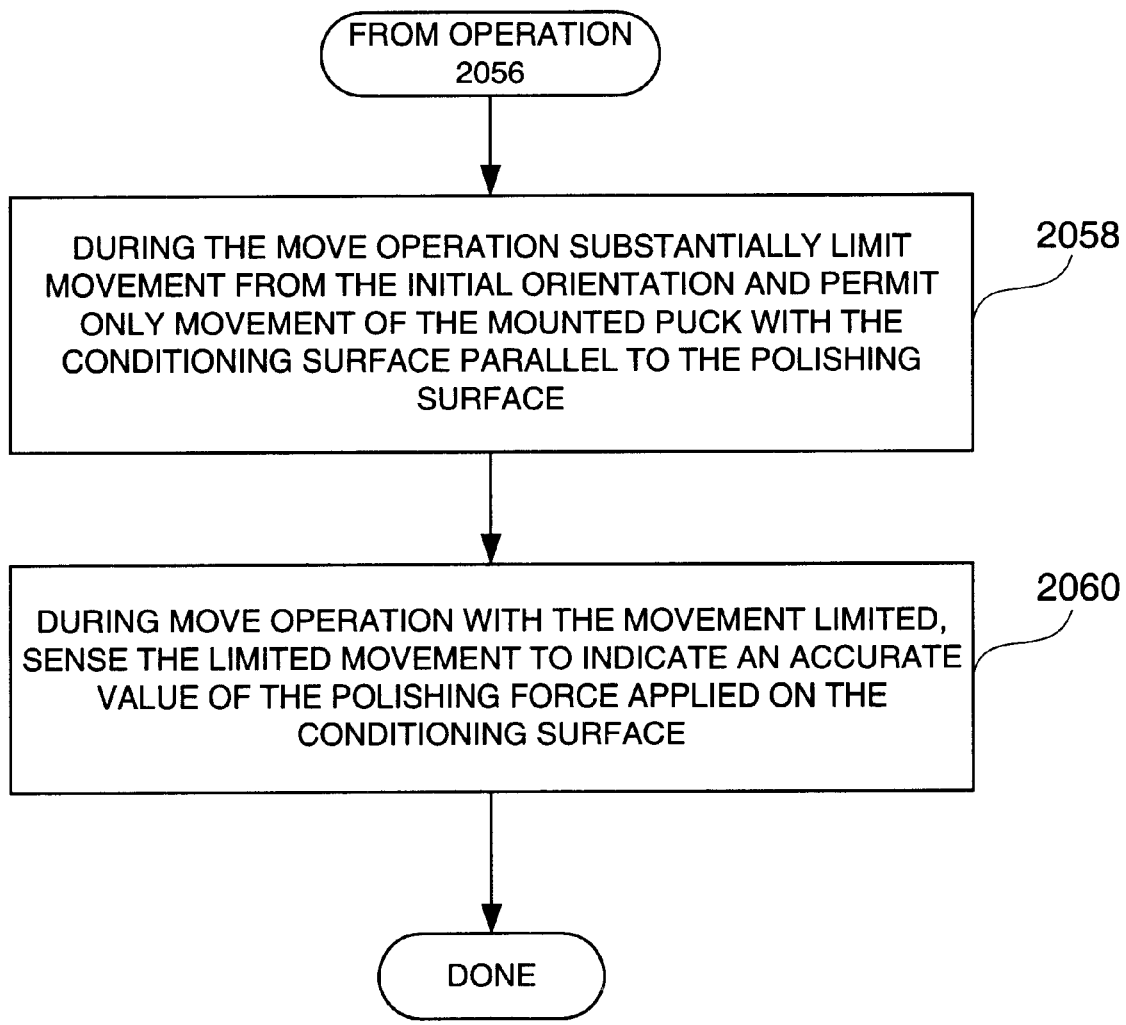

Referring to FIG. 35, the method moves to operation 2058 in which during the move operation 2054 there is substantial limiting of the movement from the initial orientation and permitting only movement of the mounted puck 218 with the conditioning surface of the puck 218 parallel to the polishing surface of the pad 218. The method moves to operation 2060 in which during the move operation 2054 with the movement limited, the limited movement is sensed to indicate an accurate value of the polishing force FP-C applied on the conditioning surface of the puck 218.

Figure 36:
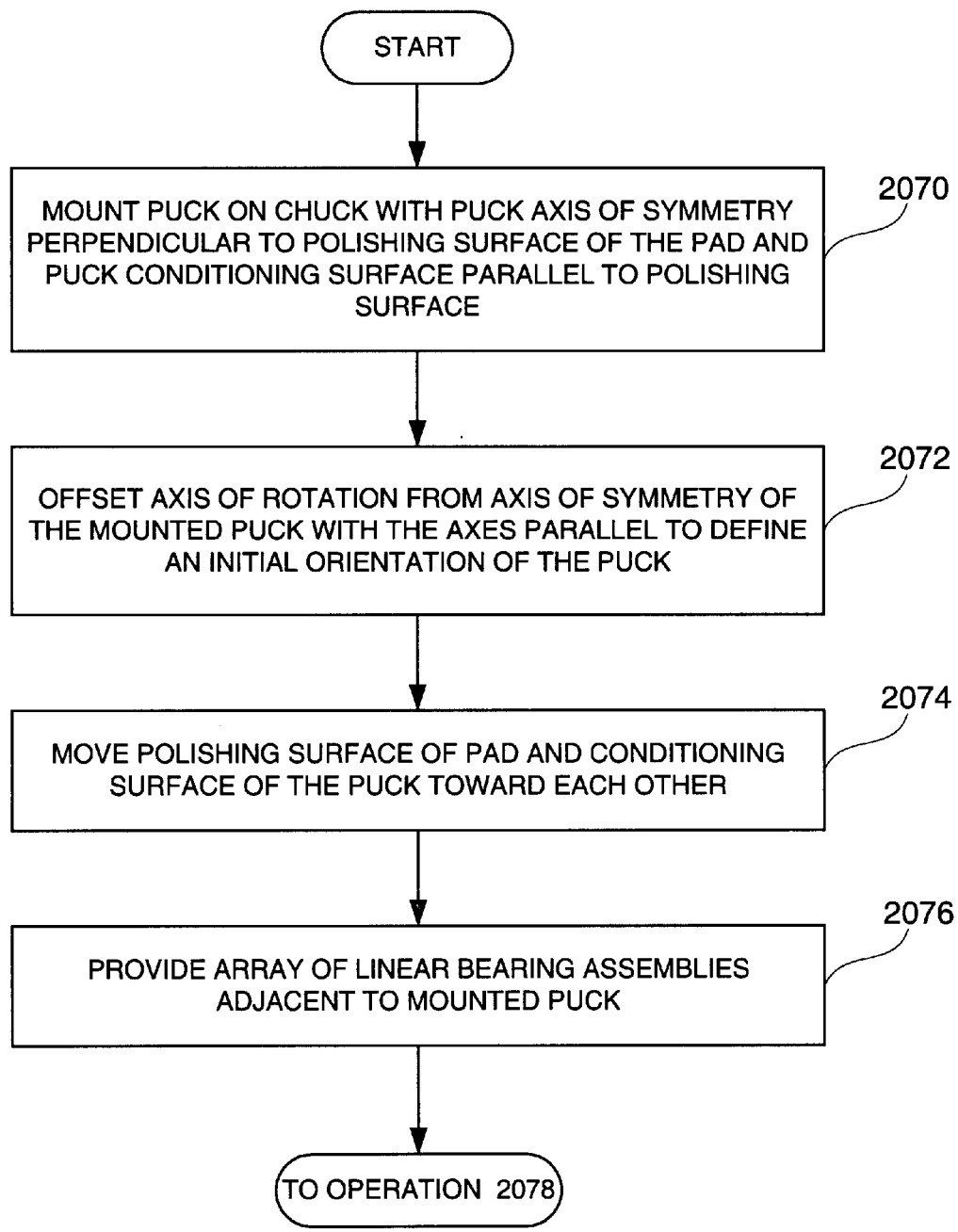
Figure 37:
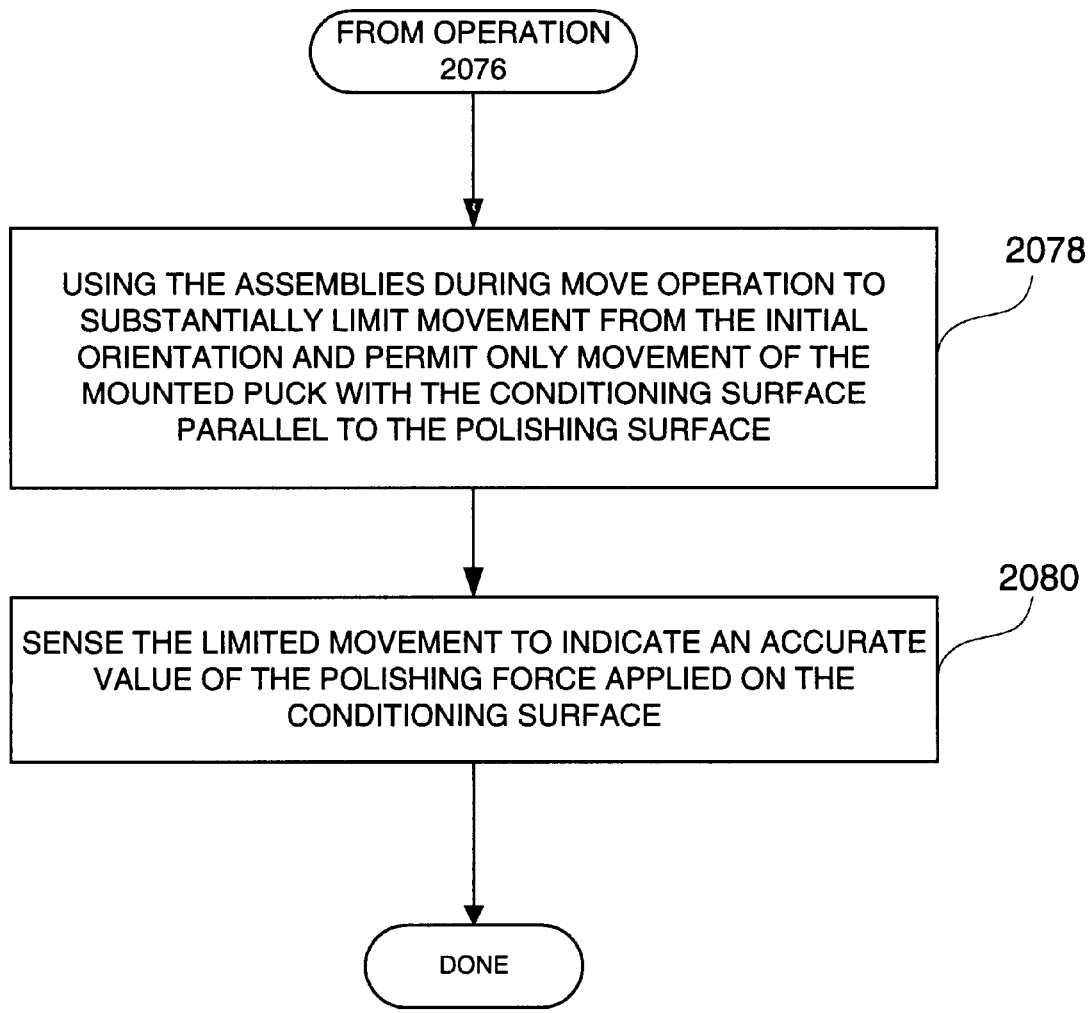

Referring to FIG. 36, another aspect of the method of the present invention relates to a method of conditioning a polishing pad. The method starts with an operation 2070 of mounting the puck 218 on the 322 chuck with the puck axis 224of symmetry perpendicular to polishing surface of the pad 218 and the puck conditioning surface parallel to the polishing surface. The method moves to an operation 2072 of offsetting the axis of rotation 210 from the axis of symmetry 224 of the mounted puck 218 with the axes 210 and 224 parallel to define an initial orientation of the puck 218. The method moves to an operation 2074 of moving the polishing surface of the pad 218 and the conditioning surface of the puck 218 toward each other. The method moves to an operation 2076 of providing the array 265 of linear bearing assemblies 310 adjacent to mounted puck 218. Referring to FIG. 37, the method moves to an operation 2078 of using the assemblies 310 during the move operation 2074 to substantially limit movement from the initial orientation and permit only movement of the mounted puck 218 with the conditioning surface parallel to the polishing surface. The method moves to an operation 2080 of sensing the limited movement to indicate an accurate value of the polishing force FP-C applied on the conditioning surface.

Figure 38:
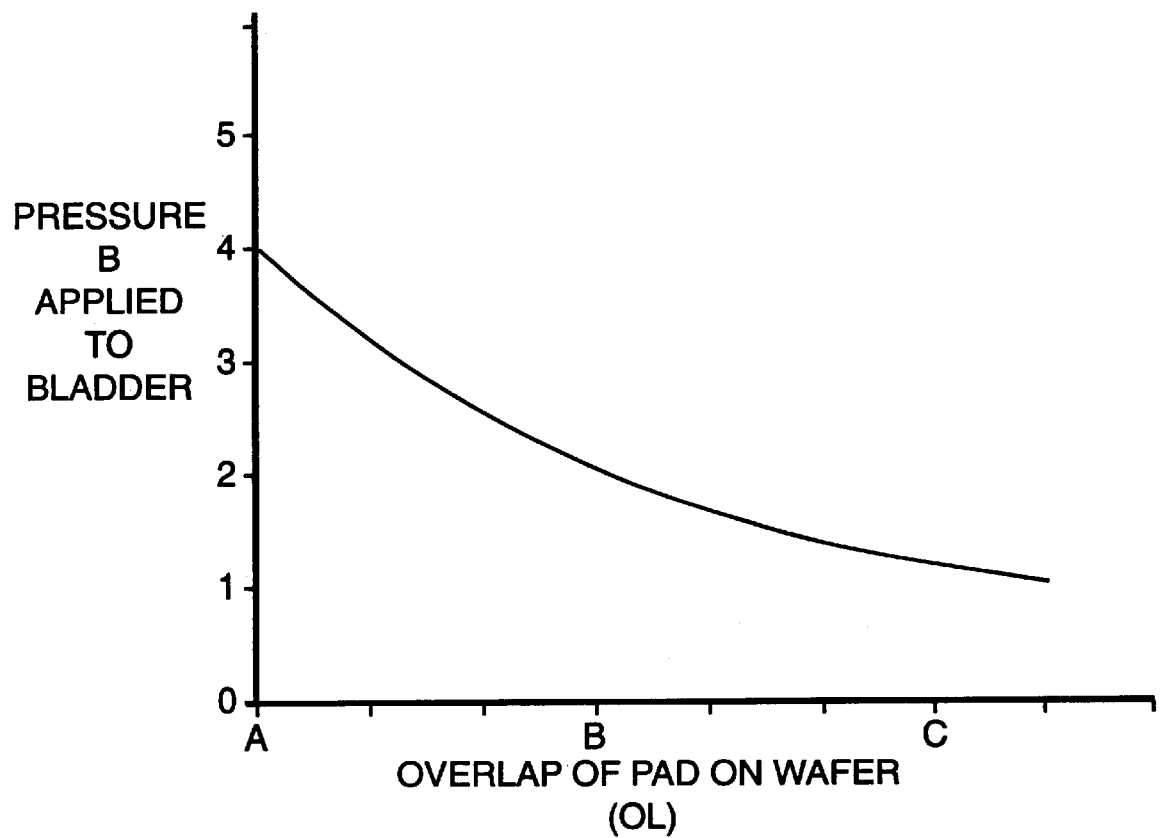
FIG. 38 is a graph schematically illustrating how the pressure applied to the motor for the retainer ring varies with the amount of overlap between the polishing pad, on the one hand, and the retainer ring and wafer, on the other hand.

Referring to FIG. 38, there is shown a graph schematically illustrating how the pressure B applied to the fluid 293 admitted to the linear motor 290 may be varied with the amount of overlap OL (FIG. 1B) between the polishing pad 209 on the one hand, and the retainer ring 282 and the wafer 206, on the other hand. As described above, to uniformly polish the exposed regions 204R of the wafer 206, for example, uniform amounts of pressure should be applied to the different exposed and contacted regions 204R. As the area of the exposed and contacted regions 204R increases, the force FP-W would increase to have the amounts of pressure be uniform. Since the polishing pad 202 moves in the direction of the arrow 209H during the polishing operations performed on one wafer 206, and because such polishing pad movement causes different areas of the exposed regions 204R to be contacted by the polishing pad 209, the force FP-W applied to the wafer 206 must be varied accurately. Processing of the wafer load signal 264 is performed and the force of the wafer carrier 208 in the upward direction (see F in FIG. 1B) is adjusted as necessary to provide the appropriate force FP-W applied by the polishing pad 209 on the wafer 206 and the wafer carrier 208. A graph of the type shown in FIG. 38 may be used to select the pressure B applied to the fluid 293 admitted to the linear motor 290 according to the amount of overlap OL (FIG. 1A) between the polishing pad 209 on the one hand, and the retainer ring 282 and the wafer 206, on the other hand at is experienced at any given time T1.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for controlling relative movement between a wafer and a chemical machining pad, comprising the operations of:
   mounting the wafer on a chuck, the wafer having an axis of symmetry;
   offsetting in parallel relationship an axis of rotation of the pad and the axis of symmetry of the mounted wafer;
   urging the pad and the offset mounted wafer toward each other parallel to the axis of rotation and to the axis of symmetry to cause the pad to impose a polishing force on the mounted wafer eccentrically with respect to the axis of symmetry, in response to the polishing force the wafer having a tendency to tilt such that the axis of symmetry tends to move out of the parallel relationship with the axis of rotation; and
   during the urging operation limiting movement of the wafer to movement parallel to a direction of the axis of rotation so that no action of tilting is permitted in response to the tendency to tilt.

2. A method for controlling relative movement between a wafer and a chemical machining pad, comprising the operations of:
   mounting the wafer on a chuck, the wafer having an axis of symmetry;
   offsetting in parallel relationship an axis of rotation of the pad and the axis of symmetry of the mounted wafer;
   urging the pad and the offset mounted wafer toward each other parallel to the axis of rotation and to the axis of symmetry to cause the pad to impose a polishing force on the mounted wafer eccentrically with respect to the axis of symmetry, in response to the polishing force the wafer having a tendency to tilt such that the axis of symmetry tends to move out of the parallel relationship with the axis of rotation;
   during the urging operation resisting the tendency of the mounted offset wafer to tilt while allowing the wafer to move parallel to a direction of the axis of rotation; and
   during the urging operation and the resisting operation measuring movement of the mounted offset wafer in a direction parallel to the direction of the axis of rotation to accurately indicate a value of the polishing force.

3. A method for reducing formation of burn rings in a wafer polishing operation performed by a chemical machining pad having a polishing surface, comprising the operations of:
   mounting the wafer on a chuck to resist movement of the polishing surface of the pad against an exposed surface of the wafer, the exposed surface defining a first plane, the movement being eccentric with respect to a wafer axis of symmetry of the mounted wafer, the movement also being parallel to an axis of rotation of the pad, the mounted wafer having a periphery symmetric with the wafer axis of symmetry and, the wafer axis of symmetry normally being perpendicular to the polishing surface of the pad so that the exposed surface of the mounted wafer is normally parallel to the polishing surface;
   providing a retainer ring surrounding the periphery of the wafer to limit movement of the mounted wafer perpendicular to the wafer axis of symmetry, the retainer ring having a ring axis of symmetry and an upper surface defining a second plane, the ring axis of the retainer ring being in a coaxial relationship with the wafer axis;
   urging the polishing surface of the pad and the exposed surface of the mounted wafer toward each other so that the pad exerts a polishing force on the exposed surface tending to tilt the mounted wafer and the wafer axis of symmetry out of perpendicularity with respect to the polishing surface;
   urging the polishing surface of the pad and the upper surface of the retainer ring toward each other so that the pad exerts a ring force on the upper surface tending to tilt the retainer ring and the ring axis of symmetry out of the coplanar relationship with the wafer axis; and
   during both urging operations resisting both the tendency of the retainer ring to tilt and the tendency of the mounted wafer to tilt so that action of tilting of the retainer ring and of the mounted wafer is not taken and so that the first plane and the second plane remain substantially coplanar.

4. A method for reducing formation of burn rings in a wafer polishing operation performed by a chemical machining pad having a polishing surface, comprising the operations of:
   mounting the wafer on a chuck to resist movement of the polishing surface of the pad against an exposed surface of the wafer, the exposed surface defining a first plane, the movement being eccentric with respect to a wafer axis of symmetry of the mounted wafer, the movement also being parallel to an axis of rotation of the pad, the mounted wafer having a periphery symmetric with the wafer axis of symmetry and, the wafer axis of symmetry normally being perpendicular to the polishing surface of the pad so that the exposed surface of the mounted wafer is normally parallel to the polishing surface;
   providing a retainer ring surrounding the periphery of the wafer to limit movement of the mounted wafer perpendicular to the wafer axis of symmetry, the retainer ring having a ring axis of symmetry and an upper surface defining a second plane, the ring axis of the retainer ring being in a coaxial relationship with the wafer axis;
   urging the polishing surface of the pad and the exposed surface of the mounted wafer toward each other so that the pad exerts a polishing force on the exposed surface tending to tilt the mounted wafer and the wafer axis of symmetry out of perpendicularity with respect to the polishing surface;

urging the polishing surface of the pad and the upper surface of the retainer ring toward each other so that the pad exerts a ring force on the upper surface tending to tilt the retainer ring and the ring axis of symmetry out of the coplanar relationship with the wafer axis; and during both urging operations resisting both the tendency of the retainer ring to tilt and the tendency of the mounted wafer to tilt so that the first plane and the second plane remain substantially coplanar;

wherein the second urging operation includes:

providing a support plate spaced from the chuck and the retainer ring;

providing a motor between the support plate and the retainer ring; and operating the motor to separate the support plate and the retainer ring and urge the polishing surface of the pad and the upper surface of the retainer ring toward each other.

5. A method for reducing formation of burn rings in a wafer polishing operation performed by a chemical machining pad having a polishing surface, comprising the operations of:

mounting the wafer on a chuck to resist movement of the polishing surface of the pad against an exposed surface of the wafer, the exposed surface defining a first plane, the movement being eccentric with respect to a wafer axis of symmetry of the mounted wafer, the movement also being parallel to an axis of rotation of the pad, the mounted wafer having a periphery symmetric with the wafer axis of symmetry and, the wafer axis of symmetry normally being perpendicular to the polishing surface of the pad so that the exposed surface of the mounted wafer is normally parallel to the polishing surface;

providing a retainer ring surrounding the periphery of the wafer to limit movement of the mounted wafer perpendicular to the wafer axis of symmetry, the retainer ring having a ring axis of symmetry and an upper surface defining a second plane, the ring axis of the retainer ring being in a coaxial relationship with the wafer axis;

urging the polishing surface of the pad and the exposed surface of the mounted wafer toward each other so that the pad exerts a polishing force on the exposed surface tending to tilt the mounted wafer and the wafer axis of symmetry out of perpendicularity with respect to the polishing surface;

urging the polishing surface of the pad and the upper surface of the retainer ring toward each other so that the pad exerts a ring force on the upper surface tending to tilt the retainer ring and the ring axis of symmetry out of the coplanar relationship with the wafer axis;

during both urging operations resisting both the tendency of the retainer ring to tilt and the tendency of the mounted wafer to tilt so that the first plane and the second plane remain substantially coplanar;

providing a support plate spaced from the chuck, the plate and the chuck being movable relative to each other; and sensing motion of the chuck relative to the support plate to provide an accurate indication of an amount of the polishing force notwithstanding the tendency of the polishing force on the exposed surface to tilt the mounted wafer and the wafer axis of symmetry out of perpendicularity with respect to the polishing surface.

6. A method as recited in claim 3, wherein:

the mounting operation is performed by mounting the wafer on the chuck, wherein the chuck has a support surface normally positioned parallel to the polishing surface of the pad, wherein the urging of the polishing surface of the pad normally moves the polishing surface toward the exposed surface of the wafer perpendicular to the polishing surface of the pad for polishing, the polishing force on the exposed surface also tending to tilt the chuck into a position in which the support surface of the chuck would not be parallel to the polishing surface of the pad; and the resisting operation acts on the chuck to resist the tendency of the chuck to tilt so that action of tilting of the chuck is not taken.

7. A method for reducing formation of burn rings in a wafer polishing operation performed by a chemical machining pad having a polishing surface, comprising the operations of:

mounting the wafer on a chuck to resist movement of the polishing surface of the pad against an exposed surface of the wafer, the exposed surface defining a first plane, the movement being eccentric with respect to a wafer axis of symmetry of the mounted wafer, the movement also being parallel to an axis of rotation of the pad, the mounted wafer having a periphery symmetric with the wafer axis of symmetry, and the wafer axis of symmetry normally being perpendicular to the polishing surface of the pad so that the exposed surface of the mounted wafer is normally parallel to the polishing surface;

providing a retainer ring surrounding the periphery of the wafer to limit movement of the mounted wafer perpendicular to the wafer axis of symmetry, the retainer ring having a ring axis of symmetry and an upper surface defining a second plane, the ring axis of the retainer ring being in a coaxial relationship with the wafer axis of symmetry;

urging the polishing surface of the pad and the exposed surface of the mounted wafer toward each other so that the pad exerts a polishing force on the exposed surface tending to tilt the mounted wafer and the wafer axis of symmetry out of perpendicularity with respect to the polishing surface;

urging the polishing surface of the pad and the upper surface of the retainer ring toward each other so that the pad exerts a ring force on the upper surface tending to tilt the retainer ring and the ring axis of symmetry out of the coplanar relationship with the wafer axis of symmetry;

during both urging operations resisting both the tendency of the retainer ring to tilt and the tendency of the mounted wafer to tilt so that the first plane and the second plane remain substantially coplanar;

the mounting operation being performed by mounting the wafer on the chuck, wherein the chuck has a support surface normally positioned parallel to the polishing surface of the pad;

the first urging of the polishing surface of the pad normally moving the polishing surface toward the exposed surface of the wafer on a path perpendicular to the polishing surface of the pad for polishing, the polishing force on the exposed surface also tending to tilt the chuck into a position in which the support surface of the chuck would not be parallel to the polishing surface of the pad;

the resisting operation acts on the chuck to resist the tendency of the chuck to tilt; and sensing movement of the chuck in response to the polishing force to indicate an accurate value of the polishing force.

8. A method for controlling relative movement between a wafer and a chemical machining pad, comprising the operations of:

mounting the wafer on a chuck, the wafer having an axis of symmetry parallel to an axis of rotation of the pad, the wafer having an exposed surface positioned by the chuck parallel to a polishing surface of the pad;

offsetting the axis of rotation of the pad from the axis of symmetry of the mounted wafer;

providing a chuck support plate for resisting movement of the polishing surface of the pad toward the wafer, the chuck being movable relative to the chuck support plate;

providing a retainer ring unit around the chuck for movement to retain the wafer on the chuck and expose the exposed surface of the wafer to the polishing surface of the pad for polishing;

providing the chuck, the chuck support plate, and the retainer ring units with a plurality of pairs of linear bearing assemblies, each of the assemblies having a housing provided with a bearing axis perpendicular to the polishing surface of the pad, each of the assemblies having a linear shaft received in a respective one of the housings, a first set of the assemblies being between the chuck and the retainer ring units; a second of the assemblies being between the chuck and the chuck support plate; and using the chuck support plate to resist movement of the polishing surface of the pad toward the exposed surface of the wafer, the pad imposing a polishing force on the exposed surface of the mounted wafer and on the retainer ring eccentrically with respect to the axis of symmetry, in response to the eccentric polishing force the wafer and the chuck having a tendency to tilt such that the exposed surface of the wafer tends to move out of parallel with the polishing surface of the pad;

during the using of the chuck support plate the first set of the assemblies being effective to limit the movement of the retainer ring to movement parallel to the axis of symmetry;

during the using of the chuck support plate the second set of the assemblies being effective to limit movement of the chuck relative to the chuck support plate so that the exposed surface of the wafer remains parallel to the polishing surface.

9. A method as recited in claim 8, further comprising:

sensing the limited movement of the chuck relative to the chuck support plate to indicate an accurate value of the polishing force applied on the exposed surface of the mounted wafer.

10. A method for controlling relative movement between a chemical mechanical polishing pad and a wafer to be polished by the pad, comprising the operations of:

mounting the wafer with an exposed surface of the wafer parallel to a polishing surface of the pad, the wafer having an axis of symmetry, the pad having an axis of rotation;

offsetting the axis of rotation of the pad from the axis of symmetry of the mounted wafer with the axes parallel to define an initial orientation of the wafer;

moving the polishing surface of the pad and the mounted wafer toward each other with the exposed surface of the mounted wafer resisting the polishing surface of the pad so that the pad imposing a polishing force on the mounted wafer eccentrically with respect to the axis of symmetry, in response to the polishing force the mounted wafer having a tendency to tilt such that the exposed surface tends to move from the initial orientation and out of parallel with the polishing surface of the pad;

providing an array of pairs of linear bearing assemblies adjacent to the mounted wafer, during the moving operation the assemblies being effective to substantially limit the movement from the initial orientation and permit only movement of the mounted wafer with the exposed surface parallel to the polishing surface; and determining an amount of the permitted movement of the wafer to indicate a net amount of the polishing force imposed on the exposed surface.

11. A method for controlling relative movement between a wafer carrier chuck and a chemical machining pad, comprising the operations of:

mounting the wafer on the wafer carrier chuck, the wafer carrier chuck having an axis of symmetry;

offsetting in parallel relationship an axis of rotation of the pad and the axis of symmetry of the wafer carrier chuck;

urging the pad and the offset wafer carrier chuck toward each other parallel to the axis of rotation and to the axis of symmetry to cause the pad to impose a polishing force on the mounted wafer eccentrically with respect to the axis of symmetry, in response to the polishing force the wafer carrier chuck having a tendency to tilt such that the axis of symmetry tends to move out of the parallel relationship with the axis of rotation;

during the urging operation resisting the tendency of the wafer carrier chuck to tilt while allowing the wafer carrier chuck and the wafer thereon to move parallel to a direction of the axis of rotation; and during the urging operation and the resisting operation measuring movement of the wafer carrier chuck in a direction parallel to the direction of the axis of rotation to accurately indicate a value of the polishing force on the mounted wafer.

12. A method for controlling relative movement between a wafer and a chemical machining pad, comprising the operations of:

mounting the wafer on a chuck, the wafer having an axis of symmetry parallel to an axis of rotation of the pad, the wafer having an exposed surface positioned by the chuck parallel to a polishing surface of the pad;

offsetting the axis of rotation of the pad from the axis of symmetry of the mounted wafer;

providing a chuck support plate for resisting movement of the polishing surface of the pad toward the wafer, the chuck being movable relative to the chuck support plate;

providing the chuck with a linear bearing assembly having a housing provided with a bearing axis perpendicular to the polishing surface of the pad, the linear bearing assembly having a linear shaft received in the housing, the linear bearing assembly being between the chuck and the chuck support plate; and using the chuck support plate to resist movement of the polishing surface of the pad toward the exposed surface of the wafer, the pad imposing a polishing force on the exposed surface of the mounted wafer eccentrically with respect to the axis of symmetry, in response to the eccentric polishing force the wafer and the chuck having a tendency to tilt such that the exposed surface of the wafer tends to move out of parallel with the polishing surface of the pad;

during the using of the chuck support plate the linear bearing assembly being effective to limit movement of the chuck relative to the chuck support plate so that the exposed surface of the wafer remains parallel to the polishing surface.

\* \* \* \* \*